(12) United States Patent
Gleason et al.

(10) Patent No.: US 10,155,843 B2
(45) Date of Patent: Dec. 18, 2018

(54) ULTRA-THIN, PINHOLE-FREE, FLEXIBLE METAL-ORGANIC FILMS

(71) Applicants: Massachusetts Institute of Technology, Cambridge, MA (US); Luxembourg Institute of Science and Technology, Belvaux (LU)

(72) Inventors: Karen K. Gleason, Cambridge, MA (US); Minghui Wang, Quincy, MA (US); Nicolas D. Boscher, Audun-le-Tiche (FR); Patrick Choquet, Longeville-les-Metz (FR)

(73) Assignees: Massachusetts Institute of Technology, Cambridge, MA (US); Luxembourg Institute of Science and Technology, Belvaux (LU)

( * ) Notice: Subject to any disclaimer, the term of this patent is extended or adjusted under 35 U.S.C. 154(b) by 105 days.

(21) Appl. No.: 15/355,267

(22) Filed: Nov. 18, 2016

(65) Prior Publication Data

US 2017/0158809 A1 Jun. 8, 2017

Related U.S. Application Data

(60) Provisional application No. 62/256,838, filed on Nov. 18, 2015.

(51) Int. Cl.
| | |
|---|---|
| *C08G 61/12* | (2006.01) |
| *C23C 16/505* | (2006.01) |
| *B05D 1/00* | (2006.01) |
| *B01D 69/12* | (2006.01) |

(Continued)

(52) U.S. Cl.
CPC ......... *C08G 61/124* (2013.01); *B01D 53/228* (2013.01); *B01D 67/0037* (2013.01);
(Continued)

(58) Field of Classification Search
CPC .............. C08G 61/124; C08G 2261/61; C08G 2261/37; C08G 2261/3241;
(Continued)

(56) References Cited

U.S. PATENT DOCUMENTS

| | | | |
|---|---|---|---|
| 4,627,859 | A | 12/1986 | Zupancic et al. |
| 5,733,677 | A | 3/1998 | Golovin et al. |

(Continued)

FOREIGN PATENT DOCUMENTS

EP  2 546 636 A1  1/2013

OTHER PUBLICATIONS

A. Shoji et al. "Plasma Polymerization of Manganese Chloride Tetraphenylporphyrin and Evaluation of the Thin Film", Journal of Photopolymer Science and Technology, vol. 20, No. 2 (2007), pp. 241-244.*

(Continued)

*Primary Examiner* — Michael Bernshteyn
(74) *Attorney, Agent, or Firm* — Foley Hoag LLP

(57) ABSTRACT

Described herein are facile, one-step initiated plasma enhanced chemical vapor deposition (iPECVD) methods of synthesizing hyper-thin (e.g., sub-100 nm) and flexible metal organic covalent network (MOCN) layers. As an example, the MOCN may be made from zinc tetraphenylporphyrin (ZnTPP) building units. When deposited on a membrane support, the MOCN layers demonstrate gas separation exceeding the upper bounds for multiple gas pairs while reducing the flux as compared to the support alone.

20 Claims, 34 Drawing Sheets

(51) Int. Cl.
*C01B 3/50* (2006.01)
*C08F 34/00* (2006.01)
*C08F 134/00* (2006.01)
*C08J 5/22* (2006.01)
*C08F 234/00* (2006.01)
*C09D 145/00* (2006.01)
*B01D 53/22* (2006.01)
*B01D 67/00* (2006.01)
*B01D 69/14* (2006.01)
*B01D 71/00* (2006.01)
*C01B 21/04* (2006.01)
*C01B 13/02* (2006.01)

(52) U.S. Cl.
CPC ....... *B01D 67/0072* (2013.01); *B01D 69/127* (2013.01); *B01D 69/148* (2013.01); *B01D 71/00* (2013.01); *B05D 1/62* (2013.01); *C01B 3/503* (2013.01); *C01B 13/0255* (2013.01); *C01B 21/04* (2013.01); *C08F 34/00* (2013.01); *C08F 134/00* (2013.01); *C08F 234/00* (2013.01); *C08J 5/2231* (2013.01); *C09D 145/00* (2013.01); *C23C 16/505* (2013.01); *B01D 2323/30* (2013.01); *C08G 2261/228* (2013.01); *C08G 2261/312* (2013.01); *C08G 2261/3241* (2013.01); *C08G 2261/37* (2013.01); *C08G 2261/61* (2013.01)

(58) Field of Classification Search
CPC ........ C08G 2261/312; C08G 2261/228; C23C 16/505; B05D 1/62; B01D 69/127; B01D 69/0072; B01D 53/228; B01D 67/0037; B01D 67/0072; B01D 71/00; B01D 2323/30; C01B 3/503; C08F 34/00; C08F 134/00; C08F 234/00; C08J 5/2231; C09D 145/00
USPC .................................................... 428/411.1
See application file for complete search history.

(56) References Cited

U.S. PATENT DOCUMENTS

2008/0286490 A1* 11/2008 Bogdanoff ........... B01J 31/1805
427/569
2013/0017341 A1* 1/2013 Boscher ............... G01N 21/783
427/489

OTHER PUBLICATIONS

P. Heier et al. "A new class of ZnII and CrIII porphyrins incorporated into porous polymer matrices via an atmospheric pressure plasma enhanced CVD to form gas sensing layers", J. Mater. Chem. A, 2014, 2, 1560-1570.*
Varghese et al. "Enhancement of Glucose Sensing Behavior of Cobalt Tetraphenylporphyrin Thin Film Using Single-Wall Carbon Nanotubes", Sensors and Materials, vol. 23, No. 6 (2011) 335-345.*
Shoji et al. "Plasma Polymerization of Manganese Chloride Tetraphenylporphyrin and Evaluation of the Thin Film", Journal of Photopolymer Science and Technology, vol. 20, No. 2 (2007), pp. 241-244. (Year: 2007).*
Heier et al. "A new class of ZnIII and CrIII porphyrins incorporated into porous polymer matrices via an atmospheric pressure plasma enhanced CVD to form gas sensing layers", J. Mater. Chem. A, 2014, 2, 1560-1570. (Year: 2014).*
Varghese et al. "Enhancement of Glucose Sensing Behavior of Cobalt Tetraphenylporphyrin Thin Film Using Single-Wall Carbon Nanotubes", Sensors and Materials, vol. 23, No. 6 (2011) 335-345. (Year: 2011).*
Boscher et al., "Atmospheric pressure plasma polymerisation of metalloporphyrins containing mesoporous membranes for gas sensing applications," Surf Coat Tech, 234: 48-52 (2013).
Boscher et al., "Chemical vapour deposition of metalloporphyrins: A simple route towards the preparation of gas separation membranes," J Mater Chem, 4(46): 18144-18152 (2016).
Boscher et al., "Metal-organic covalent network chemical vapor deposition for gas separation," Adv Mater, 28(34): 7479-7485 (2016).
Heier et al., "A new class of Zn II and Cr III porphyrins incorporated into porous polymer matrices via an atmospheric pressure plasma enhanced via an atmospheric pressure plasma enhanced CVD to form gas sensing layers," J Mater Chem, 2(5): 1560-1570 (2013).
Inagaki et al., "Plasma polymer thin films of zinc phthalocyanines for NO2 gas sensor device," Polym Bull, 36(5): 601-607 (1996).
Shoji et al., "Plasma polymerization of manganese chloride tetraphenylporphyrin and evaluation of the thin film," J Photopolym Sci Tec, 20(2): 241-244 (2007).
Varghese et al., "Enhancement of glucose sensing behavior of cobalt tetraphenylporphyrin thin film using single-wall carbon nanotubes," Sensor Mater, 23(6): 335-345 (2011).
International Search Report and Written Opinion for International Application No. PCT/US2016/062737 dated Feb. 23, 2017.

* cited by examiner (d)

(c)

(b)

(a)

ULTRA-THIN, PINHOLE-FREE, FLEXIBLE METAL-ORGANIC FILMS

RELATED APPLICATIONS

This application claims benefit of priority to U.S. Provisional Patent Application No. 62/256,838, filed on Nov. 18, 2015, which is incorporated herein in its entirety.

GOVERNMENT SUPPORT

This invention was made with Government support under Grant No. W911NF-13-D-0001 awarded by the Army Research Office. The government has certain rights in the invention.

BACKGROUND

Membrane gas separation is an energy efficient and environmentally friendly technology when compared to conventional cryogenic distillation or adsorption processes. Important gas pairs separated commercially by membrane processes include $H_2/N_2$ or $H_2/CH_4$ for $H_2$ recovery, $O_2/N_2$ for $O_2$ and $N_2$ enrichment, $CO_2/CH_4$ for pre-combustion natural gas sweetening and $CO_2/N_2$ for post-combustion $CO_2$ capture. To achieve both high flux and high gas selectivity, one key strategy is to fabricate ultra-thin gas selective layers, since the flux is inversely proportional to the thickness of a membrane. In this regard, good $H_2/CO_2$ separation performances have been reported for porous alumina supported metal organic framework (MOF) nanosheets and graphene oxides (GOs) atomic sheets. However, such membranes can only be prepared in small dimensions and remain extremely brittle, thus they can only operate at zero transmembrane pressure difference, which significantly restrains their practical applications. Porous $SiN_x$ frame-supported porous graphene films with superior mechanical sturdiness were fabricated by focused ion beam (FIB) perforation, but the relative large pores only afford very low gas selectivities. In contrast, polymer membrane-supported graphene and GOs films showed better gas selectivities, although low gas permeances (i.e., pressure normalized gas flux) for the coated polymer membranes were observed. To minimize the permeance loss while maximizing the gas selectivities, controlled oxidative surface modification methods (e.g., photo-oxidative and thermal oxidative) to optimize the gas separation performances of PIM-1 (i.e., a type of polymers of intrinsic microporosity, PIM, with nominal pore size less than 2 nm) have been proposed. The resulting membranes showed enhanced gas selectivities while maintaining high gas permeabilities. However, such methods are highly substrate-dependent.

There exists a need for films that demonstrate both high permeability and high gas selectivities at a wide range of transmembrane pressure differences (e.g., 1 to 10 bar), and scalable and substrate-independent techniques for making such films.

SUMMARY

In certain embodiments, the invention relates to a polymer comprising a repeat unit of Formula I, Formula II, Formula III, Formula IV, Formula V, or Formula VI, or a combination thereof:

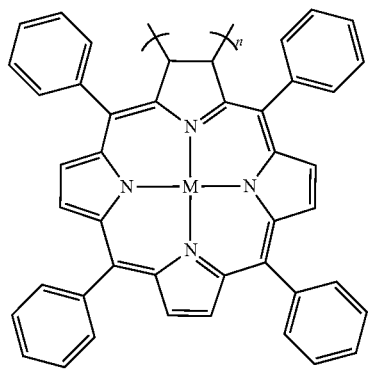

Formula I

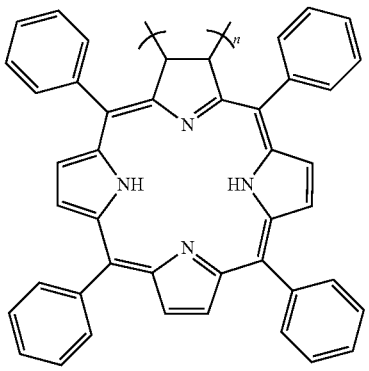

Formula II

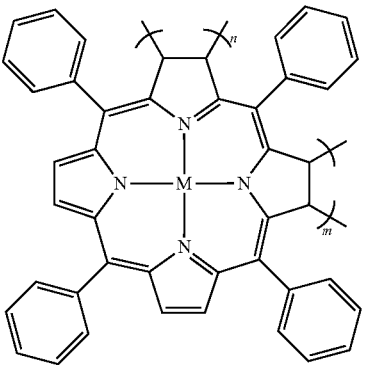

Formula III

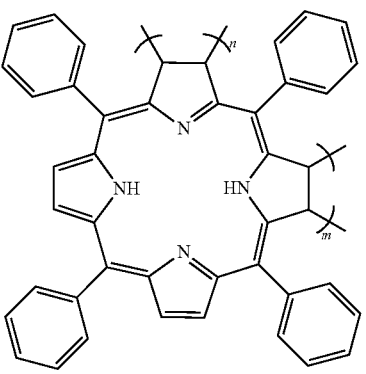

Formula IV

-continued

Formula V

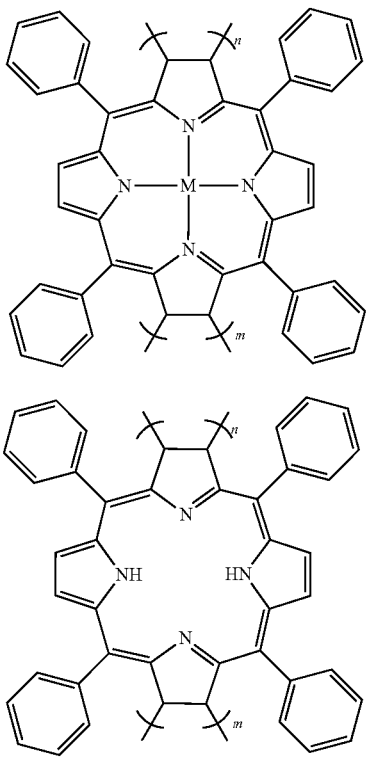

Formula VI wherein

M, when present, is a zinc ion, a manganese ion, a cobalt ion, an iron ion, a tungsten ion, a magnesium ion, a palladium ion, a platinum ion, or a chromium ion;

n is an integer greater than 2; and m, when present, is an integer greater than 2.

In certain embodiments, the invention relates to any one of the polymers described herein, wherein the polymer is a polymer comprising a repeat unit of Formula I, Formula III, or Formula V; and M is a zinc ion.

In certain embodiments, the invention relates to a composition, wherein the composition comprises a substrate and a coating material, wherein the coating material comprises any one of the polymers described herein.

In certain embodiments, the invention relates to any one of the compositions described herein, wherein the coating material is flexible.

In certain embodiments, the invention relates to any one of the compositions described herein, wherein the coating material has a surface area of at least about 100 cm$^2$.

In certain embodiments, the invention relates to any one of the compositions described herein, wherein the coating material is pinhole-free.

In certain embodiments, the invention relates to any one of the compositions described herein, wherein the coating material has an average pore diameter less than about 1 nm.

In certain embodiments, the invention relates to any one of the compositions described herein, wherein the thickness of the coating material is less than about 100 nm.

In certain embodiments, the invention relates to any one of the compositions described herein, wherein the substrate is a membrane.

Another aspect of the invention relates to the composition obtained by the process of any one of methods discussed below.

In certain embodiments, the invention relates to a method of coating a surface of a substrate, comprising the steps of:
providing a substrate;
depositing by iPECVD on a surface of the substrate any one of the polymers described herein.

In certain embodiments, the invention relates to an article comprising any one of the compositions described herein.

In certain embodiments, the invention relates to any one of the articles described herein, wherein the article is, or is incorporated into, a sensor (such as colorimetric gas sensor), a catalyst, a light-emitting diode, a field-effect transistor, or a solar cell.

In certain embodiments, the invention relates to a method comprising
contacting, at a first flow rate, a first gaseous mixture with a first face of any one of the compositions described herein in the form of a membrane; and
monitoring at a second face of the composition a second gaseous mixture, wherein the first face and the second face are opposite faces of the membrane,
wherein
the first gaseous mixture comprises a first gas and a second gas;
the first gaseous mixture comprises a first concentration or first quantity of the second gas;
the second gaseous mixture comprises a second concentration or second quantity of the second gas; and
the second concentration or second quantity is substantially lower than the first concentration or first quantity.

In certain embodiments, the invention relates to a method comprising
contacting, at a first flow rate, a first gaseous mixture with a first face of any one of the compositions described herein in the form of a membrane; and
collecting at a second face of the composition a second gaseous mixture, wherein the first face and the second face are opposite faces of the membrane,
wherein
the first gaseous mixture comprises a first gas and a second gas;
the first gaseous mixture comprises a first concentration or first quantity of the second gas;
the second gaseous mixture comprises a second concentration or second quantity of the second gas; and
the second concentration or second quantity is substantially lower than the first concentration or first quantity.

In certain embodiments, the invention relates to any one of the methods described herein, wherein the first gas/second gas is $H_2/CH_4$, $H_2/N_2$, $O_2/N_2$, $CO_2/N_2$, or $CO_2/CH_4$.

In certain embodiments, the invention relates to any one of the methods described herein, wherein the transmembrane pressure difference is more than 1 bar.

DETAILED DESCRIPTION

Overview

Figure 1:
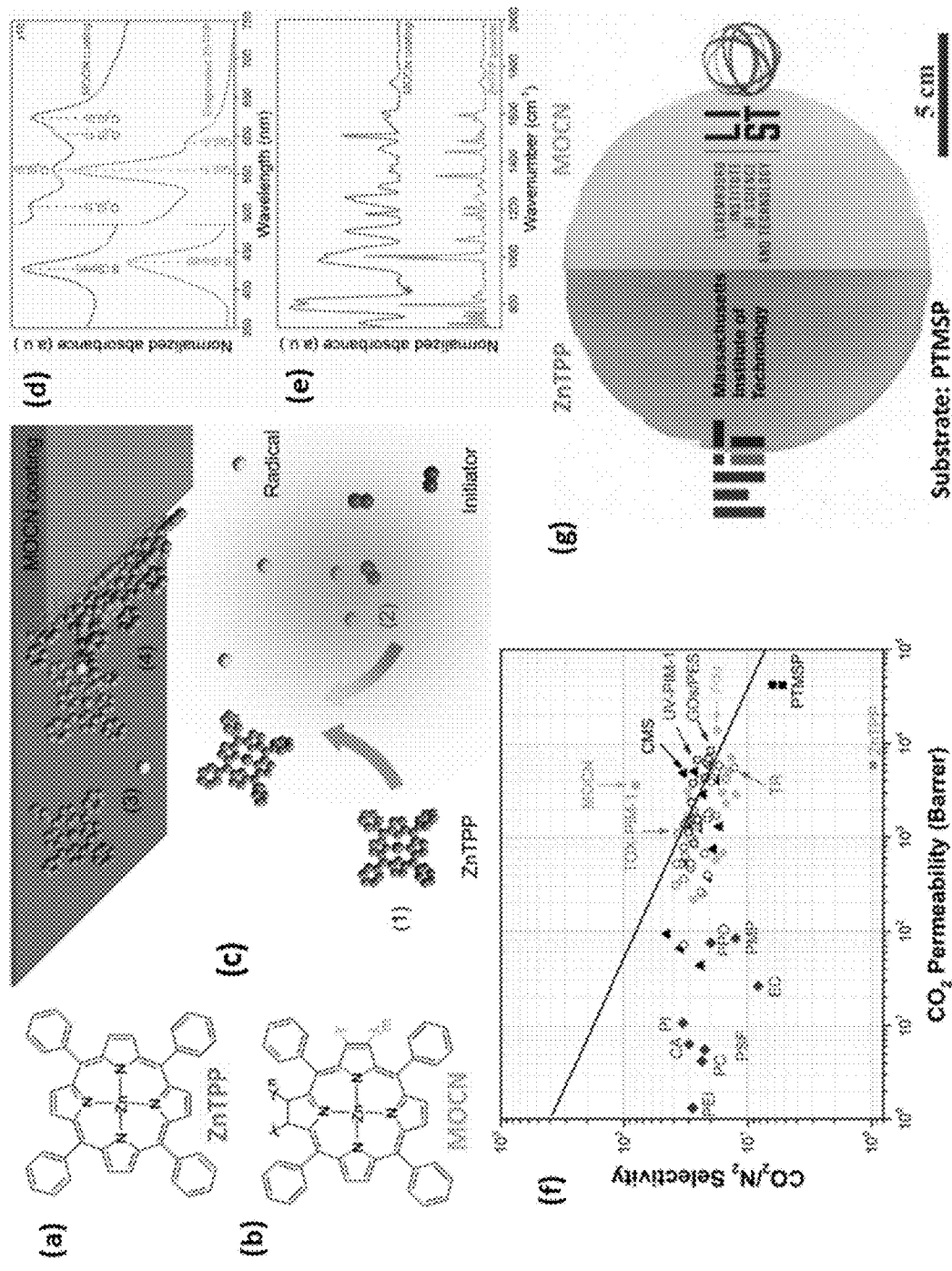
FIG. 1 depicts the synthesis of a porous MOCN coating. (a) Molecular structure of zinc (II) meso-tetraphenylporphyrin (ZnTPP) investigated as the building unit of the OCN coating. (b) Proposed molecular structure of metal organic covalent network (MOCN). The second reduced exo-pyrrole double bond in grey is expressing the possible formation of a small amount of zinc (II) meso-tetraphenylisobacteriochlorin that cannot be ruled out. (c) Schematic of the iPECVD process mechanism: (1) vaporized ZnTPP monomer is introduced, (2) vaporized TBPO initiator is introduced and dissociated into radicals by exposure to a plasma discharge positioned away from the substrate, (3) the monomer and initiator radicals are adsorbed onto the surface of the substrate (20° C.), (4) where they undergo free-radical polymerization to form a MOCN coating. (d) UV-vis absorption spectra of the evaporated ZnTPP (below) and the MOCN coating (above). (e) ATR-FTIR absorption spectra (only the range between 700 and 2000 cm$^{-1}$ is shown) of the monomer (ZnTPP) powder (below) and of the MOCN coating (above). (f) Upper bound plot for the gas pair $CO_2/N_2$, black line is the 2008 upper bound for $CO_2/N_2$. Reference data points including: commercial polymers (dark grey diamonds), carbon molecular sieves (CMS, black triangles), polymers of intrinsic microporosity (PIM, light grey circle), thermally rearranged polymers (TR, open circle), thermally oxidized PIM-1 (TOX-PIM-1, grey open circle), UV treated PIM-1 (UV-PIM-1, open circle), and graphene oxide/polyethersulfone (GOs/PES, open square). (g) Optical image of evaporated ZnTPP (left) and the MOCN coating (right) on the poly[1-(trimethylsilyl)-1-propyne] (PTMSP) membrane.

A challenge of gas separation by membranes is achieving high flux simultaneously with high selectivity. Microporous metal organic framework (MOF) nanosheets and graphene and graphene oxides (GOs) atomic sheets, both supported 2D materials, show promise in this regard. However, their fabrication generally requires multiple steps, often requiring transfer of the 2D layer, and is difficult to scale to large areas.

Porphyrins and porphyrin derivatives are robust and versatile functional molecules since their properties can be tuned through the choice of both their central metal ion (or the absence thereof) and peripheral and axial substituents. They have proved to be useful in a wide range of applications, including the catalysis and photocatalysis of various chemical reactions, in molecular sensing, light-harvesting applications, and for gas storage and gas separation applications. In addition to these functional assets, their rigidity and chemical stability make them ideal as building units for the formation of covalent organic frameworks (COFs) and coordination metal-organic frameworks (MOFs) by wet chemistry approaches. The π-electron rich framework associated with the high density of open metal nodes provided by porphyrin-based materials leads to enhanced gas storage and catalytic performances. The narrow distribution of the micropore structures within porphyrin polymers has proved to be useful for gas sensing, storage and separation as bulk powders.

However, it is of great difficulty to produce large and hyper-thin gas selective porphyrin-based layers by conventional wet chemistry methods. Several approaches, e.g. the layer-by-layer technique, have even allowed the formation of porphyrin-based thin films with controlled thickness, orientation and porosity. Nevertheless, the difficult processability of these poorly soluble and non-meltable materials makes their integration into smart devices difficult. Physical (PVD) and chemical vapor deposition (CVD) techniques are single-step processes that have already been successfully investigated for the simultaneous synthesis and deposition of porphyrin-based materials. However, while the structure of porphyrins is fully preserved in evaporation deposition, the coating stability is poor, since it is based only on non-covalent bonding. Plasticization, aging, and chemical/mechanical stability are three main challenges that polymer membrane gas separation is facing.

In certain embodiments, the invention relates to a facile, one-step method in which initiated plasma enhanced chemical vapor deposition (iPECVD) is used to synthesize hyper-thin (e.g., sub-100 nm) and flexible metal organic covalent network (MOCN) layers directly on a membrane support. In the MOCN, the metalloporphyrin units are covalently bonded together and thus are distinct from MOFs, which are molecular solids. In certain embodiments, the supported layers are comprised of zinc tetraphenylporphyrin (ZnTPP) building units. In certain embodiments, the supported layers demonstrate gas separation exceeding the upper bounds for multiple gas pairs while reducing the flux as compared to the support alone. In certain embodiments, the films must be flexible in order to tolerate operating conditions involving high transmembrane pressure differences.

In certain embodiments, the invention relates to a method of polymerizing a porphyrin via iPECVD. In certain embodiments, the method is scalable, substrate independent, or fast, or, preferably, scalable, substrate independent, and fast. In certain embodiments, the method involves the use of a polymerization initiator activated by low-power plasma, which promotes the chain-growth polymerization of the building units (such as ZnTPP), while ensuring retention of the key macrocyclic structure and functionalities. The resulting hyper-thin and pinhole-free ZnTPP-based MOCN films showed enhanced gas selectivities for the efficient separation of $H_2/CH_4$, $H_2/N_2$, $O_2/N_2$, $CO_2/N_2$ and $CO_2/CH_4$ gas mixtures. For instance, as shown in FIG. 1f, the overall $CO_2/N_2$ separation performance of representative supported MOCN film (47 nm, $CO_2$ permeability 3600 Barrer, $CO_2/N_2$ selectivity 80) was well above the 2008 $CO_2/N_2$ upper bound (FIG. 1f). This performance was also better than the existing commercial polymers and comparable to those reported for supported graphene and GOs, carbon molecular sieves (CMS), thermally rearranged (TR) polymers, pristine and modified PIMs. In contrast to the previously described materials, the iPECVD MOCN was fabricated in a single step directly on its support over significant area to yield a flexible supported membrane.

Initiated Plasma-Enhanced Chemical Vapor Deposition

Materials-processing often involves the deposition of films or layers on a surface of a substrate. One manner of effecting the deposition of such films or layers is through chemical vapor deposition (CVD). CVD involves a chemical reaction of vapor phase chemicals or reactants that contain the constituents to be deposited on the substrate. Reactant gases are introduced into a reaction chamber or reactor, and are decomposed and reacted at a heated surface to form the desired film or layer.

One method of CVD is initiated plasma-enhanced CVD (iPECVD). The use of an initiator not only allows the chemistry to be controlled, but also accelerates film growth and provides control of molecular weight and rate. The use of a variable plasma source, such as an argon plasma, keeps the energy input low due to low power, but high growth rates may be achieved. The process progresses independent from the shape or composition of the substrate, is easily scalable, and easily integrated with other processes. In some embodiments, the iPECVD process is scalable to large lateral dimensions and roll-to-roll processing.

In certain embodiments, iPECVD showed better selectivity than PECVD (not initiated).

In certain embodiments, the use of plasma in iPECVD showed higher polymerization rates, than the hot filaments used in iCVD. In some embodiments, the higher polymerization is due to more effective free-radical generation from the gaseous initiator.

In certain embodiments, iPECVD effectively polymerizes monomers with a high sticking coefficient, such as porphyrin building units, that would deposit and remain on the substrate surface even if non-polymerized.

In certain embodiments, iPECVD takes place in a reactor. In certain embodiments, a variety of monomer species may be polymerized and deposited by iPECVD; these monomer species are well-known in the art. In certain embodiments, the surface to be coated is placed on a stage in the reactor and gaseous precursor molecules are fed into the reactor; the stage may be the bottom of the reactor and not a separate entity. In certain embodiments, a variety of carrier gases are useful in iPECVD, such as those useful in iCVD; these carrier gases are well-known in the art.

In certain embodiments, the iPECVD reactor has automated electronics to control reactor pressure and to control reactant flow rates. In certain embodiments, any unreacted vapors may be exhausted from the system.

In certain embodiments, the iPECVD coating process can take place at a range of pressures from atmospheric pressure to low vacuum. In certain embodiments, the pressure is atmospheric pressure. In certain embodiments, the pressure is less than about 50 torr. In certain embodiments, the pressure is less than about 40 torr. In certain embodiments, the pressure is less than about 30 torr. In certain embodiments, the pressure is less than about 20 torr. In certain embodiments, the pressure is less than about 10 torr. In certain embodiments, the pressure is less than about 5 torr. In certain embodiments, the pressure is less than about 1 torr. In certain embodiments, the pressure is less than about 0.7 torr. In certain embodiments, the pressure is less than about 0.4 torr, less than about 40 mtorr, or less than about 4 mtorr. In certain embodiments, the pressure is about 50 torr. In certain embodiments, the pressure is about 40 torr. In certain embodiments, the pressure is about 30 torr. In certain embodiments, the pressure is about 20 torr. In certain embodiments, the pressure is about 10 torr. In certain embodiments, the pressure is about 5 torr. In certain embodiments, the pressure is about 1 torr. In certain embodiments, the pressure is about 0.7 torr. In certain embodiments, the pressure is about 0.6 torr. In certain embodiments, the pressure is about 0.5 torr. In certain embodiments, the pressure is about 0.4 torr. In certain embodiments, the pressure is about 0.3 torr. In certain embodiments, the pressure is about 0.2 torr. In certain embodiments, the pressure is about 0.1 torr. In certain embodiments, the pressure is about 50 mtorr. In certain embodiments, the pressure is about 10 mtorr. In certain embodiments, the pressure is about 9 mtorr. In certain embodiments, the pressure is about 8 mtorr. In certain embodiments, the pressure is about 7 mtorr. In certain embodiments, the pressure is about 6 mtorr. In certain embodiments, the pressure is about 5 mtorr. In certain embodiments, the pressure is about 4 mtorr. In certain embodiments, the pressure is about 3 mtorr. In certain embodiments the pressure is about 2 mtorr. In certain embodiments the pressure is about 1 torr; about 0.9 torr; about 0.8 torr; about 0.7 torr; about 0.6 torr; about 0.5 torr; about 0.4 torr; about 0.3 torr; about 0.2 torr; about 0.1 torr.

In certain embodiments, the flow rate of the monomer can be adjusted in the iPECVD method. In certain embodiments, the monomer flow rate is about 100 sccm (standard cubic centimeters per minute). In certain embodiments, the monomer flow rate is about 90 sccm. In certain embodiments, the monomer flow rate is about 80 sccm. In certain embodiments the monomer flow rate is about 70 sccm. In certain embodiments, the monomer flow rate is about 60 sccm. In certain embodiments, the monomer flow rate is about 50 sccm. In certain embodiments, the monomer flow rate is about 40 sccm. In certain embodiments, the monomer flow rate is about 30 sccm. In certain embodiments, the monomer flow rate is about 20 sccm. In certain embodiments, the monomer flow rate is less than about 100 sccm. In certain embodiments, the monomer flow rate is less than about 90 sccm. In certain embodiments, the monomer flow rate is less than about 80 sccm. In certain embodiments, the monomer flow rate is less than about 70 sccm. In certain embodiments, the monomer flow rate is less than about 60 sccm. In certain embodiments, the monomer flow rate is less than about 50 sccm. In certain embodiments, the monomer flow rate is less than about 40 sccm. In certain embodiments, the monomer flow rate is less than about 30 sccm. In certain embodiments, the monomer flow rate is less than about 20 sccm. In certain embodiments, the monomer flow rate is about 15 sccm. In certain embodiments, the flow rate is less than about 15 sccm. In certain embodiments, the monomer flow rate is about 14 sccm. In certain embodiments, the flow rate is less than about 14 sccm. In certain embodiments, the monomer flow rate is about 13 sccm. In certain embodiments, the flow rate is less than about 13 sccm. In certain embodiments, the monomer flow rate is about 12 sccm. In certain embodiments, the flow rate is less than about 12 sccm. In certain embodiments, the monomer flow rate is about 11 sccm. In certain embodiments, the flow rate is less than about 11 sccm. In certain embodiments, the monomer flow rate is about 10 sccm. In certain embodiments, the flow rate is less than about 10 sccm. In certain embodiments, the monomer flow rate is about 9 sccm. In certain embodiments, the flow rate is less than about 9 sccm. In certain embodiments, the monomer flow rate is about 8 sccm. In certain embodiments, the flow rate is less than about 8 sccm. In certain embodiments, the monomer flow rate is about 7 sccm. In certain embodiments, the flow rate is less than about 7 sccm. In certain embodiments, the monomer flow rate is about 6 sccm. In certain embodiments, the flow rate is less than about 6 sccm. In certain embodiments, the monomer flow rate is about 5 sccm. In certain embodiments, the flow rate is less than about 5 sccm. In certain embodiments, the monomer flow rate is about 3 sccm. In certain embodiments, the flow rate is less than about 3 sccm. In certain embodiments, the monomer flow rate is about 1.5 sccm. In certain embodiments, the flow rate is less than about 1.5 sccm. In certain embodiments, the monomer flow rate is about 0.75 sccm. In certain embodiments, the flow rate is less than about 0.75 sccm. In certain embodiments, the monomer flow rate is about 0.6 sccm. In certain embodiments, the flow rate is less than about 0.6 sccm. In certain embodiments, the monomer flow rate is about 0.5 sccm. In certain embodiments, the flow rate is less than about 0.5 sccm. When more than one monomer is used (i.e., to deposit co-polymers), the flow rate of the additional monomers, in certain embodiments, may be the same as those presented above.

In certain embodiments, the temperature of the monomer can be adjusted in the iCVD method. In certain embodiments, the monomer can be heated and delivered to the chamber by a heated mass flow controller. In certain embodiments, the monomer can be heated and delivered to the chamber by a needle valve. In certain embodiments, the monomer is heated at about 30° C., about 35° C., about 40° C., about 45° C., about 50° C., about 55° C., about 60° C., about 65° C., about 70° C., about 75° C., about 80° C., about 85° C., about 90° C., about 95° C., or about 100° C.

In certain embodiments, the monomer can be heated and delivered from a crucible inside the reactor. In certain embodiments, the crucible is heated to a temperature greater than about 100° C., greater than about 150° C., greater than about 200° C., or greater than about 250° C. In certain embodiments, the crucible is heated to a temperature from about 250° C. to about 300° C. In certain embodiments, the crucible is heated to a temperature of about 275° C.

In certain embodiments, the flow rate of the initiator can be adjusted in the iPECVD method. In certain embodiments the initiator flow rate is about 100 sccm. In certain embodiments, the initiator flow rate is about 90 sccm. In certain embodiments, the initiator flow rate is about 80 sccm. In certain embodiments, the initiator flow rate is about 70 sccm. In certain embodiments, the initiator flow rate is about 60 sccm. In certain embodiments, the initiator flow rate is about 50 sccm. In certain embodiments, the initiator flow rate is about 40 sccm. In certain embodiments, the initiator flow rate is about 30 sccm. In certain embodiments, the initiator flow rate is about 20 sccm. In certain embodiments, the initiator flow rate is less than about 100 sccm. In certain embodiments, the initiator flow rate is less than about 90 sccm. In certain embodiments, the initiator flow rate is less than about 80 sccm. In certain embodiments, the initiator flow rate is less than about 70 sccm. In certain embodiments, the initiator flow rate is less than about 60 sccm. In certain embodiments, the initiator flow rate is less than about 50 sccm. In certain embodiments, the initiator flow rate is less than about 40 sccm. In certain embodiments, the initiator flow rate is less than about 30 sccm. In certain embodiments, the initiator flow rate is less than about 20 sccm. In certain embodiments, the initiator flow rate is about 10 sccm. In certain embodiments, the flow rate is less than about 10 sccm. In certain embodiments, the initiator flow rate is about 5 sccm. In certain embodiments, the flow rate is less than about 5 sccm. In certain embodiments, the initiator flow rate is about 3 sccm. In certain embodiments, the flow rate is less than about 3 sccm. In certain embodiments, the initiator flow rate is about 1.5 sccm. In certain embodiments, the flow rate is less than about 1.5 sccm. In certain embodiments, the initiator flow rate is about 0.75 sccm. In certain embodiments, the flow rate is less than about 0.75 sccm. In certain embodiments, the initiator flow rate is about 0.5 sccm. In certain embodiments, the flow rate is less than about 0.5 sccm. In certain embodiments, the initiator flow rate is about 0.4 sccm. In certain embodiments, the flow rate is less than about 0.4 sccm. In certain embodiments, the initiator flow rate is about 0.3 sccm. In certain embodiments, the flow rate is less than about 0.3 sccm. In certain embodiments, the initiator flow rate is about 0.2 sccm. In certain embodiments, the flow rate is less than about 0.2 sccm. In certain embodiments, the initiator flow rate is about 0.1 sccm. In certain embodiments, the flow rate is less than about 0.1 sccm. In certain embodiments, a variety of initiators are useful in iPECVD, such as those useful in iCVD; these initiators are well-known in the art.

In certain embodiments, the carrier gas is an inert gas. In certain embodiments, the carrier gas is selected from the group consisting of nitrogen, helium, neon, argon, krypton, and xenon. In certain embodiments, the carrier gas is nitrogen or argon.

In certain embodiments, the flow rate of the carrier gas can be adjusted in the iPECVD method. In certain embodiments, the carrier gas flow rate is about 1000 sccm. In certain embodiments, the carrier gas flow rate is about 900 sccm. In certain embodiments, the carrier gas flow rate is about 800 sccm. In certain embodiments, the carrier gas flow rate is about 700 sccm. In certain embodiments, the carrier gas flow rate is about 600 sccm. In certain embodiments, the carrier gas flow rate is about 500 sccm. In certain embodiments, the carrier gas flow rate is about 400 sccm. In certain embodiments, the carrier gas flow rate is about 300 sccm. In certain embodiments, the carrier gas flow rate is about 200 sccm. In certain embodiments, the carrier gas flow rate is about 100 sccm. In certain embodiments, the carrier gas flow rate is about 90 sccm. In certain embodiments, the carrier gas flow rate is about 80 sccm. In certain embodiments, the carrier gas flow rate is about 70 sccm. In certain embodiments, the carrier gas flow rate is about 60 sccm. In certain embodiments, the carrier gas flow rate is about 50 sccm. In certain embodiments, the carrier gas flow rate is about 40 sccm. In certain embodiments, the carrier gas flow rate is about 30 sccm. In certain embodiments, the carrier gas flow rate is about 20 sccm. In certain embodiments, the carrier gas flow rate is less than about 1000 sccm. In certain embodiments, the carrier gas flow rate is less than about 900 sccm. In certain embodiments, the carrier gas flow rate is less than about 800 sccm. In certain embodiments, the carrier gas flow rate is less than about 700 sccm. In certain embodiments, the carrier gas flow rate is less than about 600 sccm. In certain embodiments, the carrier gas flow rate is less than about 500 sccm. In certain embodiments, the carrier gas flow rate is less than about 400 sccm. In certain embodiments, the carrier gas flow rate is less than about 300 sccm. In certain embodiments, the carrier gas flow rate is less than about 200 sccm. In certain embodiments, the carrier gas flow rate is less than about 100 sccm. In certain embodiments, the carrier gas flow rate is less than about 90 sccm. In certain embodiments, the carrier gas flow rate is less than about 80 sccm. In certain embodiments, the carrier gas flow rate is less than about 70 sccm. In certain embodiments, the carrier gas flow rate is less than about 60 sccm. In certain embodiments the carrier gas flow rate is less than about 50 sccm. In certain, embodiments the carrier gas flow rate is less than about 40 sccm. In certain embodiments, the carrier gas flow rate is less than about 30 sccm. In certain embodiments, the carrier gas flow rate is less than about 20 sccm. In certain embodiments, the carrier gas flow rate is about 10 sccm. In certain embodiments, the flow rate is less than about 10 sccm. In certain embodiments, the carrier gas flow rate is about 5 sccm. In certain embodiments, the flow rate is less than about 5 sccm. In certain embodiments, the carrier gas flow rate is about 4 sccm. In certain embodiments, the flow rate is less than about 4 sccm. In certain embodiments, the carrier gas flow rate is about 3 sccm. In certain embodiments, the flow rate is less than about 3 sccm. In certain embodiments, the carrier gas flow rate is about 2 sccm. In certain embodiments, the flow rate is less than about 2 sccm. In certain embodiments, the carrier gas flow rate is about 1 sccm. In certain embodiments, the flow rate is less than about 1 sccm.

In certain embodiments, the iPECVD coating process can take place at a range of temperatures of the substrate stage. In certain embodiments, the temperature of the substrate stage is ambient temperature. In certain embodiments, the temperature of the substrate stage is about 20° C.; in yet other embodiments the temperature of the substrate stage is between about 10° C. and about 100° C., or between about 0° C. and about 25° C. In certain embodiments said temperature of the substrate stage is controlled by water.

In certain embodiments, the rate of polymer deposition is about 1 micron/minute. In certain embodiments, the rate of polymer deposition is between about 1 micron/minute and about 50 nm/minute. In certain embodiments, the rate of polymer deposition is between about 10 micron/minute and about 50 nm/minute. In certain embodiments, the rate of polymer deposition is between about 100 micron/minute and about 50 nm/minute. In certain embodiments, the rate of polymer deposition is between about 1 nm/minute and about 50 nm/minute. In certain embodiments, the rate of polymer deposition is between about 10 nm/minute and about 50 nm/minute. In certain embodiments, the rate of polymer deposition is between about 10 nm/minute and about 25 nm/minute.

In certain embodiments, the present invention relates to any one of the methods described herein, wherein the gaseous initiator is selected from the group consisting of peroxides, aryl ketones, and alkyl azo compounds.

In certain embodiments, the present invention relates to any one of the methods described herein, wherein the gaseous initiator is selected from the group consisting of tert-butyl peroxide, tert-amyl peroxide, triethylamine, tert-butylperoxy benzoate, benzophenone, and 2,2'-azobis(2-methylpropane) (ABMP).

In certain embodiments, the present invention relates to any one of the methods described herein, wherein the gaseous initiator is tert-butyl peroxide.

In certain embodiments, the present invention relates to any one of the methods described herein, wherein the stage is moveable.

In certain embodiments, the present invention relates to any one of the methods described herein, wherein the method further comprises the step of discharging the energy in timed pulses, thereby creating a duty cycle.

In certain embodiments, the present invention relates to any one of the methods described herein, wherein the duty cycle is about 5% to about 80%.

In certain embodiments, the present invention relates to any one of the methods described herein, wherein the duty cycle is about 10% to about 60%.

In certain embodiments, the present invention relates to any one of the methods described herein, wherein the duty cycle is about 15% to about 40%.

In certain embodiments, the present invention relates to any one of the methods described herein, wherein the duty cycle is about 20% to about 30%.

In certain embodiments, the present invention relates to any one of the methods described herein, wherein the time that the discharge of energy is active, $t_{ON}$, is about 1 ns to about 10 s.

In certain embodiments, the present invention relates to any one of the methods described herein, wherein the time that the discharge of energy is active, $t_{ON}$, is about 1 μs to about 6 s.

In certain embodiments, the present invention relates to any one of the methods described herein, wherein the time that the discharge of energy is active, $t_{ON}$, is about 1 ms to about 2 s.

In certain embodiments, the present invention relates to any one of the methods described herein, wherein the power is about 5 W to about 40 W. In certain embodiments, the present invention relates to any one of the methods described herein, wherein the power is about 10 W to about 35 W. In certain embodiments, the present invention relates to any one of the methods described herein, wherein the power is about 15 W, about 20 W, about 25 W, about 30 W, or about 35 W.

Initiated plasma-enhanced CVD (iPECVD) is described in US 2013/0040102, which is hereby incorporated by reference in its entirety.

Exemplary Polymers

In certain embodiments, the invention relates to a polymer comprising a repeat unit of Formula I, Formula II, Formula III, Formula IV, Formula V, or Formula VI, or a combination thereof:

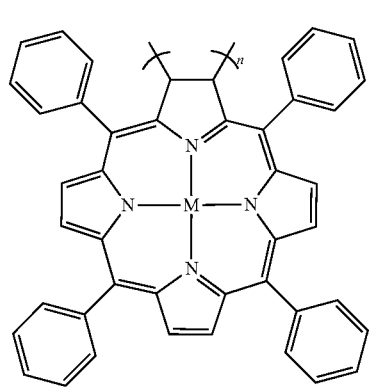

Formula I

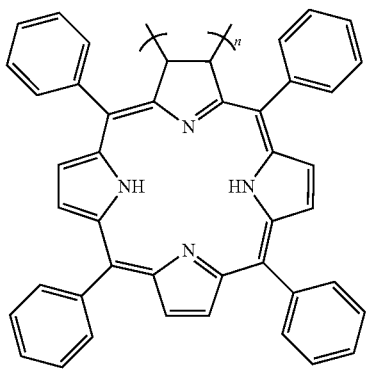

Formula II

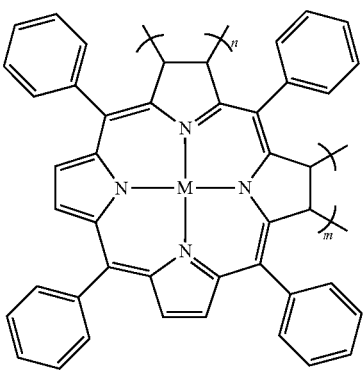

Formula III

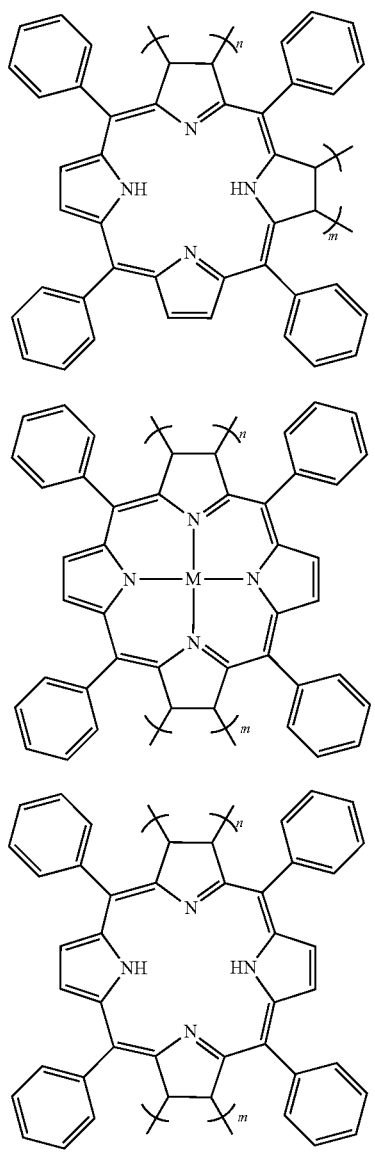

Formula IV

Formula V

Formula VI wherein

M, when present, is a zinc ion, a manganese ion, a cobalt ion, an iron ion, a tungsten ion, a magnesium ion, a palladium ion, a platinum ion, or a chromium ion;

n is an integer greater than 2; and m, when present, is an integer greater than 2.

In certain embodiments, the invention relates to any one of the polymers described herein, wherein the polymer is a polymer comprising a repeat unit of Formula I, Formula III, or Formula V.

In certain embodiments, the invention relates to any one of the polymers described herein, wherein the polymer is a polymer comprising a repeat unit of Formula I, Formula III, or Formula V; and M is a zinc ion, a manganese ion, or a cobalt ion.

In certain embodiments, the invention relates to any one of the polymers described herein, wherein the polymer is a polymer comprising a repeat unit of Formula I, Formula III, or Formula V; and M is a zinc ion.

In certain embodiments, the invention relates to any one of the polymers described herein, wherein the polymer is a polymer comprising a repeat unit of Formula I, Formula III, or Formula V; and M is a manganese ion.

In certain embodiments, the invention relates to any one of the polymers described herein, wherein the polymer is a polymer comprising a repeat unit of Formula I, Formula III, or Formula V; and M is a cobalt ion.

In certain embodiments, the invention relates to any one of the polymers described herein, wherein M has one or more free axial coordination sites.

In certain embodiments, the invention relates to a method of separating a first gas from a second gas in a mixture of first and second gases, wherein the metal ion M affects gas separation. In some embodiments, M affects gas separation by one or more of causing nonplanar distortion of the porphyrin ring, having one or more free axial coordination sites, and affinity to the gas molecules.

In certain embodiments, the invention relates to any one of the polymers described herein, wherein the polymer is a polymer comprising a repeat unit of Formula II, Formula IV, or Formula VI.

In certain embodiments, the invention relates to any one of the polymers described herein, wherein n is an integer from 2 to 100,000, 2 to 50,000, 2 to 10,000, 2 to 1000, 2 to 500, or 2 to 100.

In certain embodiments, the invention relates to any one of the polymers described herein, wherein m is an integer from 2 to 100,000, 2 to 50,000, 2 to 10,000, 2 to 1000, 2 to 500, or 2 to 100.

In certain embodiments, the invention relates to any one of the polymers described herein, wherein the polymer further comprises a second repeat unit. In certain embodiments, the second repeat unit is derived from a vinyl monomer or a divinyl crosslinker. In certain embodiments, the second repeat unit is derived from a vinyl monomer. In certain embodiments, the vinyl monomer is styrene. In certain embodiments, the second repeat unit is derived from a divinyl crosslinker. In certain embodiments, the divinyl crosslinker is divinylbenzene.

In certain embodiments, copolymerization of porphyrin building units with a crosslinking agent provides a dense and pinhole-free polymer. In some embodiments, the polymer is P(DVB-co-ZnTPC). In some embodiments, the polymer coatings exhibited high gas selectivities. In some embodiments, a copolymer exhibits higher gas selectivities than a homopolymer.

In certain embodiments, the molar ratio of the repeat unit to the second repeat unit is about 100:1 to about 1:1. In certain embodiments, the molar ratio is about 1:1.

In certain embodiments, the invention relates to any one of the polymers described herein, wherein the polymer is a polymer comprising a repeat unit of Formula I, Formula III, or Formula V; and a second repeat unit derived from a vinyl monomer or a divinyl crosslinker; wherein the molar ratio of the repeat unit to the second repeat unit is about 100:1 to about 1:1. In certain embodiments, the molar ratio is about 1:1.

Exemplary Compositions

In certain embodiments, the invention relates to a composition, wherein the composition comprises a substrate and a coating material, wherein the coating material comprises any one of the polymers described herein.

In certain embodiments, the invention relates to any one of the compositions described herein, wherein the coating material consists essentially of any one of the polymers described herein.

In certain embodiments, the invention relates to any one of the compositions described herein, wherein the coating material consists of any one of the polymers described herein.

In certain embodiments, the invention relates to any one of the compositions described herein, wherein the coating material is flexible.

In certain embodiments, the invention relates to any one of the compositions described herein, wherein the coating material has a surface area of at least about 100 cm$^2$, at least about 200 cm$^2$, at least about 300 cm$^2$, at least about 400 cm$^2$, at least about 500 cm$^2$, at least about 600 cm$^2$, at least about 700 cm$^2$, at least about 800 cm$^2$, at least about 900 cm$^2$, or at least about 1000 cm$^2$.

In certain embodiments, the invention relates to any one of the compositions described herein, wherein the coating material has a surface area of up to about 300 cm$^2$, up to about 400 cm$^2$, up to about 500 cm$^2$, up to about 600 cm$^2$, up to about 700 cm$^2$, up to about 800 cm$^2$, up to about 900 cm$^2$, or up to about 1000 cm$^2$, or more.

In certain embodiments, the invention relates to any one of the compositions described herein, wherein the coating material is pinhole-free.

In certain embodiments, the invention relates to any one of the compositions described herein, wherein the coating material is conformal.

In certain embodiments, the invention relates to any one of the compositions described herein, wherein the coating material is non-conformal. In certain embodiments, the coating material is directionally deposited. In certain embodiments, the non-conformal coating results from one or more of the high sticking coefficient of the porphyrin monomer, the large temperature gradient between the heated crucible and the cooler substrate, and the directional electric field associated with the RF plasma excitation.

In certain embodiments, the invention relates to any one of the compositions described herein, wherein the coating material is smooth. In some embodiments, the roughness of the coating material ranges from about 0 nm to about 5 nm, from about 0 nm to about 4 nm, from about 0 nm to about 3 nm, from about 0 nm to about 2 nm, and from about 0 nm to about 1 nm.

In certain embodiments, the invention relates to any one of the compositions described herein, wherein the coating material is microporous.

In certain embodiments, the invention relates to any one of the compositions described herein, wherein the coating material is stable against dissolution by solvents. In certain embodiments, the solvent is selected from the group consisting of methanol, toluene, and chloroform. In certain embodiments, the solvent is methanol or chloroform.

In certain embodiments, the invention relates to any one of the compositions described herein, wherein the coating material has an average pore diameter less than about 1 nm, less than about 0.9 nm, less than about 0.8 nm, less than about 0.7 nm, less than about 0.6 nm, less than about 0.5 nm, or less than about 0.4 nm. In certain embodiments, pore diameter may be measured by ellipsometric porosimetry.

In certain embodiments, the invention relates to any one of the compositions described herein, wherein the plane-to-plane distance of the porphyrin rings in the coating material is about 0.2 nm to about 15 nm. In certain embodiments, the plane-to-plane distance of the porphyrin rings in the coating material is about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, or about 15 nm.

In certain embodiments, the invention relates to any one of the compositions described herein, wherein the plane-to-plane distance of the porphyrin rings in the coating material is about 0.2 nm to about 1.0 nm. In certain embodiments, the invention relates to any one of the compositions described herein, wherein the plane-to-plane distance of the porphyrin rings in the coating material is about 0.3 nm, about 0.4 nm, about 0.5 nm, about 0.6 nm, about 0.7 nm, or about 0.8 nm. In certain embodiments, the plane-to-plane distance of the porphyrin rings in the coating material may be calculated by DFT.

In certain embodiments, the invention relates to any one of the compositions described herein, wherein the thickness of the coating material is about 10 nm to about 100 nm. In certain embodiments, the invention relates to any one of the compositions described herein, wherein the thickness of the coating material is less than about 10 nm, less than about 20 nm, less than about 30 nm, less than about 40 nm, less than about 50 nm, less than about 60 nm, less than about 70 nm, less than about 80 nm, less than about 90 nm, or less than about 100 nm. In certain embodiments, the invention relates to any one of the compositions described herein, wherein the thickness of the coating material is about 10 nm, about 20 nm, about 30 nm, about 40 nm, about 50 nm, about 60 nm, about 70 nm, about 80 nm, about 90 nm, or about 100 nm.

In certain embodiments, the invention relates to any one of the compositions described herein, wherein the substrate is homogeneous.

In certain embodiments, the invention relates to any one of the compositions described herein, wherein the substrate is heterogeneous.

In certain embodiments, the invention relates to any one of the compositions described herein, wherein the substrate is planar or non-planar.

In certain embodiments, the invention relates to any one of the compositions described herein, wherein the substrate is porous. In certain embodiments, the composition comprises a porous substrate and a non-conformal coating material, wherein the coating material comprises any one of the polymers described herein. In certain embodiments, the coating material does not infill the pores of the substrate. In certain embodiments, the coating material does not penetrate the porous substrate.

In certain embodiments, the invention relates to any one of the compositions described herein, wherein the substrate is ultrapermeable. In certain embodiments, the invention relates to any one of the compositions described herein, wherein the surface of the substrate is concave or convex.

In certain embodiments, the invention relates to any one of the compositions described herein, wherein the substrate is a membrane. In certain embodiments, the coating material does not penetrate the membrane substrate.

In certain embodiments, the invention relates to any one of the compositions described herein, wherein the substrate comprises poly[1-(trimethylsilyl)-1-propyne] (PTMSP). In certain embodiments, the invention relates to any one of the compositions described herein, wherein the substrate is a poly[1-(trimethylsilyl)-1-propyne] (PTMSP) membrane.

In certain embodiments, the invention relates to any one of the compositions described herein, wherein the substrate comprises a metal or an electrically conducting or semiconducting material. In some embodiments, the substrate comprises a metal. In some embodiments, the substrate is a carbon copper TEM grid.

In certain embodiments, the invention relates to any one of the compositions described herein, wherein the substrate is a glass slide, a silicon wafer, a PTMSP membrane, or a carbon copper TEM grid.

In certain embodiments, the invention relates to any one of the compositions described herein, wherein the composition exhibits a permeance of less than about 300 GPU for $H_2$. In certain embodiments, the composition exhibits a permeance of less than about 100 GPU for $H_2$.

In certain embodiments, the invention relates to any one of the compositions described herein, wherein the composition exhibits a permeance of less than about 200 GPU for $CO_2$. In certain embodiments, the composition exhibits a permeance of less than about 50 GPU for $CO_2$.

In certain embodiments, the invention relates to any one of the compositions described herein, wherein the composition exhibits a permeance of less than about 20 GPU for $O_2$. In certain embodiments, the composition exhibits a permeance of less than about 5 GPU for $O_2$. In certain embodiments, the invention relates to any one of the compositions described herein, wherein the composition exhibits a permeance of less than about 3 GPU for $N_2$. In certain embodiments, the composition exhibits a permeance of less than about 1 GPU for $N_2$.

In certain embodiments, the invention relates to any one of the compositions described herein, wherein the composition exhibits a permeance of less than about 3 GPU for $CH_4$. In certain embodiments, the composition exhibits a permeance of less than about 1 GPU for $CH_4$.

In certain embodiments, the invention relates to any one of the compositions described herein, wherein the composition exhibits a $CO_2/CH_4$ selectivity of about 100 for a $CO_2$ permeability (Barrer) of about 200.

In certain embodiments, the invention relates to any one of the compositions described herein, wherein the composition exhibits a $CO_2/CH_4$ selectivity of about 90 for a $CO_2$ permeability (Barrer) of about 3000.

In certain embodiments, the invention relates to any one of the compositions described herein, wherein the composition exhibits an $O_2/N_2$ selectivity of about 20 for an $O_2$ permeability (Barrer) of about 60.

In certain embodiments, the invention relates to any one of the compositions described herein, wherein the composition exhibits an $O_2/N_2$ selectivity of about 7 for an $O_2$ permeability (Barrer) of about 300.

In certain embodiments, the invention relates to any one of the compositions described herein, wherein the composition exhibits a $H_2/N_2$ selectivity of about 500 for a $H_2$ permeability (Barrer) of about 2000.

In certain embodiments, the invention relates to any one of the compositions described herein, wherein the composition exhibits a $H_2/N_2$ selectivity of about 100 for a $H_2$ permeability (Barrer) of about 6000.

In certain embodiments, the invention relates to any one of the compositions described herein, wherein the composition exhibits a $H_2/CH_4$ selectivity of about 800 for a $H_2$ permeability (Barrer) of about 2000.

In certain embodiments, the invention relates to any one of the compositions described herein, wherein the composition exhibits a $H_2/CH_4$ selectivity of about 100 for a $H_2$ permeability (Barrer) of about 6000.

In certain embodiments, the invention relates to any one of the compositions described herein, wherein the composition maintains high flux after the coating process.

In certain embodiments, the invention relates to any one of the compositions described herein, wherein the composition displays good coating stability in long-term use.

Another aspect of the invention relates to the composition obtained by the process of any one of methods discussed below.

Exemplary Methods

In certain embodiments, the invention relates to a method of coating a surface of a substrate, comprising the steps of:
providing a substrate;
depositing by iPECVD on a surface of the substrate any one of the polymers described herein.

In certain embodiments, the invention relates to any one of the methods described herein, wherein the plasma is selected from the group consisting of an argon plasma, a carbon dioxide plasma, a helium plasma, a hydrogen plasma, a nitrogen plasma, a nitrous oxide plasma, and an oxygen plasma. In some embodiments, the plasma is an argon plasma.

In certain embodiments, the invention relates to any one of the methods described herein, further comprising the steps of: providing a deposition chamber; and adding to the deposition chamber an initiator. The initiator may be any compound that decomposes to form free radicals. The initiator may be AIBN, an alkyl peroxide (e.g., tert-amyl peroxide or tert-butyl peroxide), or a dialkyl peroxide (e.g., di-tert-amyl peroxide or di-tert-butyl peroxide), triethylamine, tert-butyl peroxy benzoate, benzophenone, or 2,2'-azo-bis(2-methylpropane). In some embodiments, the free radicals are produced in a plasma discharge. In some embodiments, the free radicals are produced in a pulsed plasma discharge. In some embodiments, the pulsed plasma discharge is a nanosecond pulsed discharge.

Exemplary Applications and Articles

In certain embodiments, the invention relates to an article comprising any one of the compositions described herein.

In some embodiments, the invention relates to an article comprising any one of the compositions described herein, wherein the coating material is patterned using known techniques. In some embodiments, the pattern on the coating material is formed by photolithography or electron-beam lithography. In some embodiments, the pattern on the coating material is a physical or a chemical pattern.

In certain embodiments, the invention relates to any one of the articles described herein, wherein the article is, or is incorporated into, a sensor (such as colorimetric gas sensor), a catalyst (such as a heterogenous catalyst of a wide variety of organic reactions or a photocatalyst), a light-emitting diode, a field-effect transistor, a solar cell, a carbon capture device, a natural gas sweetener, or a gas separation device (e.g., hydrogen separation).

Exemplary Methods of Use

In certain embodiments, the invention relates to a method to separate gases using any one of the compositions described herein in the form of a membrane.

In certain embodiments, the invention relates to a method comprising
contacting, at a first flow rate, a first gaseous mixture with a first face of any one of the compositions described herein in the form of a membrane; and
monitoring at a second face of the composition a second gaseous mixture, wherein the first face and the second face are opposite faces of the membrane,
wherein
the first gaseous mixture comprises a first gas and a second gas;
the first gaseous mixture comprises a first concentration or first quantity of the second gas;
the second gaseous mixture comprises a second concentration or second quantity of the second gas; and the second concentration or second quantity is substantially lower than the first concentration or first quantity.

In certain embodiments, the invention relates to a method comprising contacting, at a first flow rate, a first gaseous mixture with a first face of any one of the compositions described herein in the form of a membrane; and collecting at a second face of the composition a second gaseous mixture, wherein the first face and the second face are opposite faces of the membrane, wherein the first gaseous mixture comprises a first gas and a second gas;

the first gaseous mixture comprises a first concentration or first quantity of the second gas;

the second gaseous mixture comprises a second concentration or second quantity of the second gas; and the second concentration or second quantity is substantially lower than the first concentration or first quantity.

In certain embodiments, the invention relates to any one of the methods described herein, wherein the first gas is $H_2$, $CO_2$, or $O_2$.

In certain embodiments, the invention relates to any one of the methods described herein, wherein the second gas is $CH_4$ or $N_2$.

In certain embodiments, the invention relates to any one of the methods described herein, wherein the gas separation relates to hydrogen recovery, pre-combustion methane sweetening, post-combustion carbon capture, $O_2$ enrichment, or $N_2$ enrichment.

In certain embodiments, the invention relates to any one of the methods described herein, wherein the first gas/second gas is $H_2/CH_4$, $H_2/N_2$, $O_2/N_2$, $CO_2/N_2$, or $CO_2/CH_4$. In certain embodiments, the first gas/second gas is $H_2/CH_4$ or $H_2/N_2$. In certain embodiments, the first gas/second gas is $O_2/N_2$. In certain embodiments, the first gas/second gas is $CO_2/CH_4$. In certain embodiments, the first gas/second gas is $CO_2/N_2$.

In certain embodiments, the invention relates to any one of the methods described herein, wherein the transmembrane pressure difference is more than 1 bar, more than 2 bar, more than 3 bar, more than 4 bar, more than 5 bar, more than 6 bar, more than 7 bar, more than 8 bar, more than 9 bar, or more than 10 bar. In certain embodiments, the invention relates to any one of the methods described herein, wherein the transmembrane pressure difference is about 1 bar to about 10 bar.

In certain embodiments, the invention relates to any one of the methods described herein, wherein the first gas/second gas selectivity at a transmembrane pressure difference of about 1 bar is within 20% of the first gas/second gas selectivity at a transmembrane pressure difference of about 10 bar. In certain embodiments, the invention relates to any one of the methods described herein, wherein the first gas/second gas selectivity at a transmembrane pressure difference of about 1 bar is within 10% of the first gas/second gas selectivity at a transmembrane pressure difference of about 10 bar.

In certain embodiments, the invention relates to any one of the methods described herein, wherein the permeance for the first gas at a transmembrane pressure difference of about 1 bar is within 20% of the permeance for the first gas at a transmembrane pressure difference of about 10 bar. In certain embodiments, the invention relates to any one of the methods described herein, wherein the permeance for the first gas at a transmembrane pressure difference of about 1 bar is within 10% of the permeance for the first gas at a transmembrane pressure difference of about 10 bar.

In certain embodiments, the invention relates to any one of the methods described herein, wherein the permeance for the second gas at a transmembrane pressure difference of about 1 bar is within 20% of the permeance for the second gas at a transmembrane pressure difference of about 10 bar. In certain embodiments, the invention relates to any one of the methods described herein, wherein the permeance for the second gas at a transmembrane pressure difference of about 1 bar is within 10% of the permeance for the second gas at a transmembrane pressure difference of about 10 bar.

In certain embodiments, the invention relates to any one of the methods described herein, wherein the second concentration or second quantity is about 0.

EXEMPLIFICATION

The invention now being generally described, it will be more readily understood by reference to the following examples, which are included merely for purposes of illustration of certain aspects and embodiments of the invention, and are not intended to limit the invention.

Example 1—Metal Organic Covalent Network Coating

Synthesis

MOCN coatings were prepared using iPECVD in a custom-built reactor. The reactor chamber is described in detail previously (Borrelli, D. C., et al. *Journal of Materials Chemistry C* 2, 7223-7231, (2014)). Prior to all depositions, the iPECVD chamber was pumped down to a base pressure of less than $1 \times 10^{-4}$ mbar by mechanical rotary and molecular turbo pumps. For the deposition experiments, argon gas, used as the plasma gas, was flowed into the chamber at a flow rate that ensures a constant pressure of $5 \times 10^{-3}$ mbar in the chamber. Argon flow rates were 10 and 20 sccm for the MOCN coatings and evaporated ZnTPP deposition experiments, respectively. The ZnTPP monomer (PorphyChem, 98%), used without further purification, was evaporated from a crucible resistively heated at 275° C. and located in the front side of the chamber. The tent-butyl peroxide (TBPO) initiator (Sigma-Aldrich, 98%), used without further purification, was fed into the chamber through a stainless steel line located in the back side of the chamber. A circular radio frequency (RF) capacitively coupled electrode of outer diameter 14 cm and inner diameter 5 cm was placed 2 cm above the TBPO initiator feeding line outlet situated in the back side of the chamber (see, for example, FIG. 5). The labile peroxide bond of the TBPO initiator was broken by a gentle RF plasma kept at 25 W. RF plasma was generated by an Advanced Energy Cesar RF power generator (Model 136) via a Plasma-Therm RF matching unit (MNS-50CE). The substrates used for the deposition were microscope glass slides, silicon wafers, PTMSP membranes and carbon copper TEM grids placed onto a temperature controlled stage (20° C.) located 15 cm above both the ZnTPP crucible and the RF electrode. For the evaporated ZnTPP thin films, no TBPO initiator was flowed to the chamber and RF plasma was not ignited.

One of the four monomers shown in Table 1 was metered into the vacuum chamber along with the TBPO initiator. Simultaneously, argon was introduced in to the chamber to allow the ignition of plasma using capacitively coupled 13.56 MHz radio-frequency (RF) excitation. The RF power was kept low (ca. 20 W over a 6 inch diameter stage) so as to limit the fragmentation of the monomer while producing cleavage of the TBPO to form radicals. In particular, the weak peroxy bond (O—O) in the TBPO initiator was readily subject to cleavage in the plasma environment.

TABLE 1 iPECVD monomers and films

| Central atom | Porphyrin monomers | Monomer acronyms | iPECVD films | Film acronyms |
|---|---|---|---|---|
| None | meso-tetraphenyl-porphyrin, | $H_2$TPP | poly(meso-tetraphenyl-chlorin) | poly-$H_2$TPC |
| Zn (II) | zinc(II) meso-(tetraphenyl-porphyrin), | Zn(TPP) | Poly-[zinc(II) meso-tetraphenyl-chlorin] | poly-Zn(TPC) or P(ZnTPC) |
| Mn(III) | manganese(III) meso-tetraphenyl-porphyrin chloride | MnCl(TPP) | poly-[manganese(III) meso-tetraphenyl-chlorin chloride] | poly-Mn(TPC) |
| Co(II) | cobalt(II) meso-tetraphenyl-porphyrin | Co(TPP) | poly-[manganese(III) meso-tetraphenyl-chlorin chloride] | poly-Co(TPC) |

Gas Permeation Experiments

Figure 11:
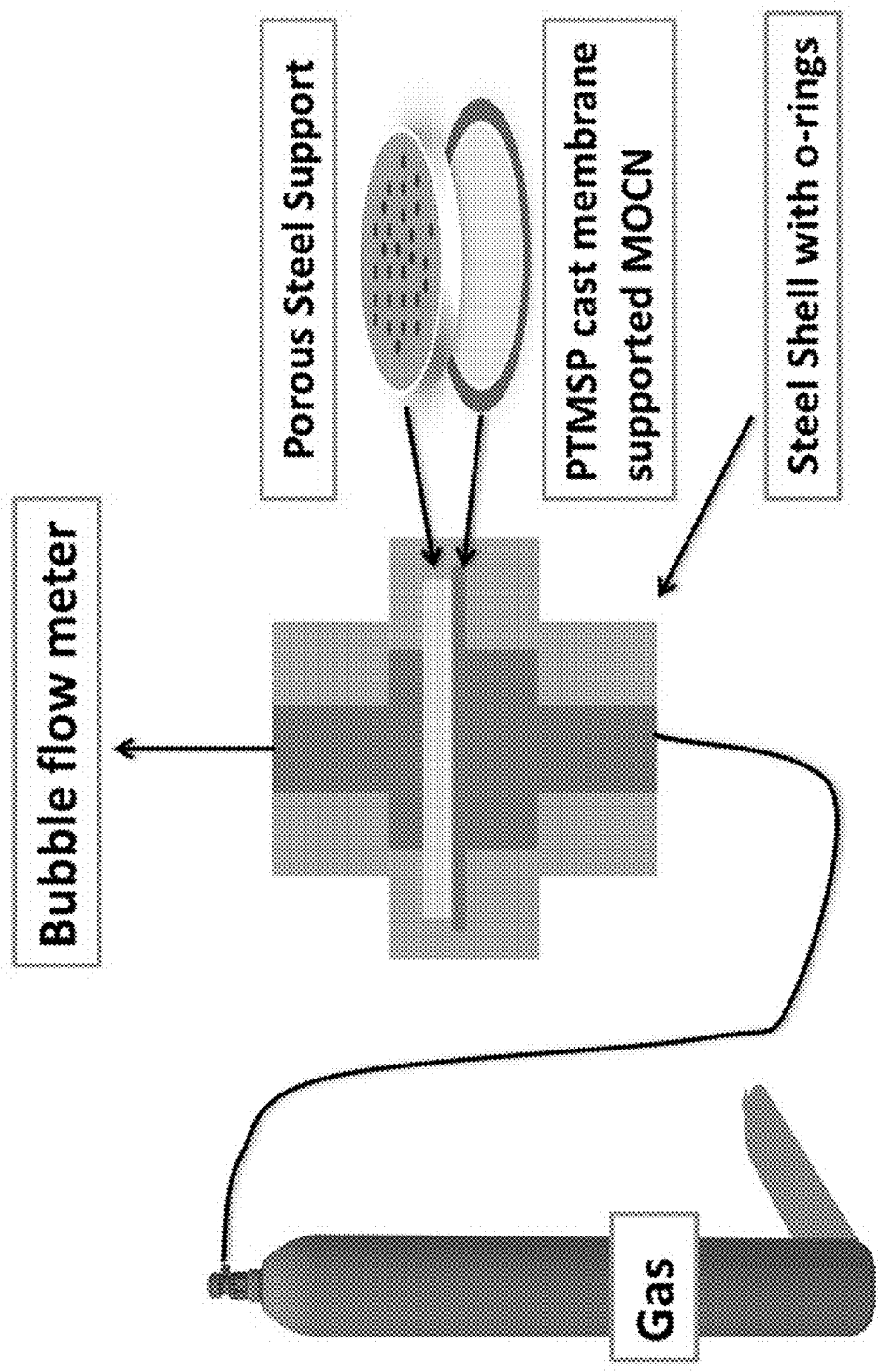
FIG. 11 depicts a schematic drawing of a gas permeation cell.
Figure 12:
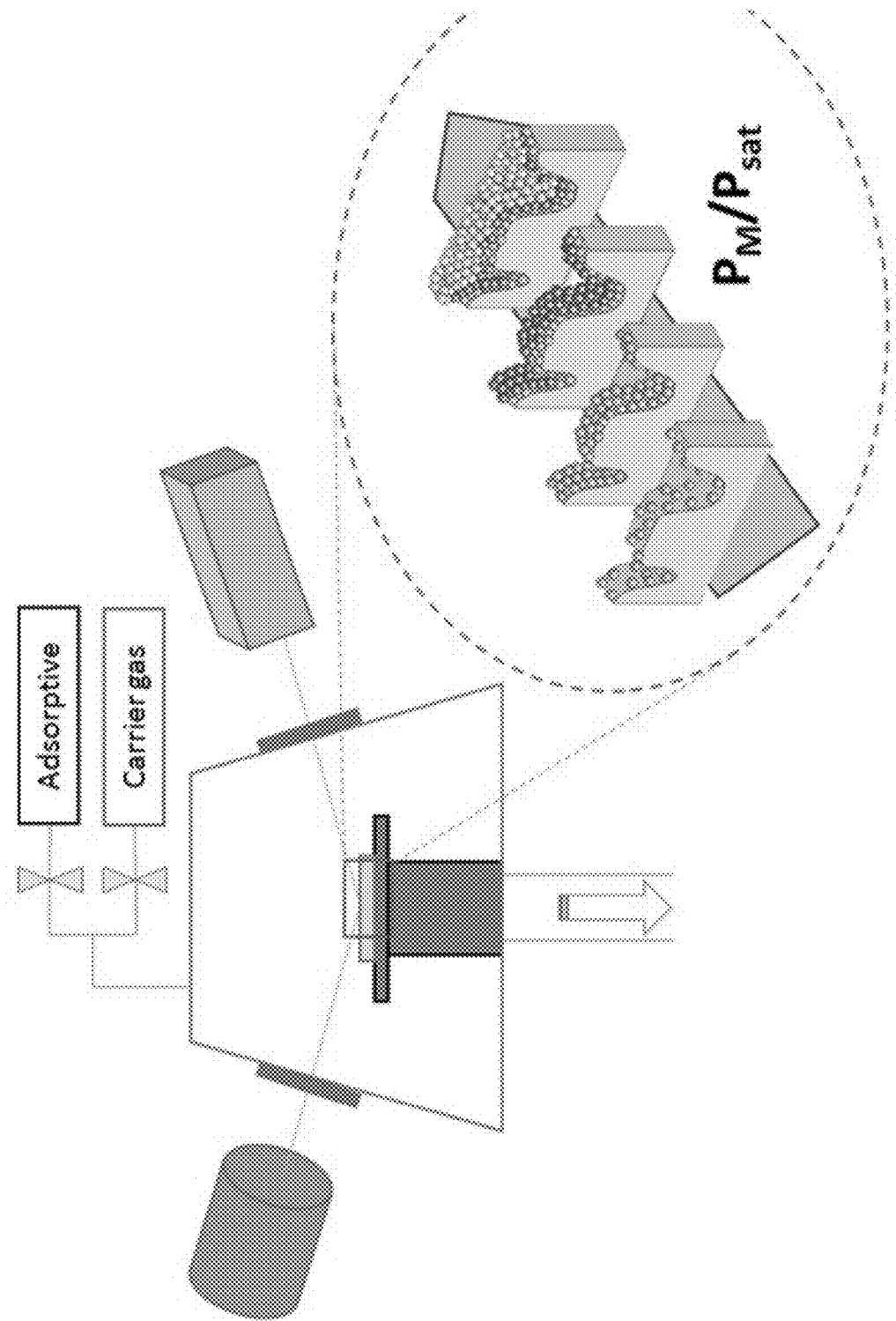
FIG. 12 depicts a schematic representation of an ellipsometry porosimetry measurement.
Figure 13:
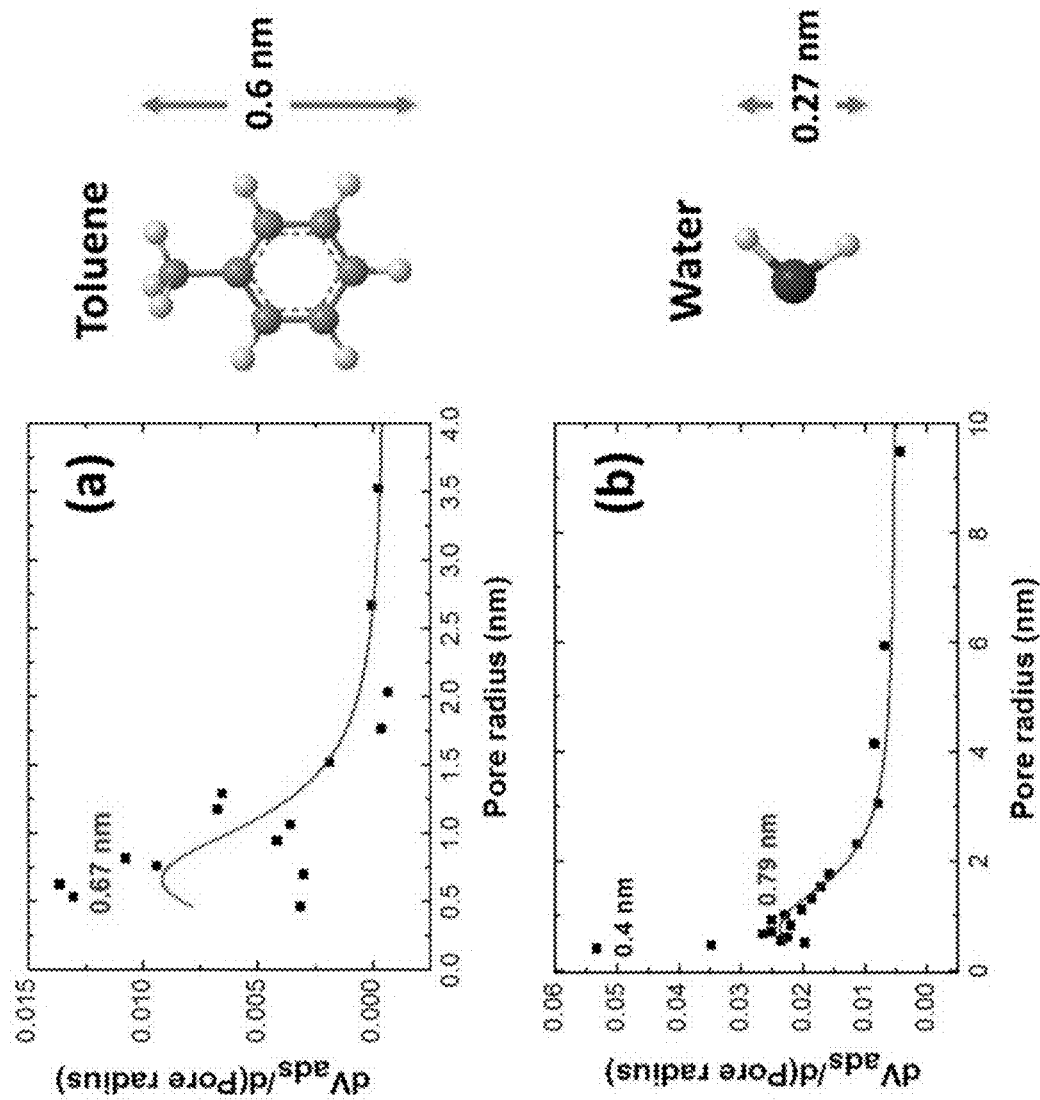
FIG. 13 depicts the results of ellipsometry porosimetry measurements for (a) toluene and (b) water.
Figure 14:
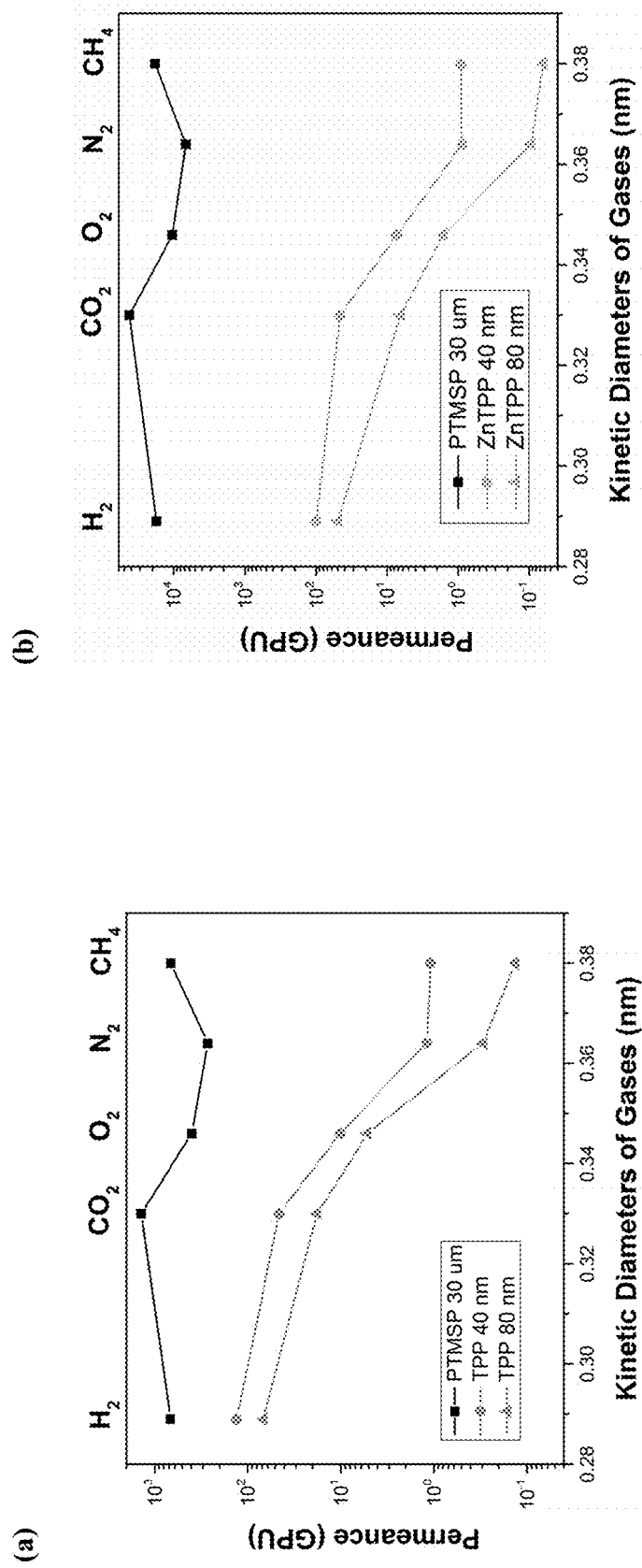
FIG. 14 depicts the permeation trends of MOCNs: (a) no metal ion; (b) ZnTPP; (c) MnTPP; and (d) CoTPP. The MOCNs in general showed significant barrier properties toward larger gas molecules, which in turn displayed as the molecular sieving effect. In addition, the defects inside the MOCNs can be mitigated by depositing more materials (at higher thickness).
Figure 14:
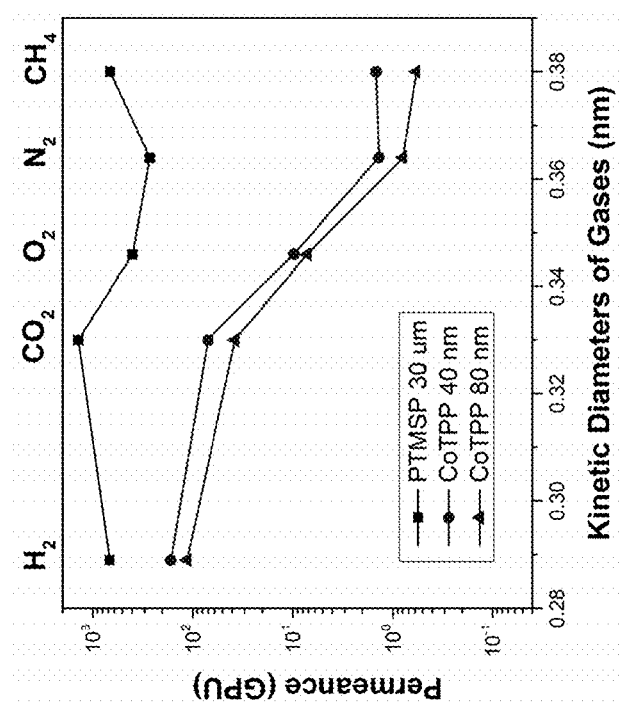
Figure 14:
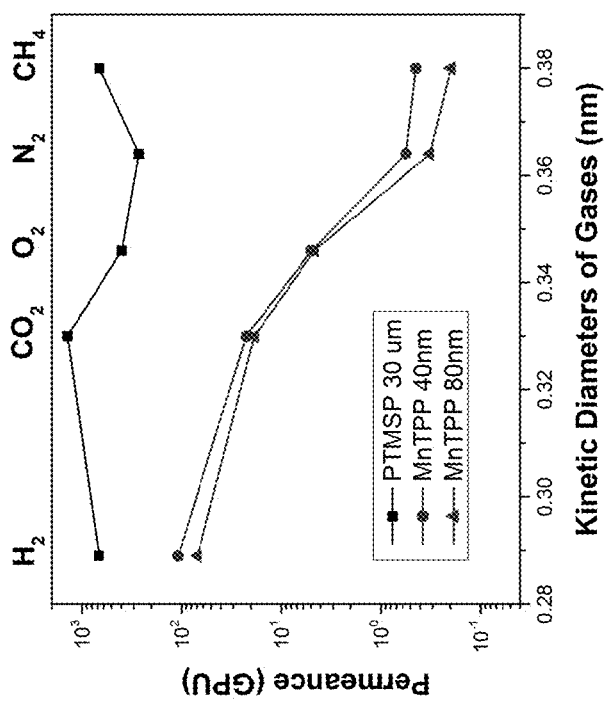
Figure 15:
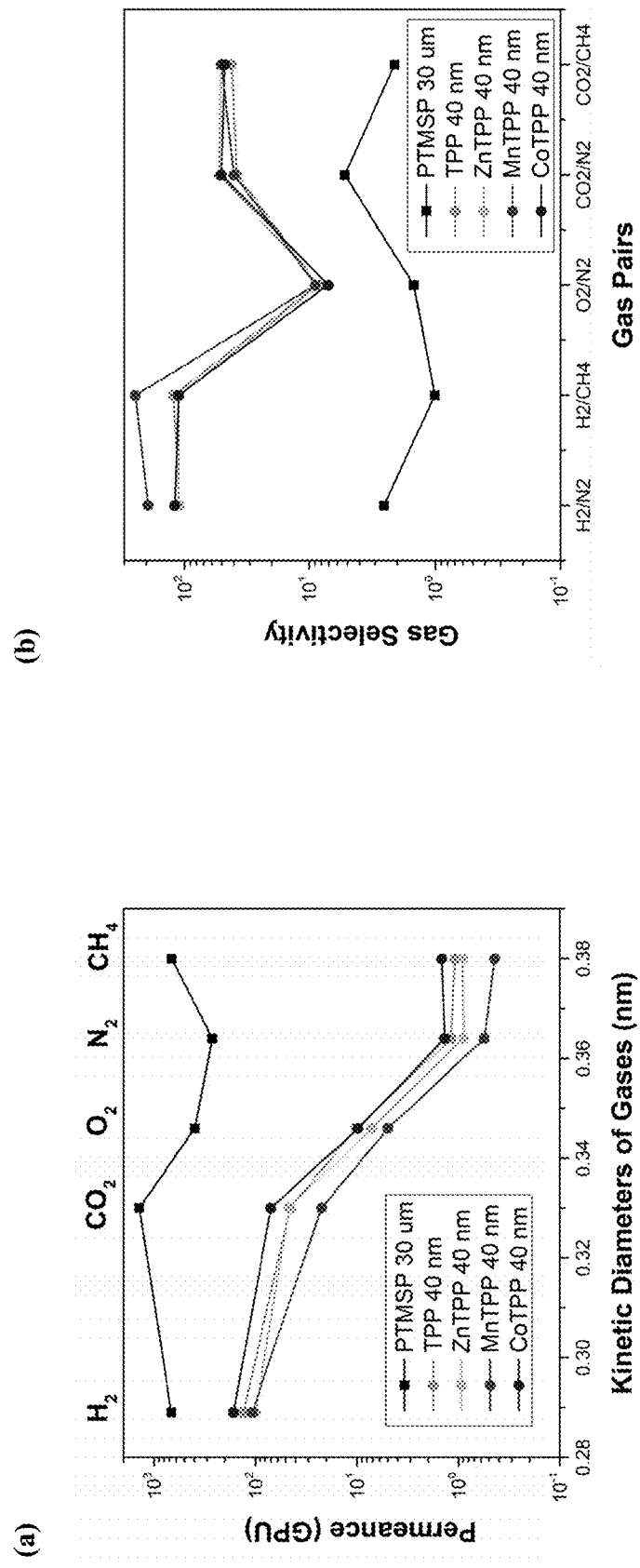
FIG. 15 depicts the (a) permeance and (b) selectivity trends for MOCN layers having 40 nm thickness.
Figure 16:
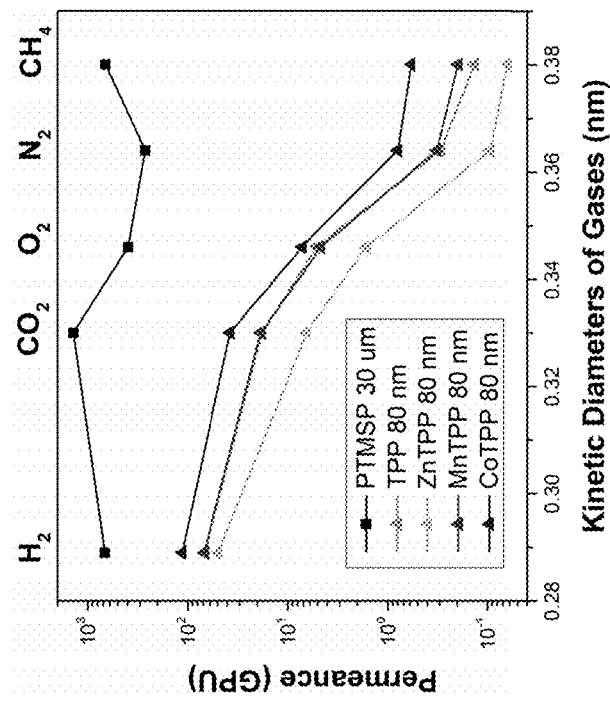
FIG. 16 depicts the (a) permeance and (b) selectivity trends for MOCN layers having 80 nm thickness.
Figure 16:
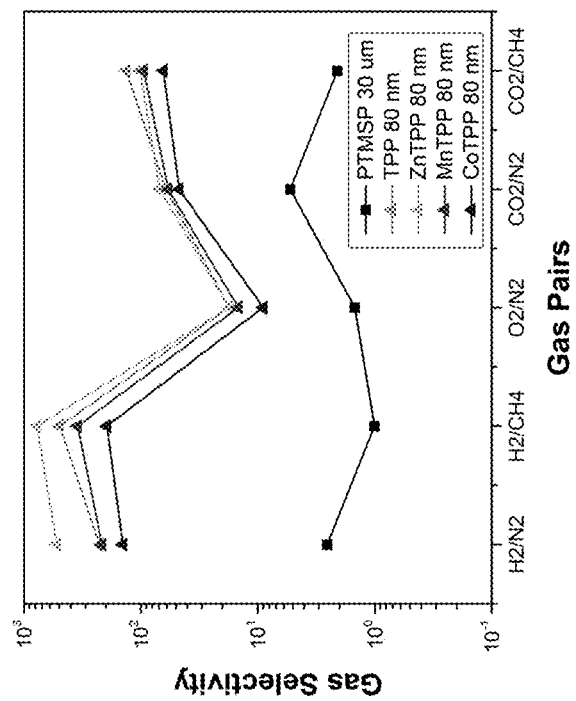

Single gas measurements were performed to evaluate the gas permeation properties of the as-deposited MOCN (e.g., P(ZnTPC) and P(DVB-co-ZnTPC)) thin films supported on membranes (e.g., poly(1-trimethylsilyl-1-propyne) (PT-MSP) cast membranes, ca. 30 mm). The gas selectivities were estimated from single gas permeation experiments, which were previously shown to provide gas selectivity values highly comparable to the ones obtained from mixed gas permeation measurements for P(ZnTPC)-coated PTMSP membranes. No activation nor modification of the as-prepared membranes was undertaken prior to the gas permeation experiments. The gas permeation measurements were performed on an in-house-constructed gas permeation cell in constant pressure mode (FIG. 11). The procedure for gas permeation measurements were similar as described in detail elsewhere (Wang, M., et al. *Chemistry of Materials* 25, 3785-3787, (2013); and Wang, M., et al. *Langmuir* 26, 12988-12993, (2010)). In brief, a PTMSP cast membrane coated with MOCN was placed in the gas permeation cell. A constant pressure single gas permeation method was used. All gas permeation data were taken after a steady permeation region was reached. Hydrogen (Airgas, 99.999%), carbon dioxide (Airgas, 99.995%), oxygen (Airgas, 99.994%), nitrogen (Airgas, 99.999%) and methane (Airgas, 99.99%) were then permeated through the composite membrane one at a time. The gauge pressure at the upstream was set at 5 bar and the flow rates were recorded with a bubble flow meter. The gas permeation properties were also measured for the pristine PTMSP cast membranes.

DFT Calculation

Density functional theoretical calculations were carried out using the ORCA program package (version 3.0.2) (F. Neese, *Wiley Interdiscip. Rev. Comput. Mol. Sci.* 2012, 2, 73). Geometry optimizations were performed using the BP functional in combination with Ahlrichs' split-valence double-$\xi$ basis set def2-SV(P) for all atoms which comprises polarization functions for all non-hydrogen atoms (A. Schafer, C. Huber, R. Ahlrichs, *J. Chem. Phys.* 1994, 100, 5829; A. Schafer, H. Horn, R. Ahlrichs, *J. Chem. Phys.* 1992, 97, 2571). For Zn an effective core potential was employed. All calculations make use of the resolution of identity (Split-RI-J) approach for the coulomb term in combination with the chain-of-spheres approximation for the exchange term (COSX) where Hartree-Fock exchange is required (F. Neese, F. Wennmohs, A. Hansen, U. Becker, *Chem. Phys.* 2009, 356, 98; R. Izsák, F. Neese, *J. Chem. Phys.* 2011, 135, 144105).

Discussion

In certain embodiments, the invention relates to films synthesized from zinc (II) meso-tetraphenylporphyrin (ZnTPP) (FIG. 1a). In certain embodiments, the invention relates to the polymerization of one exo-pyrrole double bond of the porphyrin rings. For example, a low power capacitively coupled radio-frequency (RF) plasma discharge (FIG. 1c) avoids decomposing the robust porphyrin while selectively cleaving the labile initiator (for example, tert-butyl peroxide (TBPO)) to form radicals. The free radical polymerization produces a highly visible color change. Whereas evaporated ZnTPP is reddish, the MOCN coating is green. UV-vis absorption spectroscopy (FIG. 1d) confirmed one of the exo-pyrrole double bonds of ZnTPP is reduced (FIG. 1a), resulting in the appearance of three new absorption bands, at 510 nm, 602 nm and 626 nm, assigned to the $Q_x(0,1)$, $Q_y(0,1)$ and $Q_y(0,0)$ transitions of zinc (II) meso-tetraphenylchlorin (ZnTPC) (FIG. 1b). The strong decrease of the band intensity located at 555 nm corresponds to the $Q_y(0,0)$ transition of ZnTPP. No evidence of further reduction of the other available exo-pyrrole double bonds of the porphyrinoid ring could be detected. Nevertheless, if the characteristic absorption band of zinc (II) meso-tetraphenyl-bacteriochlorin (ZnTPBC) above 700 nm is not observed, the formation of zinc (II) meso-tetraphenylisobacteriochlorin (ZnTPiBC) cannot be excluded due to a possible overlap of its absorption bands with the strong ones of ZnTPP and ZnTPC (FIG. 1d).

The intensity of the strong absorption band located around 430 nm originated from the Soret bands of ZnTPP and/or ZnTPC is almost identical for the evaporated ZnTPP and the MOCN coating. This indicates the selectivity of the iPECVD process, which retains the 18 $\pi e^-$ conjugation of the porphyrinoid while efficiently ensuring its polymerization and conversion of the ZnTPP to ZnTPC. Indeed, the rather soft RF plasma discharge cleaves TBPO to provide well-defined radicals, resulting in highly selective reactivity. In addition to the observations related to the absorption intensities, the position of Soret bands can also provide information on the environment of the porphyrinoids. Despite the fact that the ZnTPC Soret band absorbs at longer wavelengths (i.e., 420 nm in n-hexane solution) than the Soret band of ZnTPP (i.e., 414 nm in n-hexane solution), the position of the Soret band of the MOCN coating is observed at a significantly shorter wavelength (i.e., 427 nm) than the evaporated ZnTPP (i.e., 437 nm) (FIG. 1e). This 10 nm hypsochromic shift, which may also be slightly induced by the presence of new beta-substituents to the ZnTPC formed during the iPECVD process, is indicative of a reduced stacking of the porphyrinoids. Indeed, the strong bathochromic shift (i.e., $\Delta\lambda=23$ nm) between the Soret band of the evaporated ZnTPP (i.e., 437 nm) and the one of ZnTPP in n-hexane solution (i.e., 414 nm) is indicative of a J-type aggregation of the porphyrins, i.e., pi-pi stacking driven by non-covalent interactions. If polymerized into a ZnTPC covalent network, pi-pi stacking is likely to be prevented and a far less pronounced bathochromic shift is expected.

Figure 17:
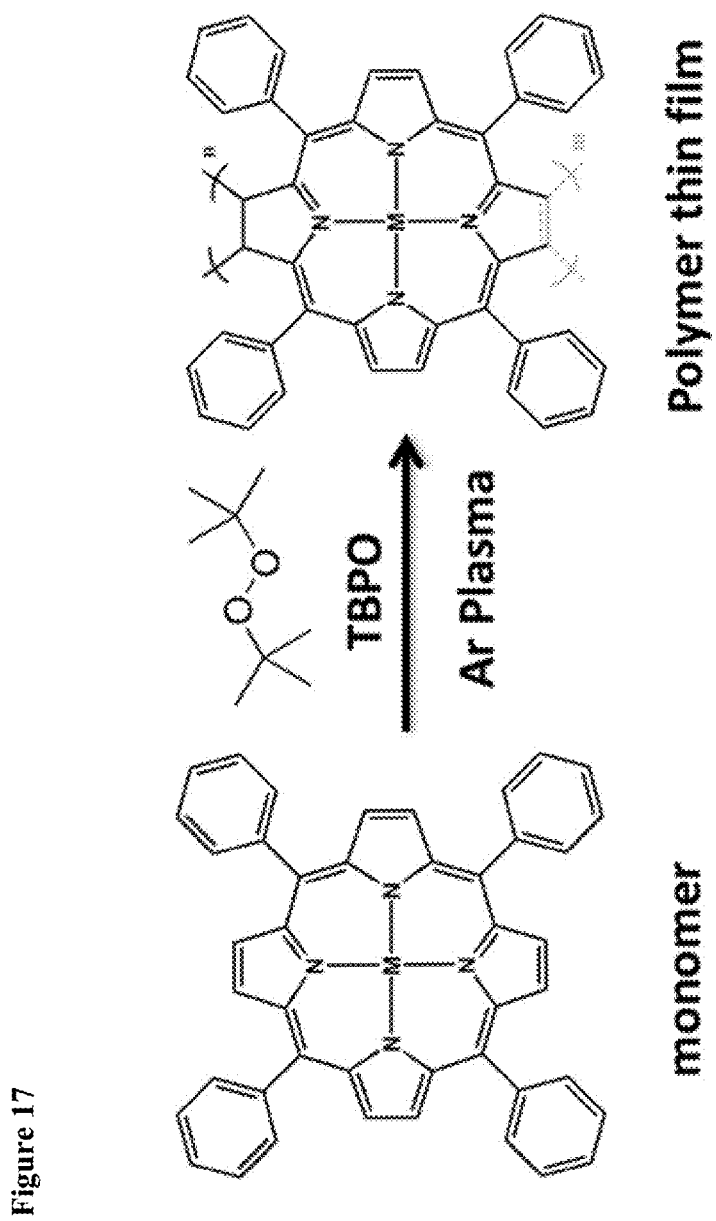
FIG. 17 depicts a schematic representation of the iPECVD polymerization process for MOCNs.
Figure 18:
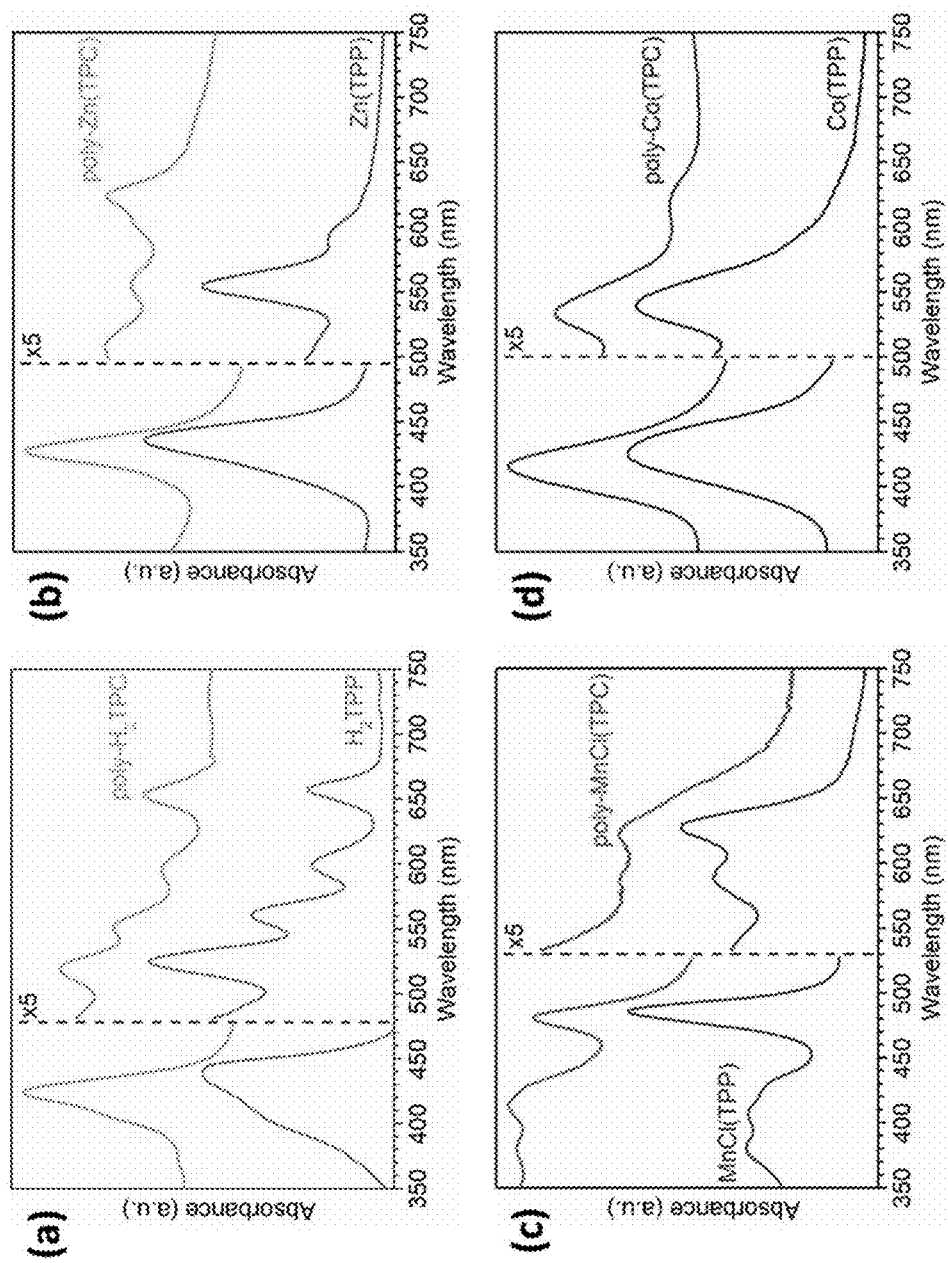
FIG. 18 depicts UV-vis absorption spectra for the four monomers (below) and MOCN coatings (above) of (a) $H_2$TPP; (b) Zn(TPP); (c) MnCl(TPP); and (d) Co(TPP).

For the three other porphyrins studied, the color change was less dramatic than the Zn(TPP) example exhibited in FIGS. 1d and 1g. Nevertheless, the intense color of the poly-H$_2$TPC, poly-MnCl(TPC) and poly-Co(TPC) was a good indication that polymerization rather than disruption of the porphyrinoid ring occurred during iPECVD process. Indeed, disruption of the porphyrinoid would lead to the discoloration of these materials. The coloration of the thin films stems from different absorption bands that are the function of the heterocyclic macrocycle structure and environment. FIG. 18 shows the UV-Vis spectra of four monomers and their corresponding chlorine-based thin films (Table 1) grown on glass microscope slides. The porphyrin macrocycle of the H$_2$TPP monomer gave rise to a Soret band and 4 Q bands (FIG. 18a, Table 2). The position of each these absorptions shifted to lower wavenumber in poly-H$_2$TPC (FIG. 3a, bottom), confirming that the monomer had undergone reaction. For the three metallated heterocyclic macrocycles, the Soret band displayed a significant shift to lower wavenumbers upon iPECVD polymerization (FIG. 18b-d and Table 2). Additionally, for the three metal-containing monomers, the reduction from porphyrin to chlorin, resulted in a loss of symmetry, resulting in the appearance of additional Q bands. While the monomers display a 4-fold rotational symmetric axis (FIG. 17), the polymerization of its four exo-pyrrole double bonds (FIG. 17) reduces this symmetry.

The observed hypsochromic shift of the Soret band was observed between the poly(chlorin) coatings and their evaporated parental porphyrin compounds is significant. The Soret band of individual chlorin units in solution occurred at longer wavelengths than the one of their respective porphyrins (Table 3) and was opposite of the observed shift of the Soret band to shorter wavelengths in iPECVD films. In certain embodiments, these films had new *beta*-substituents on their heterocyclic macrocycles, i.e. chlorins covalently bonded to chlorins through the *beta*-position that contribute in part to this hypsochromic shift. In certain embodiments, the shift of the Soret band to lower wavelength in the films arose from the stacking of the polymerized chlorine units in the solid state.

TABLE 2

Absorption band positions of the evaporated H$_2$TPP, MnCl(TPP), Co(TPP) and Zn(TPP) thin films and their iPECVD counterparts.

| | Soret | Q bands | | | | Other bands | |
|---|---|---|---|---|---|---|---|
| H$_2$TPP | 439 | 525 | 561 | 599 | 657 | n/a | |
| poly-H$_2$TPC | 424 | 519 | 550 | 595 | 654 | | |
| MnCl(TPP) | 486 | 589 | | 627 | | 380 | 407 |
| poly-MnCl(TPC) | 481 | 585 | | 623 | 654 | 380 | 412 |
| Co(TPP) | 425 | | 540 | | | n/a | |
| poly-Co(TPC) | 415 | 533 | | 617 | | | |
| Zn(TPP) | 436 | 554 | | 590 | | n/a | |
| poly-Zn(TPC) | 427 | 508 | 555 | 606 | 623 | | |

TABLE 3

Absorption band positions of the porphyrins investigated (i.e. H$_2$TPP, MnCl(TPP), Co(TPP) and Zn(TPP)) and their chlorin counterparts (i.e. H$_2$TPC, MnCl(TPC), Co(TPC) and Zn(TPC)) in various solvents.

| | Soret | Q bands | | | | Other bands | |
|---|---|---|---|---|---|---|---|
| H$_2$TPP in dichloromethane | 416 | 508 | 539 | 579 | 637 | | |
| H$_2$TPC in dichloromethane | 418 | 518 | 542 | 589 | 650 | | |
| MnCl(TPP) in benzene | 478 | 581 | | 621 | | 374 | 398 |
| MnCl(TPC) in benzene | 481 | 556 | | 625 | 653 | 380 | 430 |
| Co(TPP) in methanol-chloroform | 411 | | 528 | | | | |
| Co(TPC) in methanol-chloroform | 410 | 528 | | 615 | | | |
| Zn(TPP) in hexane | 414 | 544 | | 583 | | | |
| Zn(TPC) in hexane | 420 | 518 | 573 | 585 | 620 | | |

Analysis of the FTIR spectrum of the MOCN coating also confirms the formation of ZnTPC with notably the rising of the band at 1508 cm$^{-1}$ related to the two methine bridges surrounding the reduced pyrrole (FIG. 1e). A shift to lower wavenumber of the pyrrole C$_\beta$—H deformation band at 790 cm$^{-1}$ is also characteristic of chlorin formation. The band at 985 cm$^{-1}$, assigned to the Zn—N vibration in ZnTPC, confirms the retention of the central metal ion. The significant broadening of the FTIR absorption bands indicates that the formed layer is not composed of discrete ZnTPC molecules, but rather is a mixture of a plurality of ZnTPC arrangements.

XPS showed that the films described herein contain zinc, nitrogen, carbon, and oxygen in a proportion that depends on the deposition conditions (Table 4). The relative atomic concentrations, obtained by XPS, of both the evaporated ZnTPP and MOCN coating are found to be rather close to the theoretical one of ZnTPP and ZnTPC. An almost negligible decrease of the zinc element concentration was observed (i.e., from 2.0% to 1.8% and 1.6%), while the nitrogen element concentration decreased from 8% for the theoretical concentration of ZnTPP and ZnTPC to 6% for the evaporated ZnTPP and 5% for the MOCN coating. Oxygen, which is not a constituent of ZnTPP nor ZnTPC, was detected in both the evaporated ZnTPP (i.e., 1%) and MOCN coating (i.e., 3%). The higher oxygen content of the MOCN is consistent with tert-butoxy radicals initiating the polymerization of ZnTPP.

TABLE 4

Chemical composition of films as measured by XPS

| | | C (%) | Zn (%) | N (%) | O (%) |
|---|---|---|---|---|---|
| Theoretical | ZnTPP | 89.8 | 2.0 | 8.2 | 0 |
| Sample A1 | ZnTPP | 90.9 | 1.8 | 5.9 | 1.4 |
| Sample D2 | P(ZnTPC) | 90.1 | 1.6 | 4.9 | 3.4 |
| Sample D3 | P(DVB-co-ZnTPC) | 92.8 | 1.0 | 3.1 | 3.1 |
| iPECVD at 20 W | P(DVB) | 96.4 | 0 | 0 | 3.6 |
| Theoretical | P(DVB) | 100 | 0 | 0 | 0 |

Addition of a crosslinking monomer (i.e., DVB) resulted in a reduction of the zinc (ca. 1%) and nitrogen (ca. 3%) elements, exclusively originating from the ZnTPP monomer, in the iPECVD coating (Sample D3). The reduction from 2 to 1% and from 8 to 3% of the zinc and nitrogen elements, respectively, suggested that the ZnTPP/ZnTPC units roughly contribute to half of the coating composition. Therefore, a non-negligible proportion of crosslinking units constituted the P(DVB-co-ZnTPC) coating. Cross-linking is particularly appreciated for enhancing the mechanical and chemical stability of polymers. The latter was demonstrated through solvent-soaking experiments in methanol and chloroform during which the P(DVB-co-ZnTPC) coatings exhibited improved stability towards the solvent (Table 5).

The films were deposited on a glass substrate and soaked for 1 hour in various solvents (i.e., water, methanol, toluene, and chloroform). The intensity retention of the Soret band was measured after soaking as a percentage of the pre-soak intensity.

TABLE 5

Intensity retention of the Soret band of the thin films

| | | Solvents | | | |
|---|---|---|---|---|---|
| | | water | methanol | toluene | chloroform |
| Sample A1 | ZnTPP | 90% | 0% | 0% | 0% |
| Sample D2 | P(ZnTPC) | 100% | 0% | 95% | 0% |
| Sample D3 | P(DVB-co-ZnTPC) | 100% | 50% | 100% | 25% |

Figure 2:
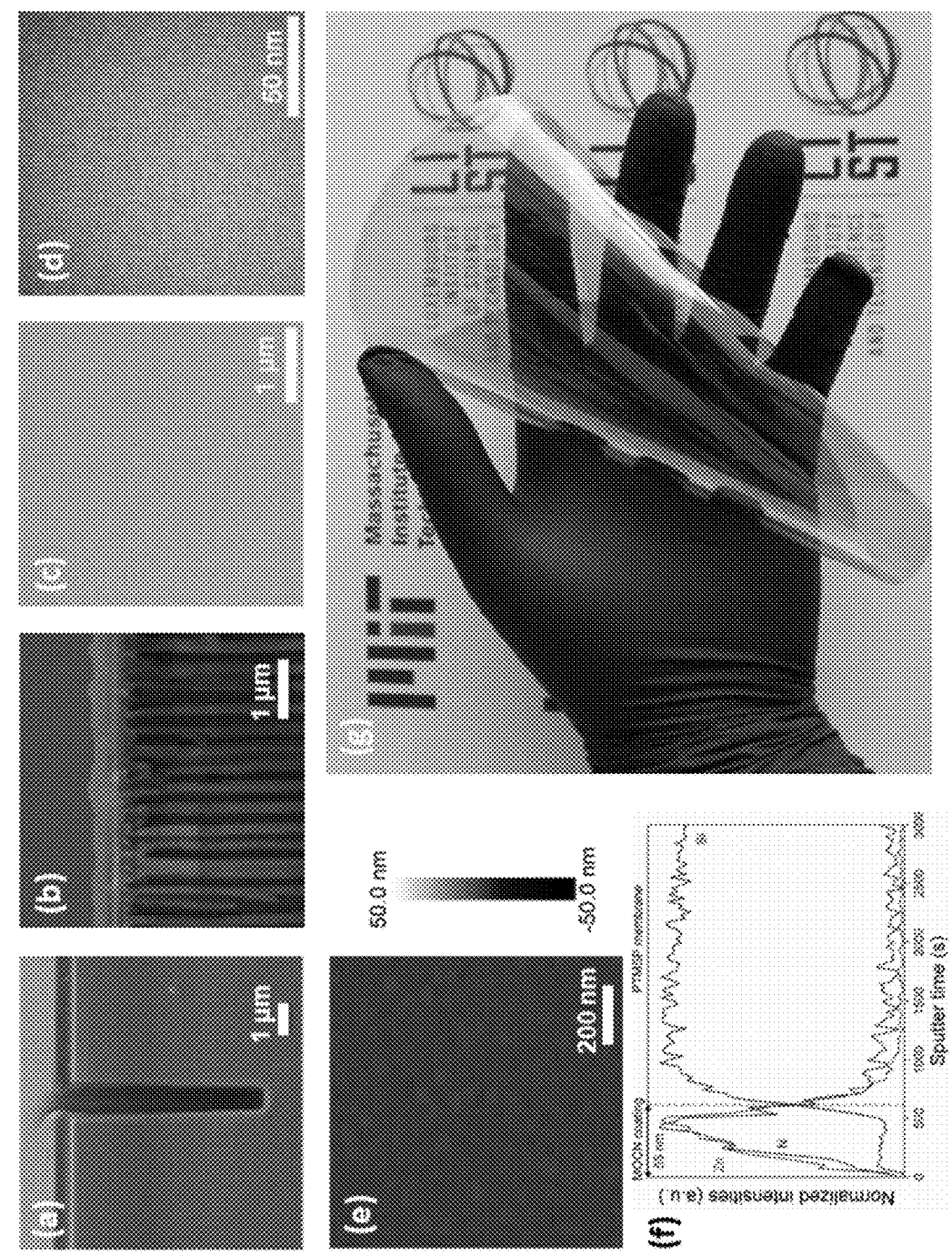
FIG. 2 depicts the characterization of a porous metal organic covalent network (MOCN) coating. (a) Cross-sectional scanning electron microscopy (SEM) image of a 200 nm thick MOCN film deposited on a 600 nm×5 mm silicon trenched wafer. (b) Cross-sectional SEM image of a 200 nm thick MOCN film deposited on porous anodic alumina membrane with 200 nm pores. (c) Low magnification TEM image of a MOCN coating directly deposited in-situ onto a carbon copper TEM grid. (d) High magnification TEM image of a MOCN coating collected onto a copper TEM grid. (e) Atomic force microscopy (AFM) image of MOCN coated silicon wafer with root mean square (RMS) roughness of 0.6 nm. (f) Zn, N and Si D-SIMS depth profiles for a 55 nm thick MOCN coating on a PTMSP membrane. (g) Optical image of flexed MOCN coated, large-area, PTMSP membrane.
Figure 20:
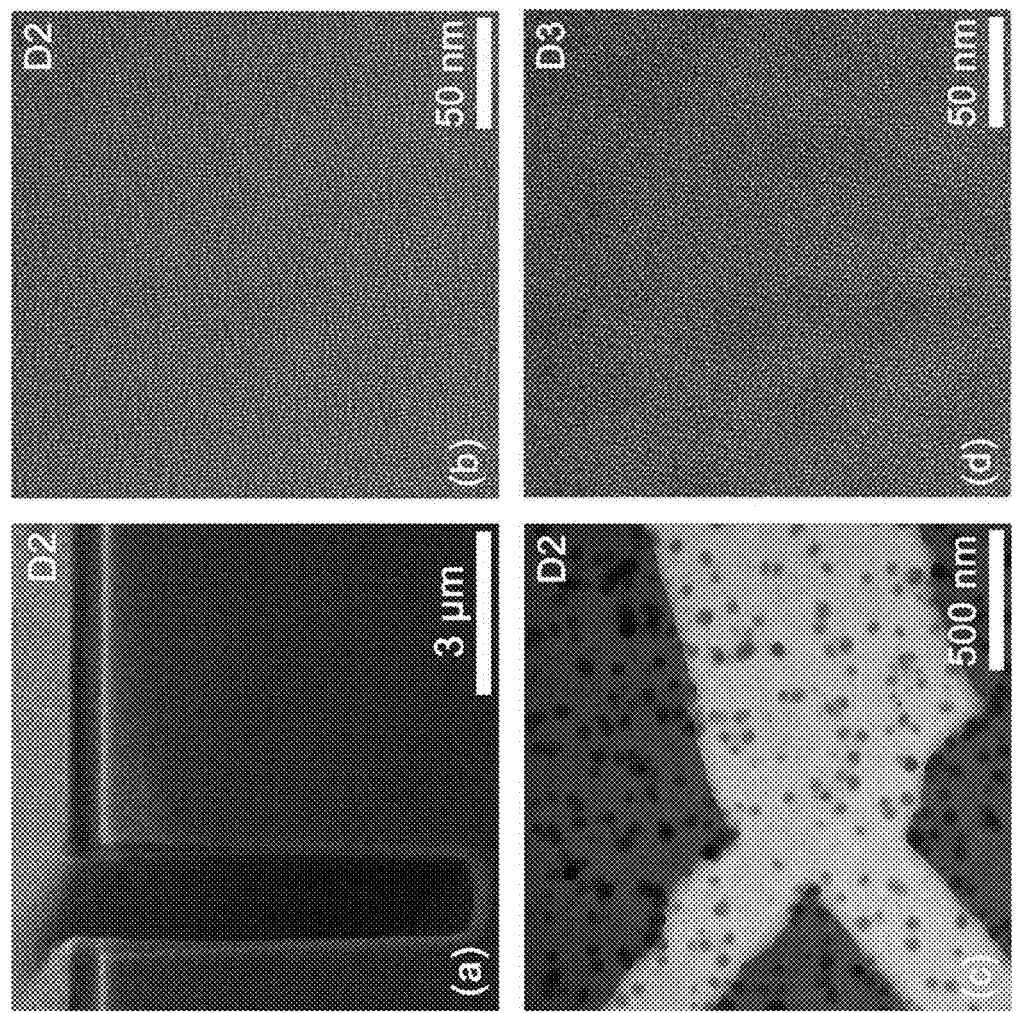
FIG. 20 depicts the characterization of a porous metal organic covalent network (MOCN) coating. (a) Cross-sectional scanning electron microscopy (SEM) image of a 500 nm thick MOCN coating deposited on a 2 μm×7 μm silicon trenched wafer. High magnification TEM image of MOCN coating collected onto a copper TEM grid (b) without and (d) with crosslinking monomer. (c) Low magnification TEM image of a freestanding MOCN coating with fragments of a second MOCN coating on top. Dark particles are assumed to originate from the peeling-off step in diluted HF.
Figure 21:
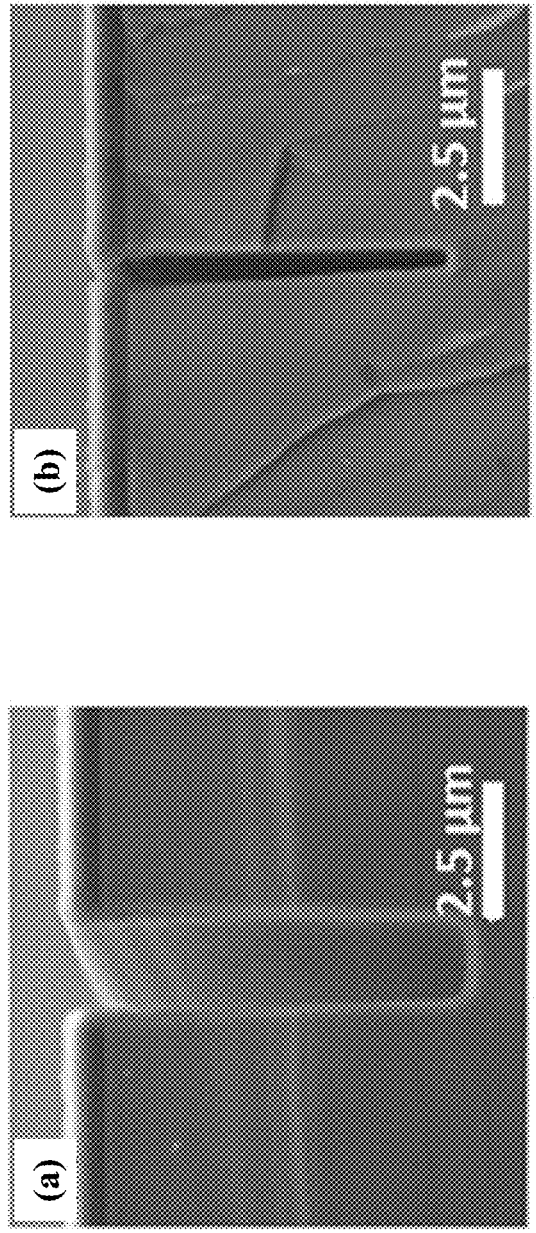
FIG. 21 depicts the cross-sectional SEM image of a silicon wafer substrate with trenches of defined widths (W) and aspect ratios (AR): (a) poly-Zn(TPC) (ca. 350 nm, W=2 μm, AR=3.5) and (b) poly-Zn(TPC) (ca. 350 nm, W=0.5 μm, AR=13).
Figure 22:
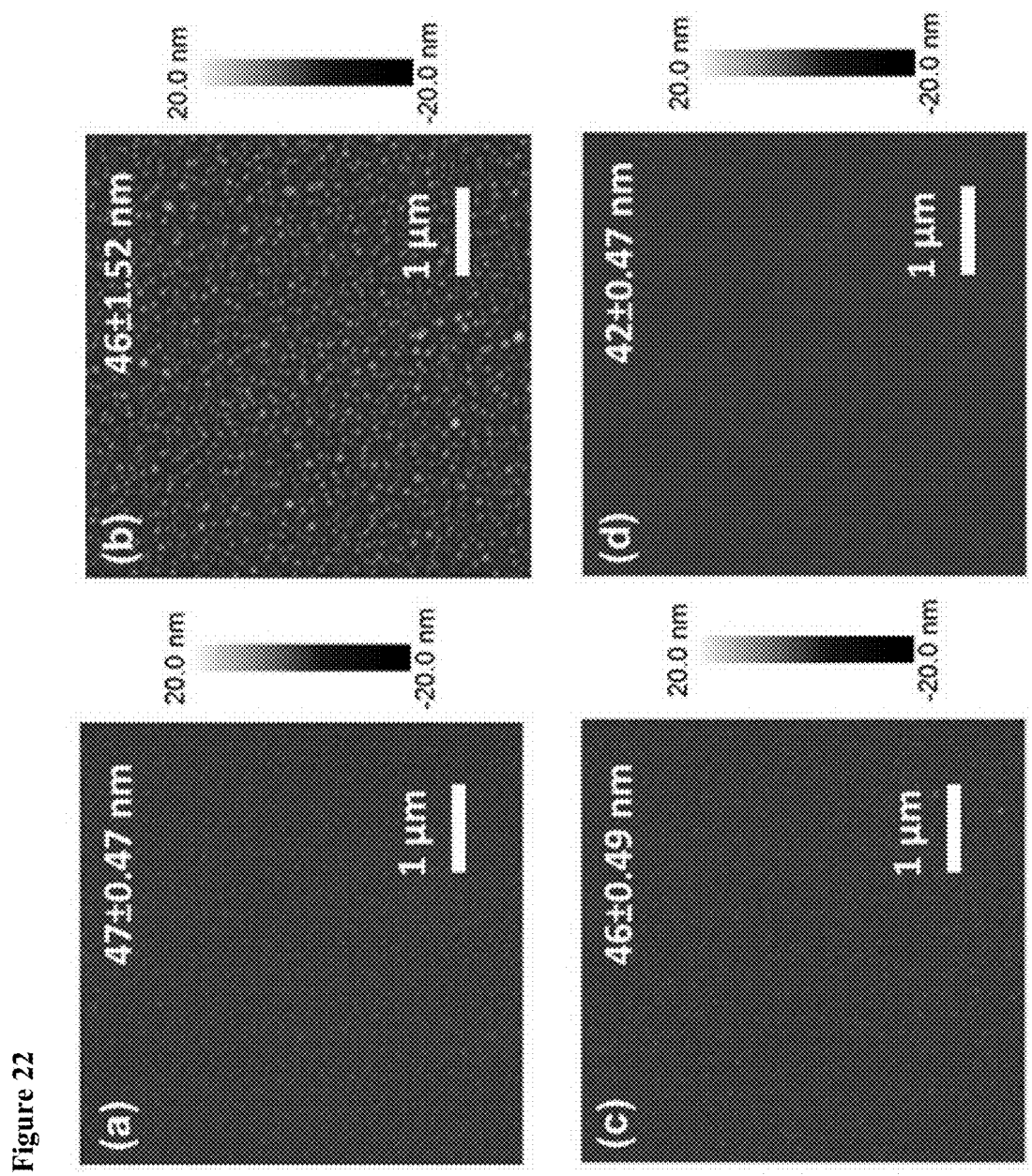
FIG. 22 depicts the morphology of a porous MOCN coatings. Top down AFM micrographs revealing an extremely high level of smoothness for: (a) poly-$H_2$TPC, ca. 47 nm, RMS 0.47 nm, (b) poly-Zn(TPC), ca. 46 nm, RMS 1.52 nm, (c) poly-MnCl(TPC), ca. 46 nm, RMS 0.49 nm, (d) poly-Co(TPC), ca. 42 nm, RMS 0.29 nm.
Figure 23:
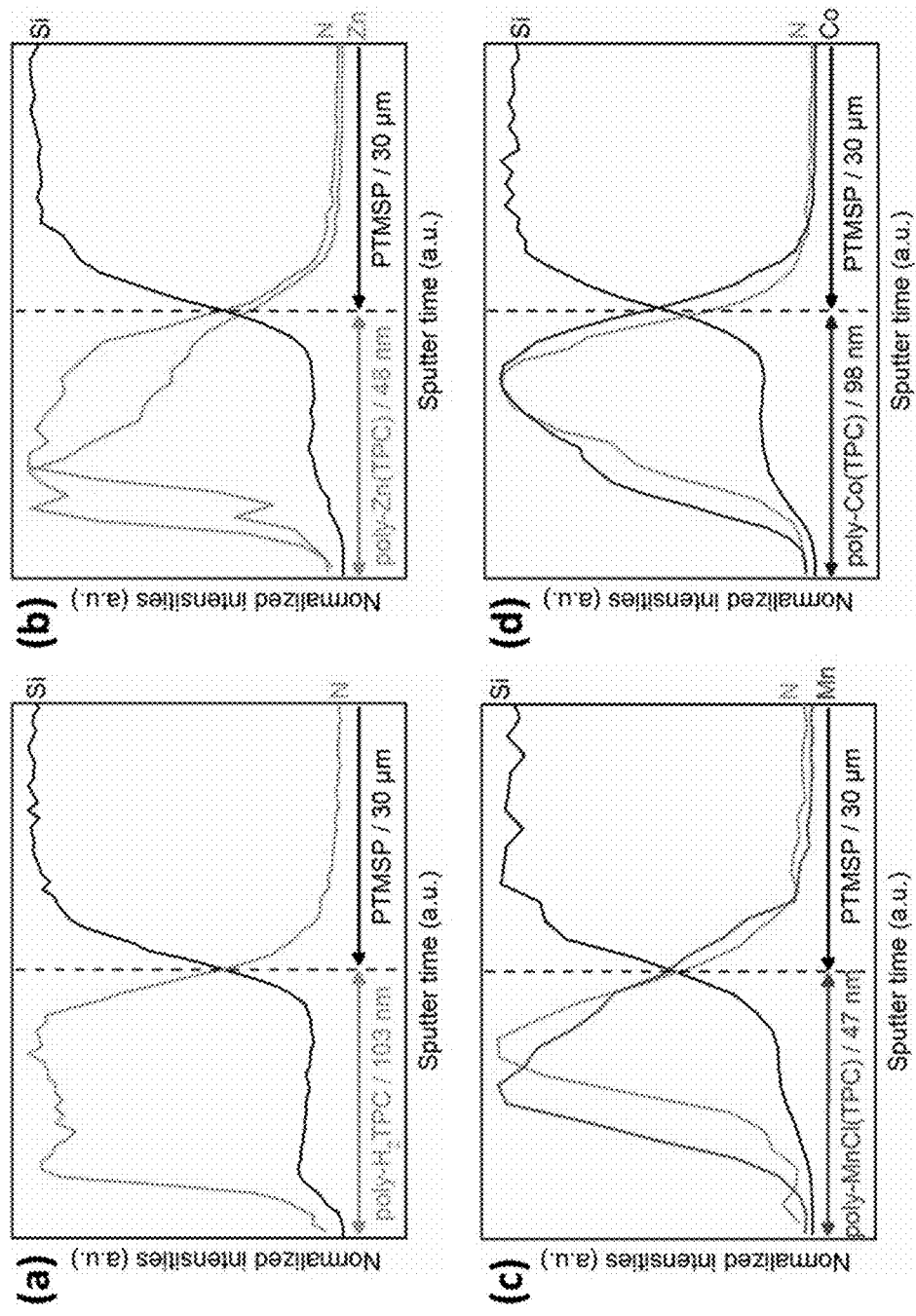
FIG. 23 depicts the D-SIMS depth profiles for MOCN coatings of (a) poly-$H_2$TPC, (b) poly-Zn(TPC), (c) poly-MnCl(TPC), and (d) poly-Co(TPC) on a PTMSP membrane.

To demonstrate the substrate independence, scalability and deposition behaviour of the methods, the MOCN coating was deposited onto various substrates. Cross-sectional scanning electron microscopy (SEM) observation of the MOCN coating deposited on trenches on a silicon wafer revealed the non-conformal behavior of the developed approach (FIGS. 2a and 20a). The directional nature of the ZnTPP evaporation process undertaken at relatively low vacuum pressure and the high sticking coefficient, due to low substrate temperature (i.e., room temperature, e.g., about 23° C.) in comparison to the ZnTPP crucible temperature (i.e., 275° C.), are responsible of this non-conformality of the MOCN coating. Non-conformality is especially suitable for the coating of membrane substrates since it promotes the formation of an even coating at their surface, while preventing the detrimental filling of the large porosities that would reduce the overall permeance of the system. Such behavior is illustrated on FIG. 2b where a 200 nm MOCN film is deposited onto porous anodic alumina membrane (with 200 nm pore size). No MOCN coating is observed inside the pores. In contrast with most of the low-pressure CVD of polymer thin films (e.g., iCVD and oCVD), the iPECVD of metalloporphyrin building units led to the formation of non-conformal coatings (FIGS. 2a and 20a). Such behavior arose from the combination of the physical vapor deposition (i.e. evaporation), the chemical vapor deposition and the free-radical polymerization mechanisms occurring during the iPECVD of metalloporphyrin building units. More particularly, the high sticking coefficient of the metalloporphyrin building units from the evaporation source (i.e. 275° C.) that adhere to the low-temperature substrate (ca. 20° C.) was mainly responsible for the non-conformality of the P(ZnTPC) and P(DVB-co-ZnTPC) coatings. The iPECVD process led to directional deposition (i.e., non-conformal coating) as shown in FIGS. 21a and 21b, which could be beneficial for coating porous structures, such as a base membrane, without infilling of the pores. Transmission electron microscopy (TEM) on the MOCN coatings highlights their dense and defect-free structure (FIGS. 2c, 2d, 20b, and 20d), no pinholes are observed on the two 50-nm thick MOCN coatings series, either directly deposited onto carbon copper TEM grids (FIGS. 2c, 20b, and 20d) or delaminated from their glass substrates and further collected on copper TEM grids (FIG. 2d). Such observation was confirmed by atomic force microscopy (AFM) measurements made on a 67-nm thick MOCN coating deposited on a silicon wafer (FIG. 2e). More importantly, no grain boundaries can be observed from the high magnification TEM of the MOCN coatings, which stand as dense and amorphous layers. FIG. 22a-d show the AFM images of four pinhole-free iPECVD thin films, poly-H$_2$TPC, poly-Zn(TPC), poly-MnCl(TPC) and poly-Co (TPC) deposited on to silicon wafers. These films range in thickness from 42 nm to 47 nm, below the <100 nm range desired for application as gas selective skin layer. The film roughnesses ranged from 0.29 nm to 1.52 nm. The low end of this range is comparable to that for typical silicon wafers, demonstrating the capability of iPECVD to produce ultrasmooth thin films. The ability to minimize roughness is crucial for fabricating pinhole-free layers, as pinholes arise by definition when a negative deviation in thickness equals the overall layer thickness.

The TEM observations of the MOCN coatings as free-standing films confirm their dense and amorphous structure (FIG. 20c), showing the MOCN freestanding films peeled off from glass substrates and collected on TEM copper grids, illustrates the thin film form of the deposited MOCN materials. The observed particles, not detected for the samples deposited on TEM carbon-coated copper grids, are assumed to originate from the peeling-off step in diluted HF solution.

Such structure is particularly suitable for membrane technology, which requires the fabrication of defect-free polymer coatings. In certain embodiments, the claimed methods contrast with previous methods based on a RF plasma discharge induced sublimation of porphyrins, which produced highly porous and heterogeneous architectures (Tonezzer, M., et al. *Journal of Materials Chemistry* 22, 5647-5655, (2012)). The potentiality to deposit the MOCN coatings on large and flexible substrate, e.g., PTMSP membrane, is illustrated on FIG. 2g. The cross-sectional structure of the composite membranes was studied by dynamic secondary mass spectroscopy (D-SIMS). D-SIMS depth profiling data of a 55-nm thick MOCN coating deposited on a PTMSP membrane suggest that there is no or very limited diffusion of the ZnTPC into the PTMSP substrate (FIG. 2f). The intensity gradients of the Zn and N elements, from ZnTPC coating, and of the Si element, from the PTMSP membrane, at the interface between the two materials is most likely due to the surface roughness of the PTMSP membrane. D-SIMS elemental mapping of the MOCN coating on a PTMSP membrane confirmed the full coverage of the substrate. In addition, the combination D-SIMS image of the $^{16}O^{64}Zn$ and $^{12}C^{14}N$ ions mapping suggest the MOCN coating.

Figure 24:
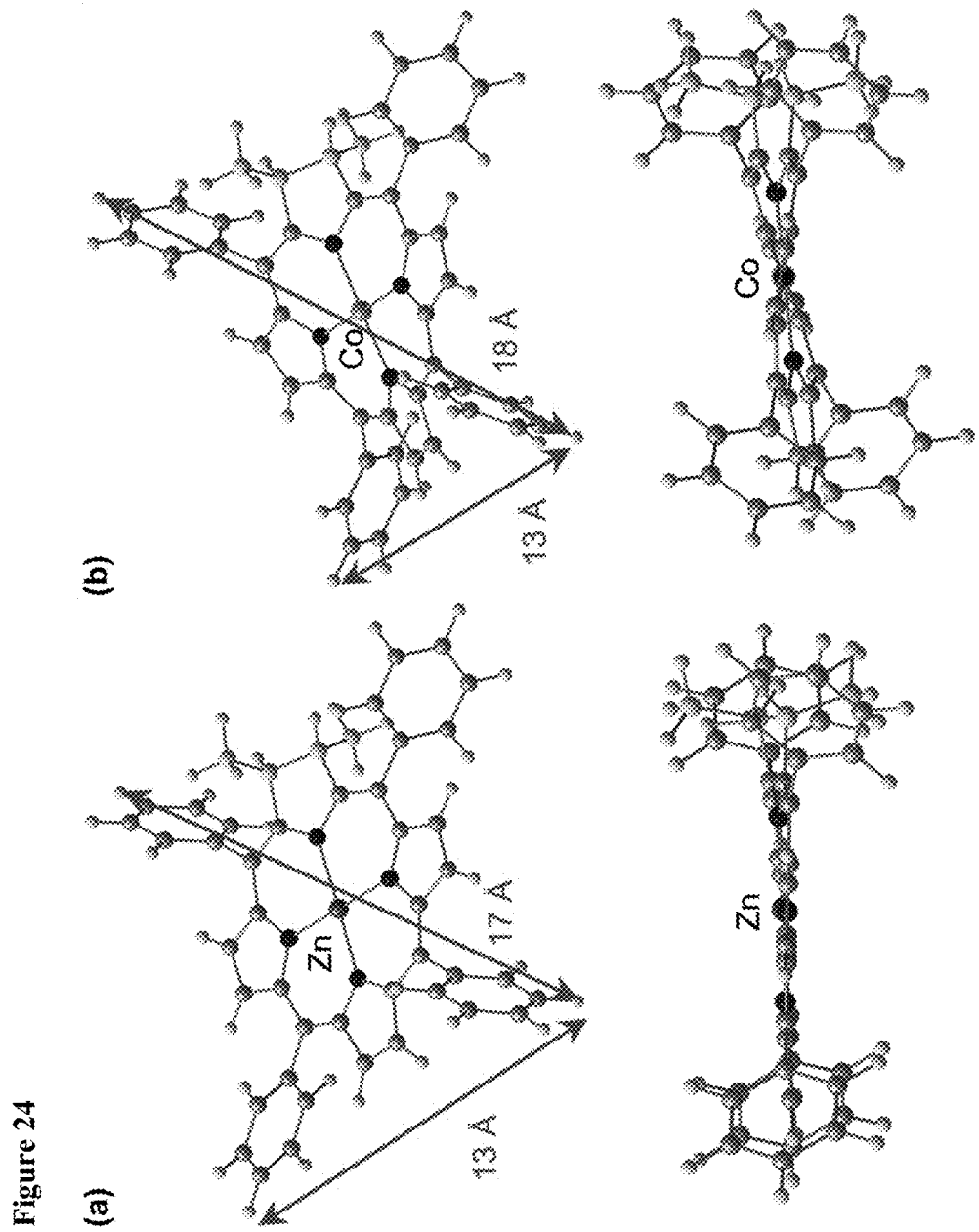
FIG. 24 depicts the molecular structure of a porphyrin monomer optimized by DFT calculation for (a) Zn(TPP) and (b) Co(TPP).

FIG. 23a-23d shows the resulting depth profile for the signature elements which differentiate the OCN or MOCN coatings from their PTMSP supports. Based on the etching time, and the normalized intensity of each element as appeared for each OCN or MOCN film, it was clear that very limited OCN or MOCN diffused into the PTMSP substrate. In each case, the layer thickness was less 100 nm or less, as desired for fabricating high-flux composite membranes. Additionally, the transition in composition at interface between the thin film and base membrane was relatively sharp and was comparable to the roughness of the underlying cast PTMSP substrate (about 5 nm). These observations were consistent with the porphyrin monomers, with or without a central metal ion having dimensions exceeding that of the diameter of the pores in the PTMSP. Thus, the monomers as well as their derived chlorins had limited, if any, penetration, into the bulk of PTMSP membrane. In detail, the monomers (e.g. ZnTPP and CoTPP) were estimated to be ~1.3 nm on a side, corresponding to diagonal dimension of ~1.7 nm, based on the DFT calculation (FIG. 24). The PTMSP has bimodal pore distribution, with local maximums at diameters of 0.4 and 0.8 nm, respectively. The minimal diffusion of the iPECVD layer into the PTMSP cast membrane was also evidence that minimal disruption of the porphyrin structure by the low power plasma was achieved. If small fragments were produced from the monomer in significant amounts, these would be expected to greatly enhance the diffusion of nitrogen and metal elements into bulk PTMSP membrane, which is contrary to what is observed in FIG. 23.

Figure 3:
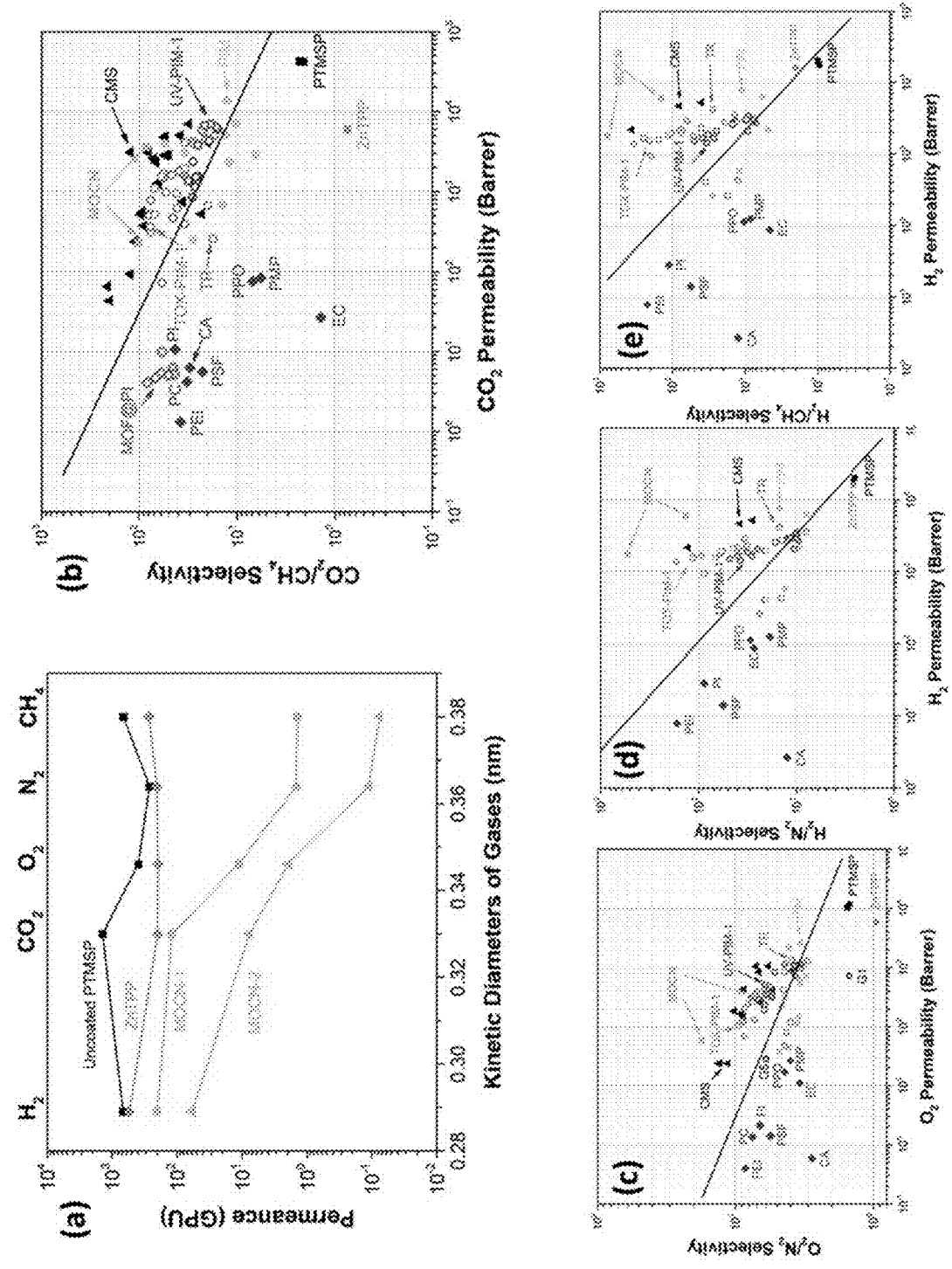
FIG. 3 depicts gas transport behavior through hyperthin ZnTPP-based metal organic covalent network (MOCN). (a) Gas permeances of membranes as a function of kinetic diameters of different gases. Black filled square: untreated PTMSP; Orange filled diamond: evaporated ZnTPP coated PTMSP membrane; filled circle: MOCN-1 coated PTMSP membrane (47 nm); filled triangle: MOCN-2 coated PTMSP membrane (67 nm). (b-e) Upper bound plots for industrially important gas pairs. (b) $CO_2/CH_4$, open diamonds are metal organic framework and polyimide composites (MOF@PI), (c) $O_2/N_2$, (d) $H_2/N_2$ and (e) $H_2/CH_4$. Black lines are the 2008 upper bounds. Other reference data points including: commercial polymers (dark grey diamonds), carbon molecular sieves (CMS, black triangles), polymers of intrinsic microporosity (PIM, light grey circle), thermally rearranged polymers (TR, open circle), thermally oxidized PIM-1 (TOX-PIM-1, grey open circle) and UV treated PIM-1 (UV-PIM-1, open circle).
Figure 25:
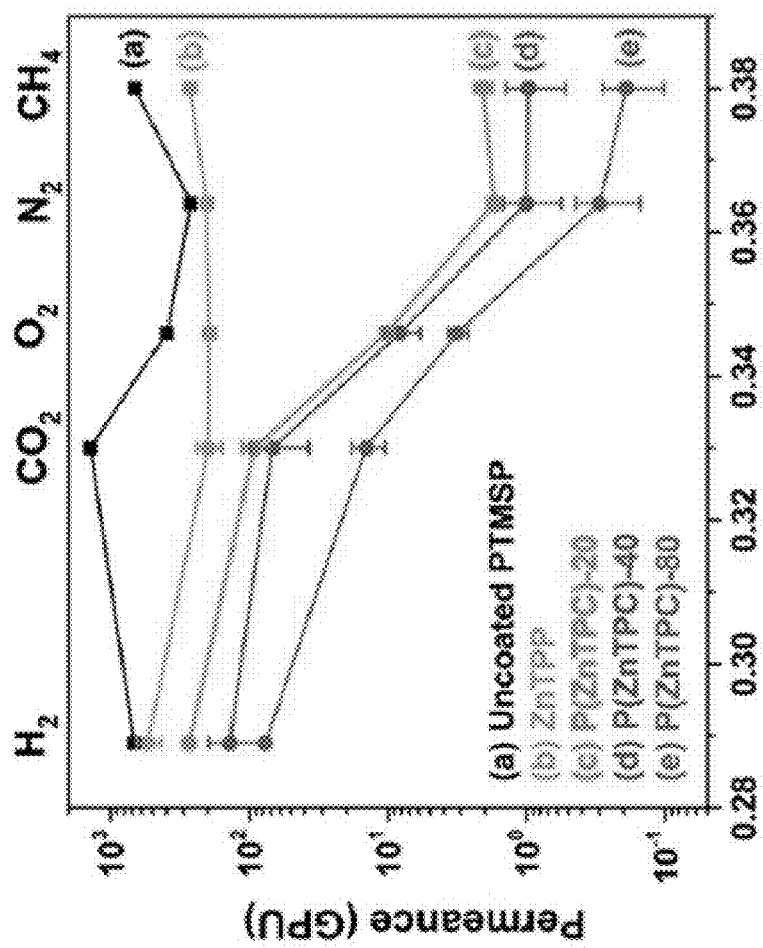
FIG. 25 depicts the permeances for uncoated and ZnTPP coated (top two lines) and for MOCN layers having various thicknesses on membranes.
Figure 26:
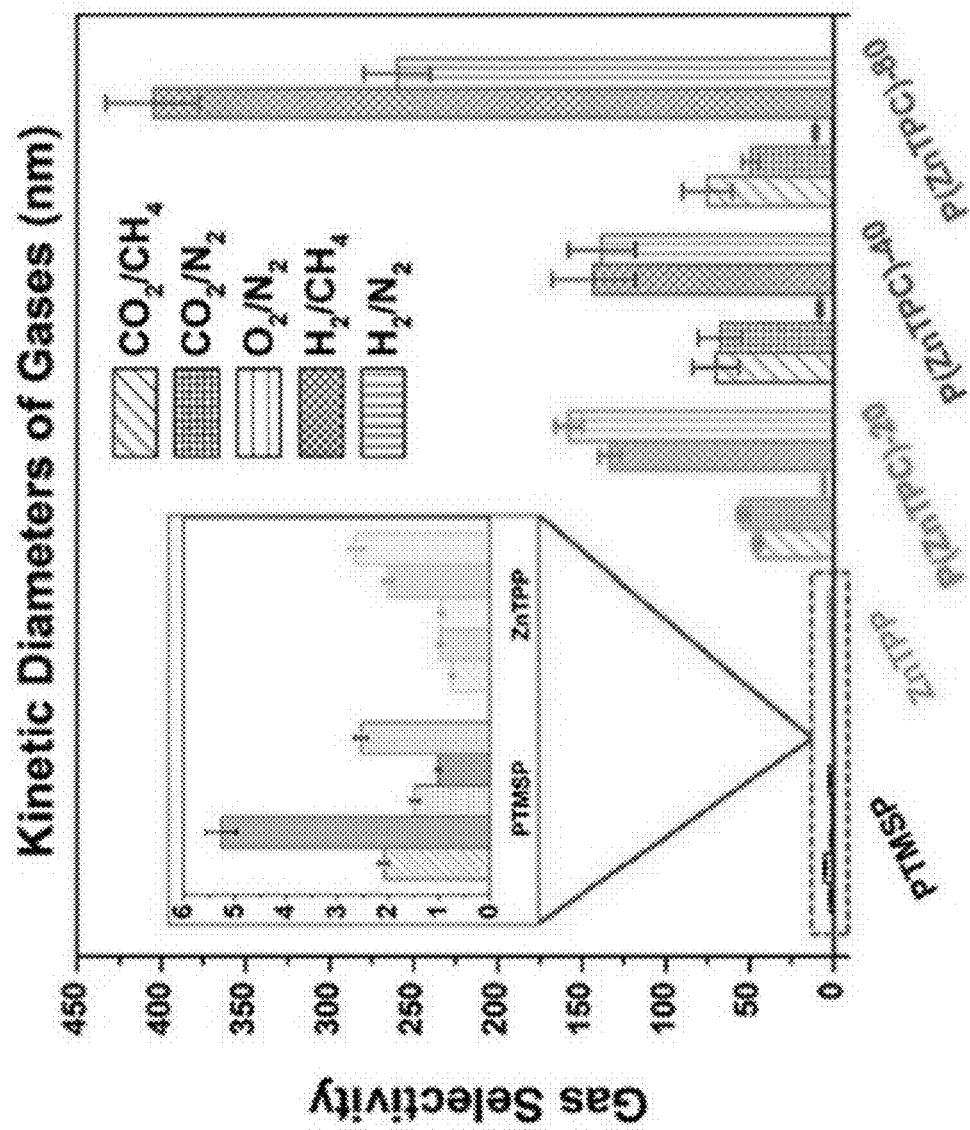
FIG. 26 depicts the gas selectivity of uncoated, ZnTPP-coated, and MOCN-coated membranes.

In certain embodiments, the invention relates to a method of separating a first gas from a second gas in a mixture of first and second gases. For example, MOCN coatings on flexible PTMSP membranes were investigated for their gas separation properties. PTMSP was chosen because it is one of the most permeable and rigid polymers. As shown in FIG. 3$a$, the gas permeance of MOCN films decreased as the thickness of the MOCN layer increased, implying that the potential defects can be mitigated by depositing thicker MOCN films. In contrast, the evaporated ZnTPP layer (i.e., non-polymerized) showed rather small reduction in gas permeances when compared with the original PTMSP (FIG. 3$a$), clearly indicating the existence of major defects generated during evaporation. In addition, the gas permeance of uncoated PTMSP follows the sequence of $CO_2>H_2>CH_4>O_2>N_2$, which can be ascribed to the combined effects of diffusion and sorption (e.g., $CO_2$ and $CH_4$ are more condensable). After depositing MOCN films, a more remarkable molecular sieving effect was observed; the gas permeances of larger gas molecules ($N_2$ and $CH_4$) were significantly depressed, while smaller gas molecules maintained relatively high permeances. In contrast, no specific trend was observed for both untreated PTMSP and evaporated ZnTPP-coated PTMSP membranes, indicated the combined effects of diffusion and sorption (FIG. 25). Such behaviour induces outstanding gas separation performances for gas pairs of $CO_2/N_2$, $CO_2/CH_4$, $O_2/N_2$, $H_2/N_2$ and $H_2/CH_4$. FIG. 1$f$ and FIG. 3$b$-$e$ display the position of MOCN films on the 2008 upper bound plots for the aforementioned five gas pairs. As is apparent, the overall gas separation performances of supported MOCN films surpassed the current upper bounds of the different gas pairs investigated. In addition, similar to the $CO_2/N_2$ separation performance of MOCN films (FIG. 10, the gas separation performances of MOCN films for the rest of the gas pairs were better than any of the commercial polymers and comparable to those reported for carbon molecular sieves (CMS), thermally rearranged (TR) polymers, pristine and modified PIMs. It is also interesting to observe that the supported MOCN films as well as surface modified PIM-1 demonstrated much better $CO_2/CH_4$ separation performance than the mix-matrix composite of MOF nanosheets and PIM polymer (FIG. 3$b$), indicating the advantage of constructing supported films for gas separation. The estimated gas selectivities of MOCN-coated PTMSP are in turn much higher than those of untreated PTMSP and evaporated ZnTPP-coated PTMSP membranes, for all the gas pairs investigated (e.g. $CO_2/N_2$, $CO_2/CH_4$, $O_2/N_2$, $H_2/N_2$ and $H_2/CH_4$) (FIG. 26). The fact that evaporated ZnTPP coatings displayed minimal gas permeance reduction and negligible gas selectivities clearly indicate the existence of major defects within the coating. Increasing the thickness of the MOCN coating generally resulted in a decrease in the gas permeances and an increase in the gas selectivities as shown in FIG. 26.

Figure 27:
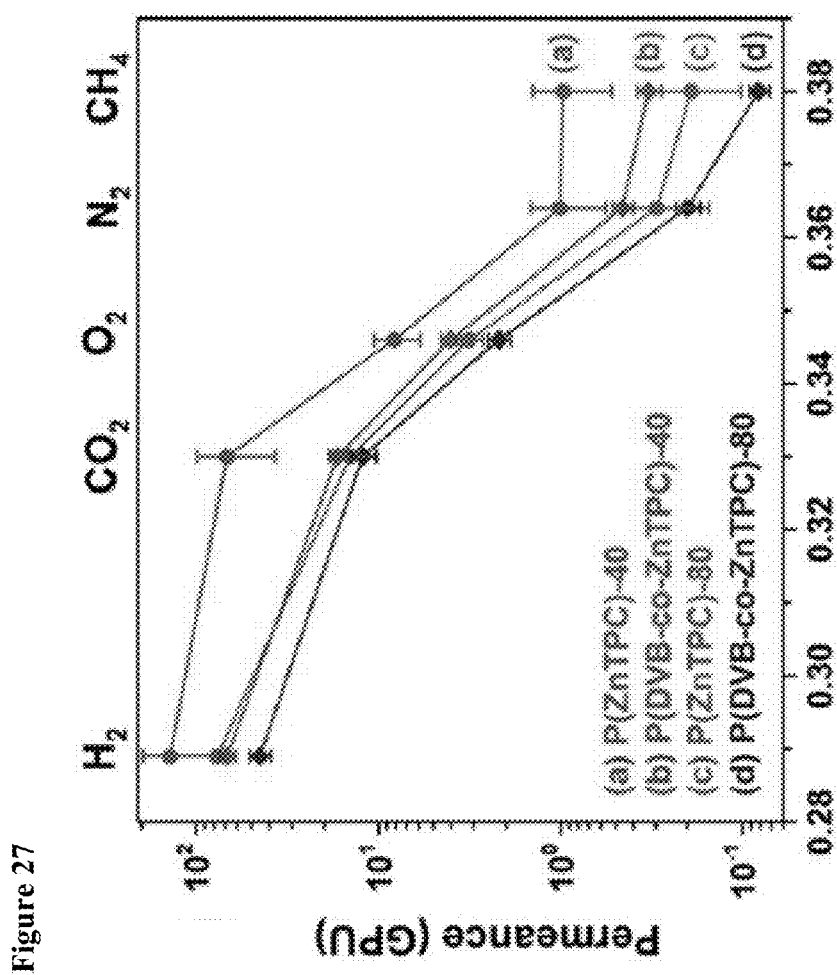
FIG. 27 depicts the permeances for MOCN layers with and without a comonomer having two different thicknesses on membranes.
Figure 28:
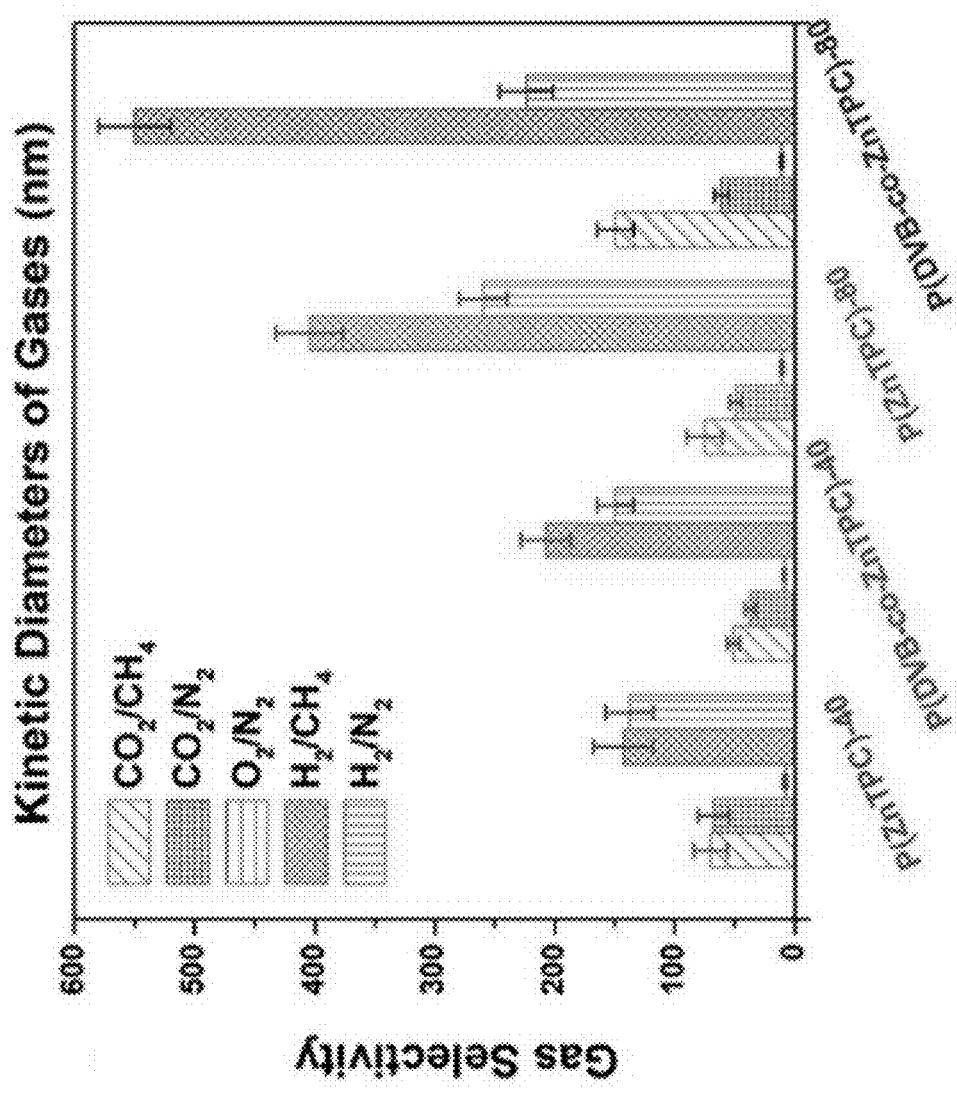
FIG. 28 depicts the gas selectivity of MOCN layers with and without a comonomer having two different thicknesses on membranes.

When polymerized in the presence of a crosslinking monomer (i.e. DVB), the porphyrin-based membranes exhibited lower permeances (FIG. 27 and Table 6) with comparable or even higher gas selectivities (FIG. 28 and Table 7), based on the comparison of a MOCN (e.g., P(ZnTPC)) and a crosslinked MOCN (e.g., P(DVB-co-ZnTPC)) thin films of the same thickness. For instance, when comparing the 80 nm P(DVB-co-ZnTPC) coating with the 80 nm P(ZnTPC) coating, the permeance of the crosslinked film is 41.5% less for $H_2$, 14.7% less for $CO_2$, 30.6% less for $O_2$, 32.3% less for $N_2$ and 57.2% less for $CH_4$. Such reduction in the gas permeance is accompanied by an improvement in the gas selectivities. Notably, the gas selectivity of the crosslinked 80 nm P(DVB-co-ZnTPC) thin film is 100% higher for $CO_2/CH_4$, 24.5% higher for $CO_2/N_2$ and 36.8% higher for $H_2/CH_4$, than that of the 80 nm P(ZnTPC) film (Table 6). The change in permeance and gas selectivity after crosslinking is a reflection of the tighter packing in the P(DVB-co-ZnTPC) copolymer coatings. The fact that crosslinking the chlorin structures only caused a minimal gas permeance loss while improving the gas selectivities and solvent stabilities (Table 6) could make the crosslinked P(DVB-co-ZnTPC) film a potential candidate for carbon capture, natural gas sweetening and hydrogen separation.

In Table 6, the films are coated onto a PTMSP membrane with different thicknesses (20, 40, and 80 nm). Permeances in Tables 6 and 8 were measured at ambient temperature with upstream pressure set at 73.5 psig. The permeances were calculated by dividing the flow rate by the pressure gradient (73.5 psi) and by the area of the membrane (9.36 cm$^2$). Average values were obtained from 5 to 10 independent measurements on the same sample; the error in each case was ±5%. Each membrane listed was prepared, independently. 1 GPU=$10^{-6}$ cm$^3$ (STP)cm$^{-2}$.s$^{-1}$.cmHg$^{-1}$.

TABLE 6

Observed Gas Barrier Properties from Single Gas Permeation Measurements

|  |  | $H_2$ (GPU) | $CO_2$ (GPU) | $O_2$ (GPU) | $N_2$ (GPU) | $CH_4$ (GPU) |
|---|---|---|---|---|---|---|
| — | PTMSP | 674 | 1395 | 394 | 266 | 666 |
| Sample A1 | ZnTPP | 540 | 198 | 195 | 205 | 268 |
| Sample D2 | P(ZnTPC)-20 | 272 | 92.5 | 10.2 | 1.72 | 2.06 |
| Sample D2 | P(ZnTPC)-40 | 139 | 68.1 | 8.23 | 1.01 | 0.972 |
| Sample D2 | P(ZnTPC)-80 | 76.9 | 14.3 | 3.17 | 0.297 | 0.191 |
| Sample D3 | P(DVB-co-ZnTPC)-40 | 68.3 | 16.8 | 4.04 | 0.459 | 0.329 |
| Sample D3 | P(DVB-co-ZnTPC)-80 | 45.0 | 12.2 | 2.20 | 0.201 | 0.0818 |

In Table 7, gas selectivity is calculated from the single gas permeation measurements of Table 6. The films are coated onto a PTMSP membrane with different thicknesses (20, 40, and 80 nm).

TABLE 7

Gas Selectivity based on Single Gas Permeation Measurements

|  |  | $CO_2/$ $CH_4$ | $CO_2/$ $N_2$ | $O_2/$ $N_2$ | $H_2/$ $CH_4$ | $H_2/$ $N_2$ |
|---|---|---|---|---|---|---|
| — | PTMSP | 2.1 | 5.3 | 1.5 | 1.0 | 2.5 |
| Sample A1 | ZnTPP | 0.74 | 0.97 | 0.95 | 2.0 | 2.6 |
| Sample D2 | P(ZnTPC)-20 | 45 | 54 | 6.0 | 133 | 160 |
| Sample D2 | P(ZnTPC)-40 | 70 | 67 | 8.1 | 143 | 138 |
| Sample D2 | P(ZnTPC)-80 | 75 | 49 | 11 | 402 | 260 |
| Sample D3 | P(DVB-co-ZnTPC)-40 | 51 | 37 | 8.8 | 210 | 150 |
| Sample D3 | P(DVB-co-ZnTPC)-80 | 150 | 61 | 11 | 550 | 224 |

Figure 29:
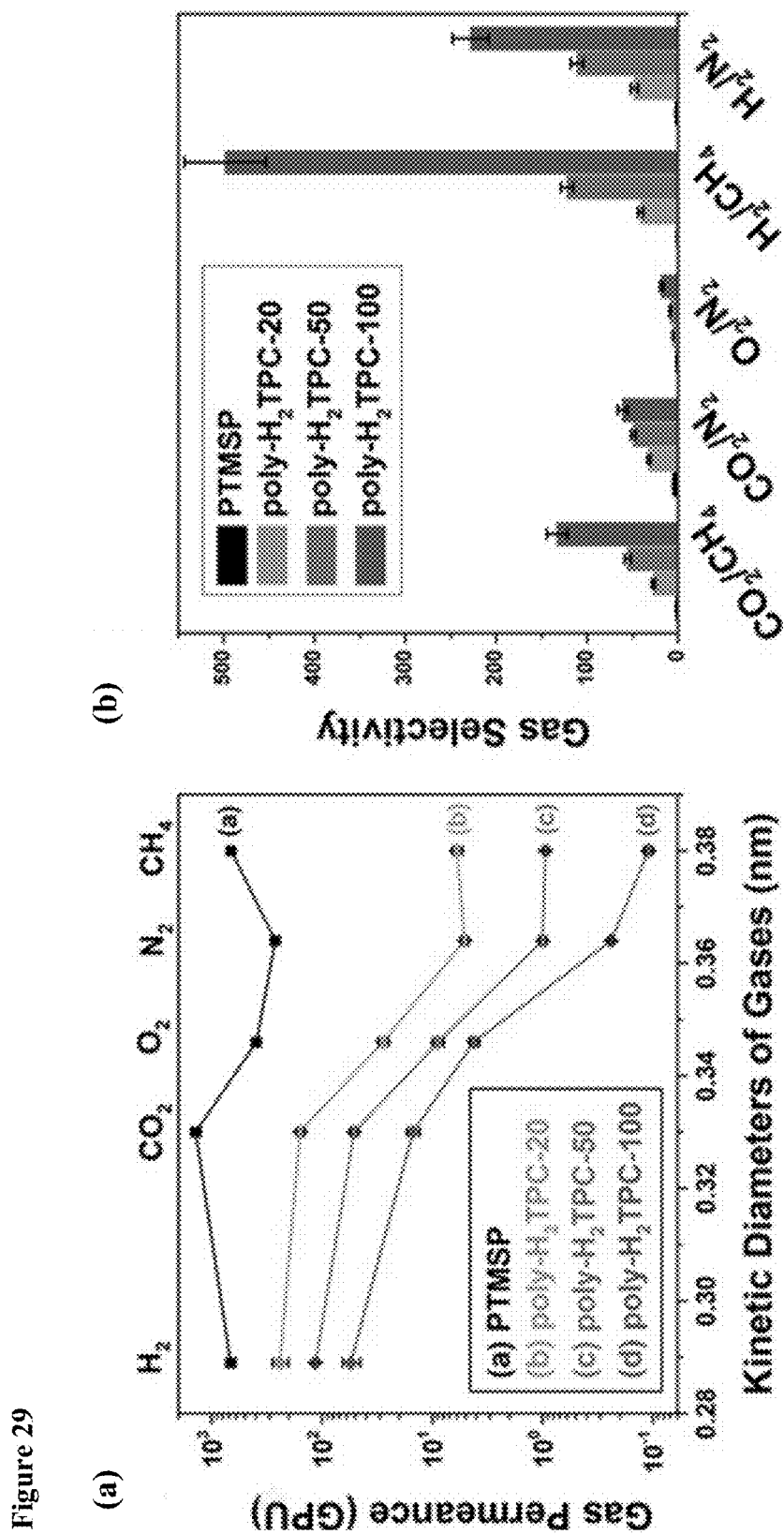
FIG. 29 depicts the (a) permeance and (b) selectivity trends for OCN layers of varying thickness.

To understand the effect of central metal ion in the porphyrin on the gas permeation property, metal free poly-$H_2$TPC thin films were synthesized, as an initial step, to see whether a metal free structure with no facilitated transport would change the gas permeation performance. P($H_2$TPC) thin films with three thicknesses (20 nm, 50 nm and 100 nm) were deposited on ultrapermeable PTMSP cast membranes (30 μm), and designated as poly-$H_2$TPC-20, poly-$H_2$TPC-50 and poly-$H_2$TPC-100, respectively. Table 8 is a summary of gas permeation properties for exemplary OCN and MOCN thin films coated PTMSP composite membranes. A more specific comparison of poly-$H_2$TPC thin films with different thicknesses is depicted in FIG. 29.

As shown in FIG. 29a, the permeances of untreated PTMSP, poly-$H_2$TPC-20, poly-$H_2$TPC-50 and poly-$H_2$TPC-100 were plotted along with the kinetic diameters of gases. The gas selectivities of industrial important gas pairs (e.g., $CO_2/CH_4$, $CO_2/N_2$, $O_2/N_2$, $H_2/CH_4$ and $H_2/N_2$) of aforementioned four membranes are displayed in FIG. 29b. The ultrapermeable PTMSP cast membrane (ca. 30 μm) have the gas permeances following $CO_2>H_2>CH_4>O_2>N_2$ (FIG. 29a), which are different from the reversal order of their kinetic diameters, indicating combined effects of diffusion and sorption. The resulting gas selectivities are negligible (Table 8 and FIG. 29b). In contrast, the deposition of poly-$H_2$TPC thin films led to a more significant molecular sieving effect, that is the permeances of larger gas species (e.g., $N_2$ and $CH_4$) were reduced more significantly than that of the smaller ones. Therefore, significant permeation selectivities were observed for poly-$H_2$TPC thin films coated PTMSP membranes (FIG. 29b). For instance, $CO_2/CH_4$ selectivity increased from a negligible 2.1 (for PTMSP) to 27, 55 and 133 for 20 nm, 50 nm and 100 nm poly-$H_2$TPC thin films (Table 8). In addition, increasing the thickness of poly-$H_2$TPC thin films led to the decrease of permeances. While the decrease for hydrogen was almost inversely proportional to the thickness increase, larger gases species experienced much steeper decrease (Table 8, FIG. 29a). This trend indicated the poly-$H_2$TPC thin films became tighter at higher thicknesses, probably by removing the interfacial defects (OCN film/PTMSP interface) arising from the surface roughness of PTMSP cast membranes. While the performance of poly-$H_2$TPC thin films coated PTMSP cast membranes was better than the typical commercial polymeric membranes, and comparable to that of zeolite and metal organic framework MOF membranes, the value of permeances, permeation selectivities and the thickness correlation for metal free poly-$H_2$TPC thin films were similar to that of metal containing poly-Zn(TPC) thin films previously reported. This was a good indication that the additional nonplanar distortion caused by the central metal ions and the available coordination sites did not contribute to the high permeation selectivity observed in M OCN thin films.

TABLE 8

Observed Gas Barrier Properties from Single Gas Permeation Measurements

| Membranes | $H_2$ (GPU) | $CO_2$ (GPU) | $O_2$ (GPU) | $N_2$ (GPU) | $CH_4$ (GPU) | $CO_2/CH_4$ | $CO_2/N_2$ | $O_2/N_2$ | $H_2/CH_4$ | $H_2/N_2$ |
|---|---|---|---|---|---|---|---|---|---|---|
| PTMSP | 674 | 1395 | 394 | 266 | 666 | 2.1 | 5.3 | 1.5 | 1.0 | 2.5 |
| poly-$H_2$TPC-20 | 241 | 158 | 28 | 5.1 | 6.0 | 27 | 32 | 5.5 | 41 | 48 |
| poly-$H_2$TPC-50 | 115 | 51 | 8.9 | 1.0 | 0.94 | 55 | 49 | 8.6 | 122 | 111 |
| poly-$H_2$TPC-100 | 55 | 15 | 4.2 | 0.24 | 0.11 | 133 | 61 | 18 | 498 | 228 |
| poly-Zn(TPC)-50 | 119 | 55 | 7.4 | 0.96 | 0.89 | 62 | 57 | 7.7 | 134 | 124 |
| poly-MnCl(TPC)-50 | 131 | 47 | 7.7 | 0.88 | 0.79 | 59 | 53 | 8.7 | 165 | 149 |
| poly-MnCl(TPC)-50-1 W | 96 | 26 | 6.5 | 0.45 | 0.28 | 94 | 58 | 15 | 349 | 216 |
| poly-MnCl(TPC)-50-3 W | 56 | 10 | 2.2 | 0.12 | 0.051 | 202 | 85 | 18 | 1098 | 460 |
| poly-Co(TPC)-50 | 157 | 58 | 9.6 | 1.2 | 1.1 | 57 | 51 | 8.3 | 194 | 132 |

The effect of the central metal ion on the gas permeation performance of porphyrin-derived coatings was further examined using 50 nm of metal-free poly-$H_2$TPC, zinc-containing poly-Zn(TPC), manganese-containing poly-MnCl(TPC) and cobalt-containing poly-Co(TPC) thin films deposited on PTMSP cast membranes via iPECVD processes. The samples are designated as poly-$H_2$TPC-50, poly-Zn(TPC)-50, poly-MnCl(TPC)-50 and poly-Co(TPC)-50, respectively.

Figure 30:
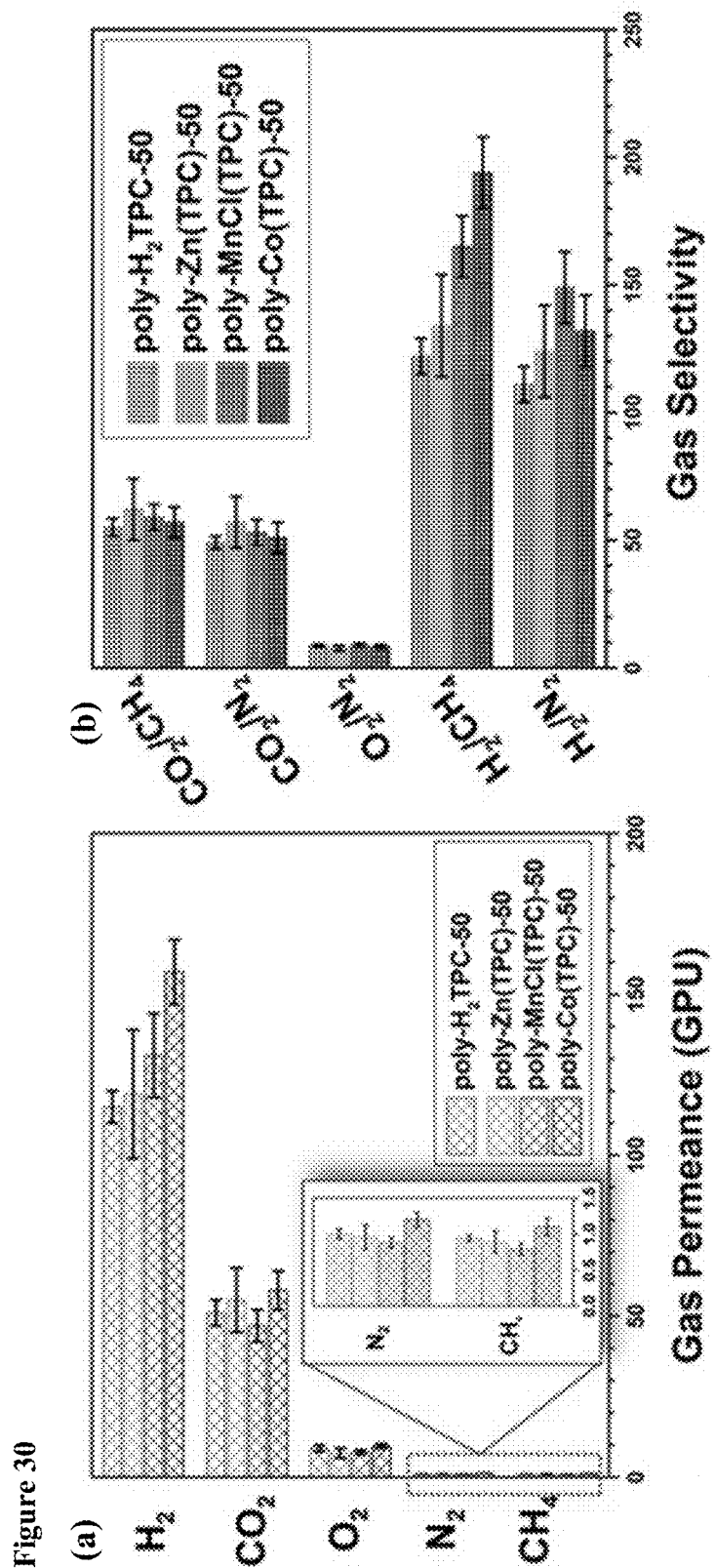
FIG. 30 depicts the (a) permeance and (b) selectivity trends for OCN and MOCN layers having 50 nm thickness.

FIG. 30a shows a direct comparison of gas permeances for four OCN thin films with and without central metal ions (all at 50 nm). The permeances for poly-$H_2$TPC, poly-Zn (TPC), poly-MnCl(TPC) and poly-Co(TPC) were similar to each other, although poly-Co(TPC) did appear to be slight more permeable than other three OCN thin films. In detail, $H_2$ permeances ranged from 115 GPU for poly-$H_2$TPC to 157 GPU for poly-Co(TPC), representing a maximum difference of 30.8%. Similarly, permeances of $CO_2$, $O_2$, $N_2$ and $CH_4$ had a maximum difference of 10.5%, 12.9%, 15.4% and 16.4% among four OCN thin films, respectively (Table 8). Similar trends were observed for resulting permeation selectivities of four OCN thin films, without and with different central metal ions (FIG. 30b). The maximum differences for permeation selectivities of $CO_2/CH_4$, $CO_2/N_2$, $O_2/N_2$, $H_2/CH_4$ and $H_2/N_2$ were 6.0%, 7.5%, 6.1%, 22.8% and 14.6%, respectively (Table 8). The fact that both permeances and permeation selectivities of four OCN thin films were fairly similar to each other provided strong evidence that the distortion caused by central metal ion, and the available axial coordination sites available at the metal ion containing OCN thin films did not play a key role defining the gas permeation properties.

Figure 4:
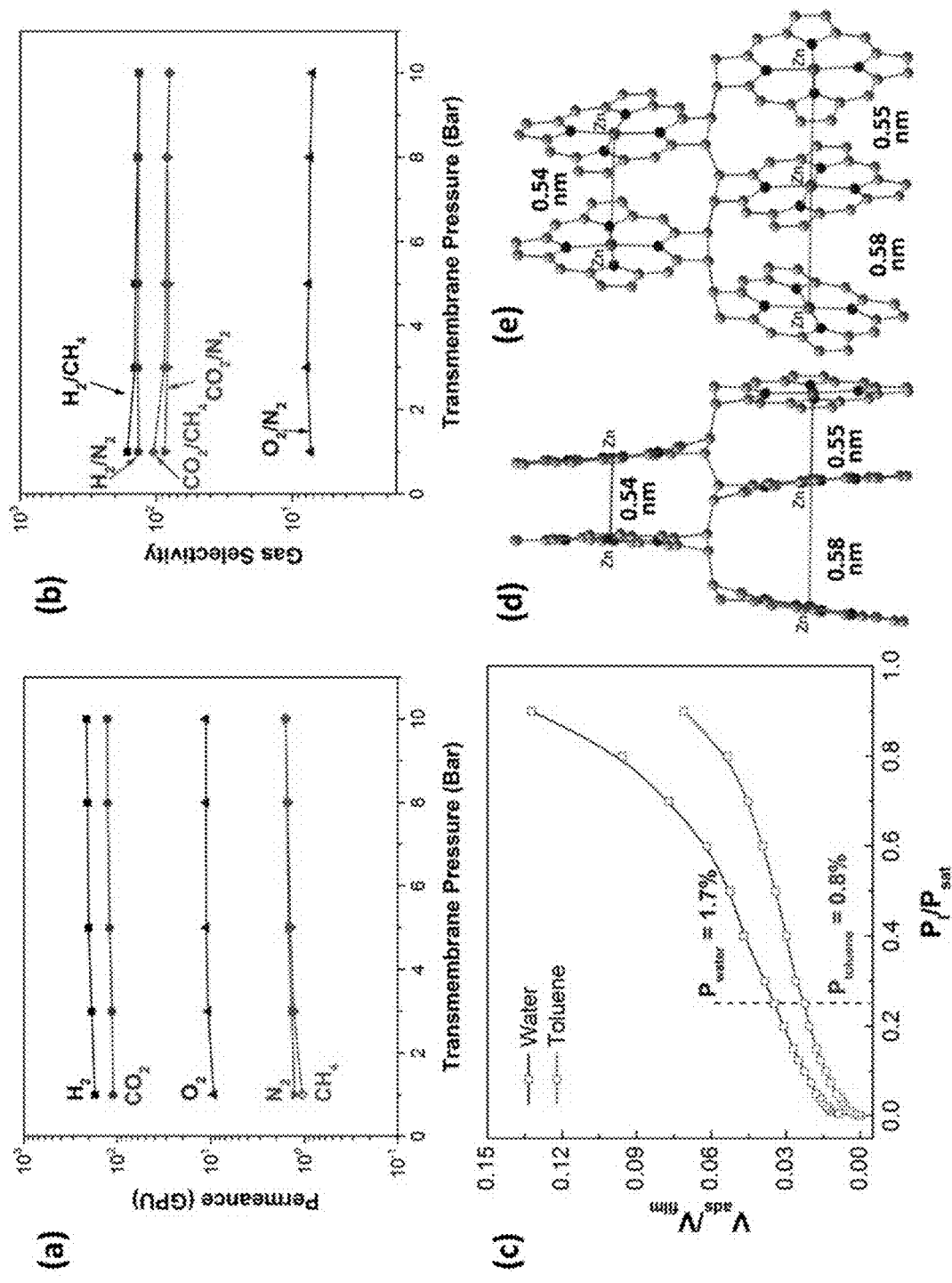
FIG. 4 depicts gas sorption and transport properties. (a) Gas permeances of MOCN membrane as a function of transmembrane pressure difference. (b) Gas selectivities of MOCN membrane as a function of transmembrane pressure difference. (c) Adsorption/desorption isotherms measured by ellipsometric porosimetry, using water vapor (kinetic diameter, 0.27 nm) and toluene vapor (kinetic diameter, 0.60 nm) molecules as probing molecules. (d) and (e) DFT (BP, def2-SV(P)) optimized geometry of a pentamer model with truncated phenyl substituents (H atoms omitted for clarity).

In addition to superior gas selectivities and permeances, the PTMSP membrane supported MOCN films displayed excellent mechanical robustness against high transmembrane pressure difference (10 bar, higher pressure difference not tested) (FIG. 4a-b). The variation on transmembrane pressure difference (from 1 bar to 10 bar, covering the range of interest for industrial gas separations) showed little effect on the gas permeation properties of the supported MOCN films. The superior performance of the supported MOCN films is attractive for practical applications in carbon capture, natural gas sweetening, air separation, natural gas purification, and hydrogen recovery.

To elucidate the origin of the outstanding gas separation performances of the MOCN coating, its structural and physico-chemical properties were further characterized. To gain information on the open porosity of the porphyrin-based material, ellipsometric porosimetry (EP) experiments using water (0.27 nm) and toluene (0.60 nm) as probing molecules were performed on MOCN coatings deposited on the silicon wafers. The vapor sorption isotherms of both of the probing molecules pointed out a microporous structure with a pore volume ratio of ca. 0.8% to 1.7% (FIG. 4c). The pore size, calculated from the Kelvin equation, was as low as 0.4 nm. Geometry optimizations based on density functional theory (DFT) calculations were carried out on a pentameric truncated model (phenyl substituents omitted). The DFT calculated minimum structure reveals a rather rigid aliphatic polymer backbone due to the trans-substituted pyrroline heterocycles constituting the backbone. The zinc chlorin macrocyles are oriented in alternating directions in a stacked manner with Zn . . . Zn distances of 0.5 to 0.6 nm (FIG. 4d-e), which is consistent with the EP measurements, and also with the observed molecular sieving effect of the MOCN coatings. As a result, the larger $N_2$ and $CH_4$ gas molecules permeated through MOCN films at much lower speeds. Naturally, the small pentamer model does not account for chain entanglement or cross-linking but demonstrates the rigidity of the backbone and the chlorin stacking along the chain, which is an essential feature of gas separation membranes. The rigidity of the porous structure associated to a special π stacking arrangement and the metal sites might be responsible for the gas separation properties of the MOCN coating.

Figure 31:
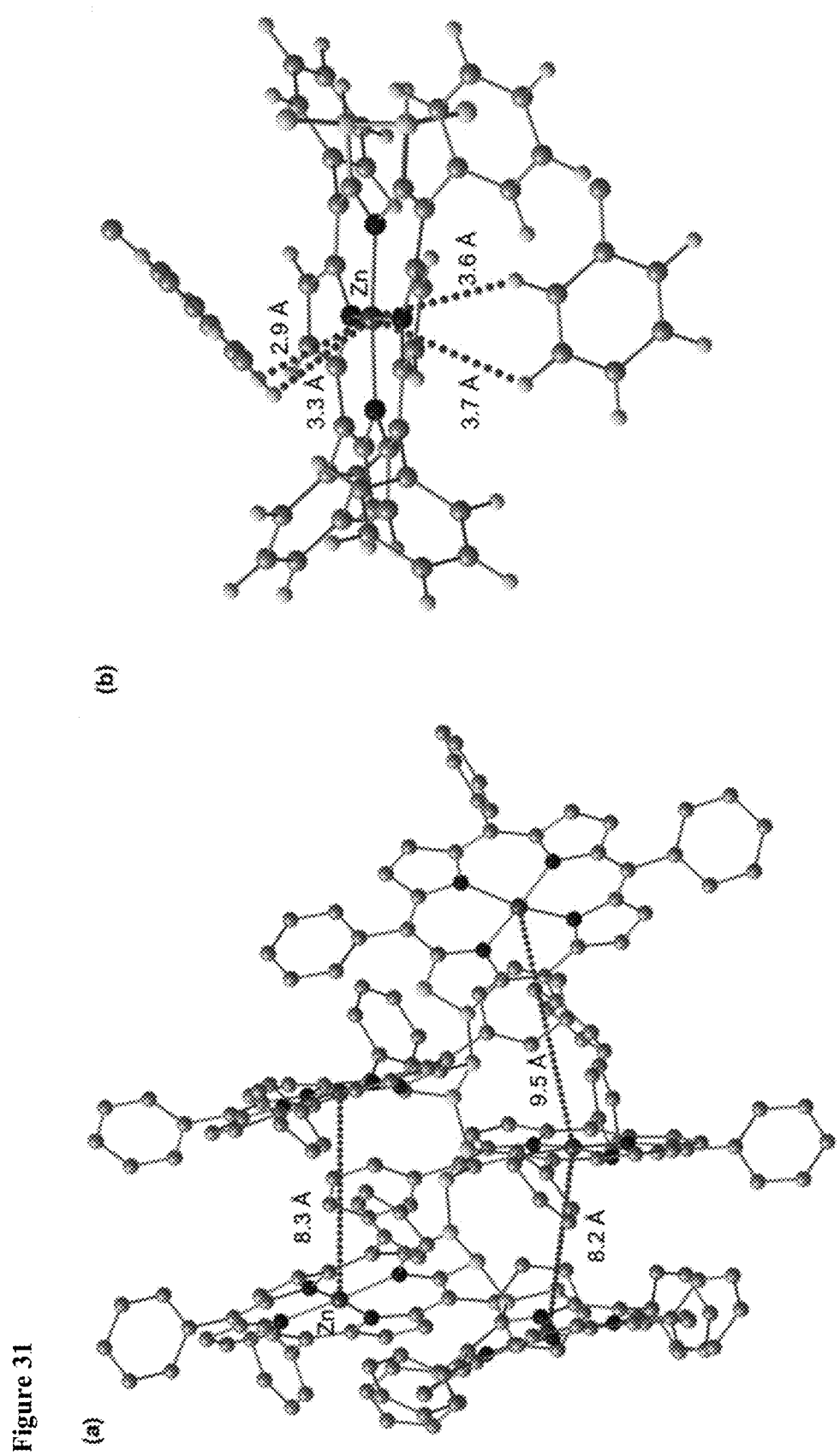
FIG. 31 depicts the DFT (BP, def2-SV(P)) optimized geometry of (a) the pentameric model of Zn(TPC) (H atoms omitted for clarity) and (b) a close-up of the central Zn(TPC) unit and the phenyl substituents of the flanking monomers (hydrogen atoms shown).

In order to get an impression of the rigidity and the constriction around the macrocycles and the coordinated metal ions, a pentameric, hydrogen-terminated model fragment of $[Zn(TPC)]_5$ was optimized by DFT methods (FIG. 31a). In contrast to the truncated model system (omitting the Ph substituents of the TCP macrocycle) (FIGS. 4d and 4e), the structure including the phenyl substituents was much more crowded. This was evident from the significantly larger average macrocycle deformation (as judged from average N—N—N—N torsion angles: 1.6° for the truncated model, 7.6° for the full model), the larger average Zn—Zn distance (5.6 Å for the truncated model, 8.7 Å for the full model) and the interaction of phenyl substituents of adjacent Zn(TPC) monomers with the $ZnN_4$ core of the central Zn(TPC) monomer (FIGS. 4d, 4e, 31a, and 31b). The central Zn(TPC) monomer of the pentamer was embedded between two phenyl substituents of neighboring units (FIG. 31b), which effectively shielded the zinc(II) center from the surroundings. This dense packing was consistent with the experimental finding that irrespective of the type of metal ion (e.g. $Zn^{II}$ or $Co^{II}$), metal-gas interactions were less important in these OCN thin films. Hence, facilitated transport (e.g. $O_2$ by $Co^{II}$) was decreased within this crowded structure.

So, in certain embodiments, the iPECVD polymerization of porphyrin building units provides an easily up-scalable one-step approach towards the deposition of new class of hyper-thin (sub-100 nm), dense and defect-free MOCN coatings. The iPECVD of metalloporphyrin building units provides a versatile approach towards the simultaneous synthesis and deposition of metal-organic covalent networks with superior gas separation properties. In addition, the developed strategy is particularly suitable for the coating of sensitive substrates, such as illustrated by the coating of a carbon copper TEM grid. The rigid and nanoporous structure of the MOCN, associated to a π-electron rich environment and to a high density of coordinatively flexible Zn(II) centers may be at the origin of the outstanding gas separation potential of the ultra-thin MOCN coating. In certain embodiments, free-base porphyrins and metalloporphyrins may behave similarly. The versatile methods are not specific to gas separation and may also pave the way for development of new MOCNs for applications in sensing (such as colorimetric gas sensing), heterogeneous catalysis of a wide variety of organic reactions, films with photocatalytic properties, light-emitting diodes, field-effect transistors, and solar cell technologies.

Example 2—Comparison of Films Deposited by iCVD and iPECVD

Chemical Vapor Deposition and Materials

Figure 5:
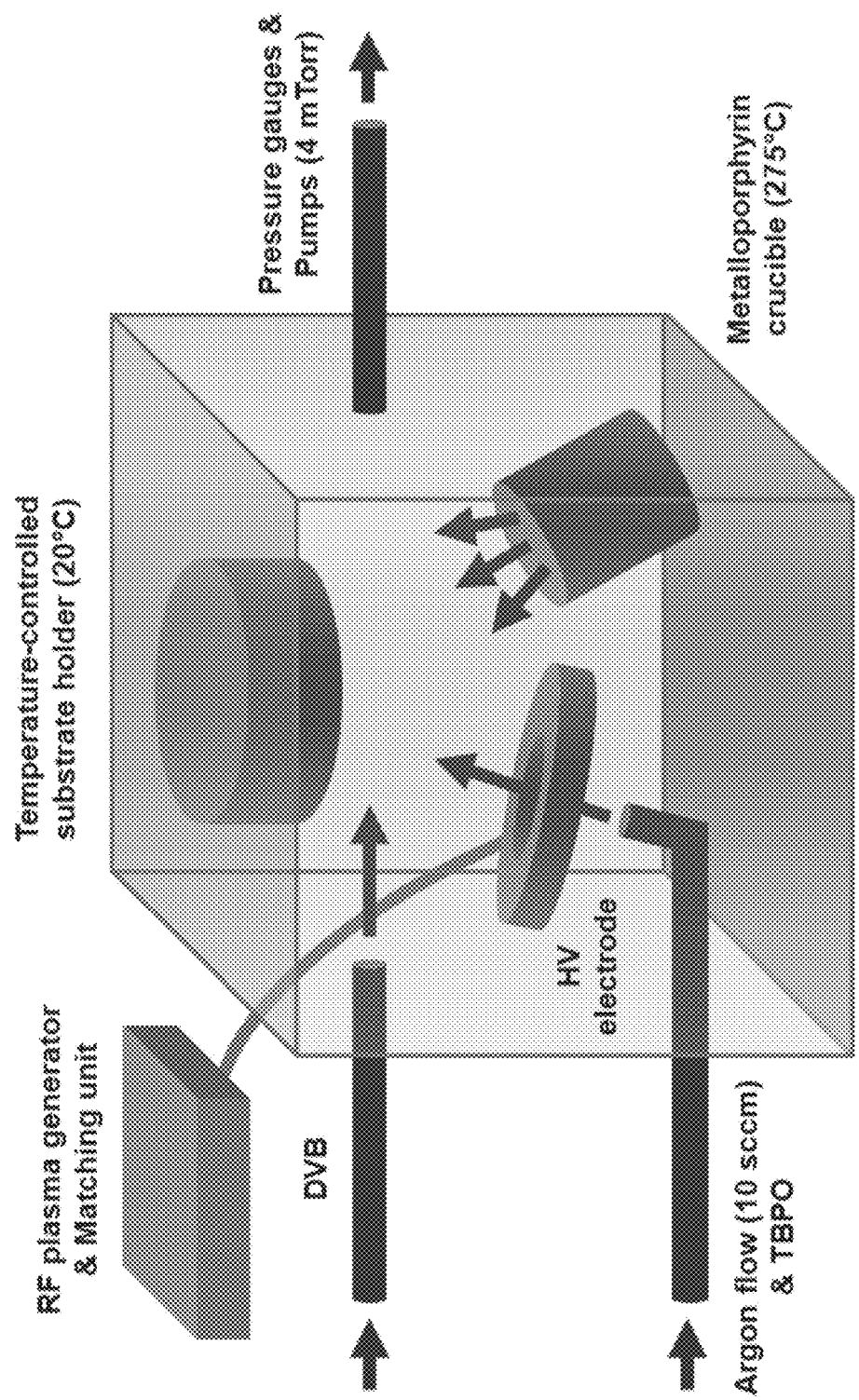
FIG. 5 depicts a schematic representation of a reactor for iPECVD.
Figure 6:
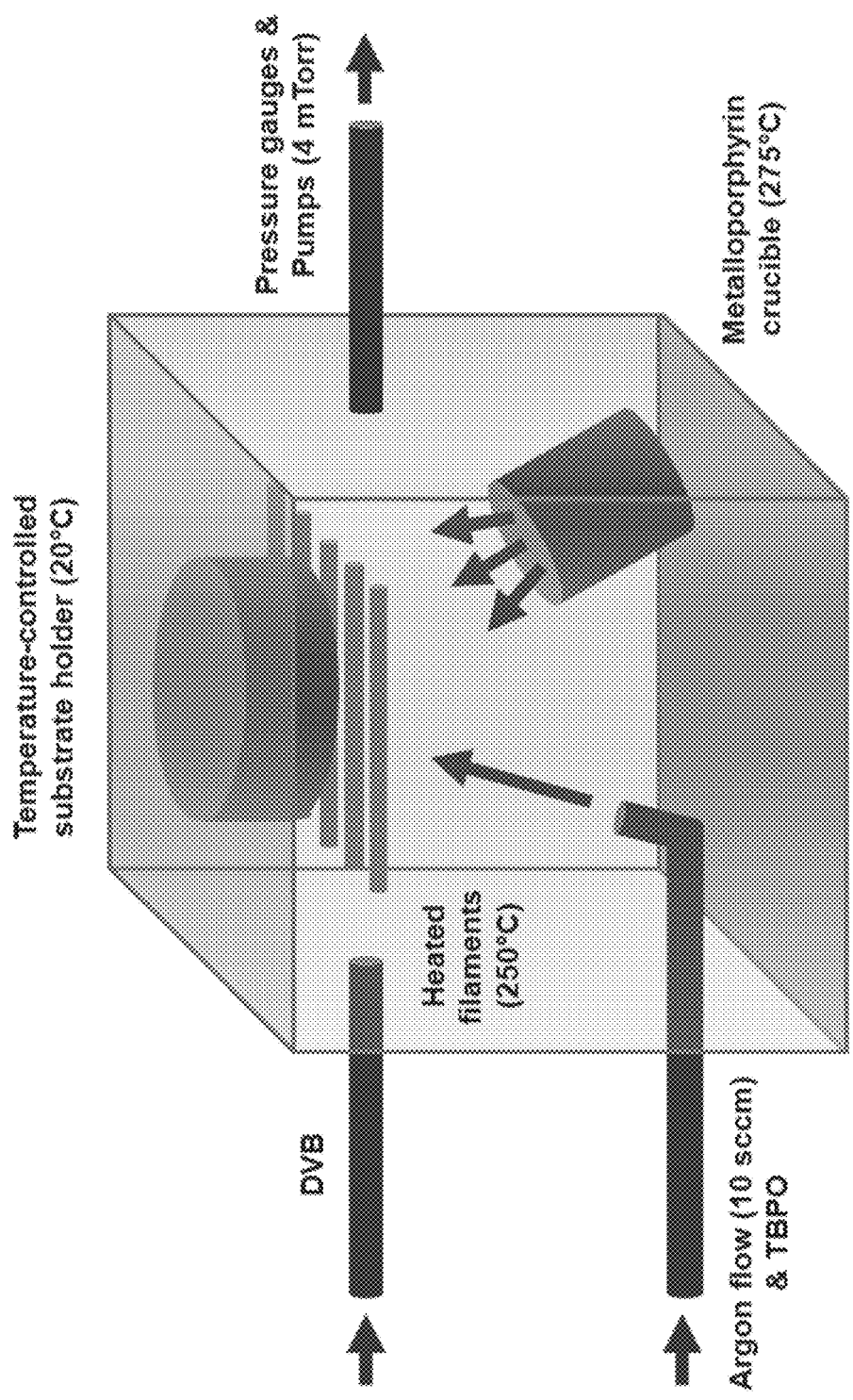
FIG. 6 depicts a schematic representation of a reactor for iCVD.

The iCVD and iPECVD experiments were performed in a custom built chamber described elsewhere. For the PECVD and iPECVD, a circular radio frequency (RF) capacitively coupled electrode of outer diameter 14 cm and inner diameter 5 cm was placed 2 cm above the argon (Airgas, 99.9997%) and tert-butyl peroxide (TBPO) initiator (Sigma-Aldrich, 98%) feeding lines located in the back side of the chamber (FIG. 5). The RF plasma, with power varied between 1 and 40 W, was generated by an Advanced Energy Cesar RF power generator (Model 136) via a Plasma-Therm RF matching unit (MNS-50CE). For the iCVD experiments, an array of filaments heated-up to 250° C. was placed 5 cm below the substrate (FIG. 6). Prior to all depositions, the chamber was pumped down to a base pressure of less than $1\times10^{-4}$ mbar by mechanical rotary and molecular turbo pumps. The crosslinking co-monomers, styrene (Sigma-Aldrich, 99%) and divinylbenzene (DVB) (Sigma-Aldrich, 80%), used without further purification, was fed into the chamber through a flange located in the upper part of the chamber. For all the deposition experiments, argon gas, used as the plasma gas, was flowed into the chamber at a flow rate, from 5 to 20 sccm, which ensures a constant pressure of $5\times10^{-3}$ mbar in the chamber. For the PECVD experiments, no TBPO initiator was flowed to the chamber. The deposition conditions are summarized in Table 5. The ZnTPP monomer (PorphyChem, 98%), used without further purification, was evaporated from a crucible resistively heated at 275° C. and located in the front side of the chamber. The substrates used for the deposition were microscope glass slides, silicon wafers, carbon copper TEM grids and PTMSP membranes placed onto a temperature controlled stage (20° C.) located 15 cm above both the ZnTPP crucible and the RF electrode.

TABLE 5

|  | Evaporation | iCVD 250° C. | PECVD & iPECVD | | |
|---|---|---|---|---|---|
|  |  |  | 1 W | 20 W | 40 W |
| — | A1 | B1 | C1 | D1 | E1 |
| TBPO | A2 | B2 | C2 | D2 | — |
| TBPO & DVB | — | B3 | C3 | D3 | — |
| TBPO & Styrene | — | — | C4 | — | — |

Physico-Chemical Characterizations

Size-exclusion chromatography (SEC) experiments were performed using an Ultimate 3000 HPLC system (Thermo Fisher Scientific) equipped with a quaternary pump system, a column oven and a variable UV-vis wavelength detector. The selected wavelength was 437 nm, corresponding to the position of the Soret band of the evaporated ZnTPP coatings and to the red-edge of the Soret band of the MOCN coatings. The polymer chains were separated using a PLgel 5 μm MIXED-D column (Agilent Technologies, 300×7.5 mm) under isocratic conditions (THF, 1 mL min$^{-1}$). The MOCN coatings were extracted using 1 mL of tetrahydrofuran (THF). As a comparison, the coatings elaborated from the evaporation of ZnTPP were extracted using THF and analysed by the same procedure. The number-average molar mass ($M_n$) and the number-average molecular weight ($M_w$) were calculated on the basis of a polystyrene calibration. UV-vis absorption spectra were collected over wavelengths from 300 to 1200 nm using a Varian Cary 5000 UV-Vis-NIR spectrophotometer. FTIR analyses were performed on a Thermo Scientific Nicolet iS50 spectrometer equipped with an ATR-crystal and a mercury-cadmium-telluride (MCT) detector cooled with liquid nitrogen. Spectra were acquired with 1000 scans in the 4000-500 cm$^{-1}$ range. XPS analyses were realized with a Kratos Axis-Ultra DLD instrument using a monochromatic Al Kα X-ray source (hν=1486.6 eV) at pass energy of 20 eV. Argon sputtering operating at 3 keV and 2 mA was used for approximately 50 s in a rastering mode in order to remove surface contamination. No flood gun was used to reduce sample charging. The chemical stability of the iPECVD coatings towards various polar (i.e., water and methanol) and non-polar solvents (i.e., toluene and chloroform) was investigated by soaking the MOCN coatings deposited on glass substrates for 1 hour. The Soret band intensity, measured by UV-vis, prior and after the one hour immersion test at 20° C. was used to follow the film dissolution. The thicknesses of the MOCN coatings grown on Si wafers were measured using variable angle spectroscopic ellipsometry (VASE, JA Woollam Model M-2000). Measurements were made at three incident angles (i.e., 65°, 70° and 75°) and the data were fitted to a Cauchy model using the WVASE32 software. SEM images were obtained from a tungsten source JEOL SEM6010LA equipped with an SEI detector. The accelerating voltage used was 5 to 10 kV. TEM images were obtained with a FEI Technai Spirit TEM with an acceleration voltage of 100 kV. The TEM samples were prepared by coating a TEM carbon-coated copper grid placed on the substrate holder during the deposition experiments. Alternatively, the MOCN coatings were deposited on glass substrates that were later dissolved in hydrofluoric acid (HF). The 50 nm thick coatings were subsequently rinsed in distilled water and collected on a TEM copper grid.

Performances of MOCNs Thin Films for Gas Separation

The gas permeation measurements were performed on a house-constructed gas permeation cell in constant pressure mode. Detailed procedure is described elsewhere. In brief, a PTMSP cast membrane coated with MOCN was placed in the gas permeation cell. Hydrogen ($H_2$, Airgas, ultra-high purity grade 5.0), carbon dioxide ($CO_2$, Airgas, pure clean grade), oxygen ($O_2$, Airgas, ultra-high purity grade 4.4), Nitrogen ($N_2$, Airgas, ultra-high purity grade 5.0) and methane ($CH_4$, Airgas, ultra-high purity grade 4.0) were then permeating through the composite membrane one at a time. The gauge pressure at the upstream was set at 1 to 10 bar and the flow rates were recorded by a bubble flow meter. The gas permeation properties were also measured for the pristine PTMSP cast membranes.

Discussion

The iPECVD of metalloporphyrin building blocks enables the synthesis and deposition of nanoporous MOCNs with outstanding gas separation properties. In order to get a better understanding of the benefits of plasma in the free-radical polymerization and deposition of porphyrin building blocks, a series of coatings were prepared from the evaporation, iCVD, iPECVD or PECVD of ZnTPP with or without the presence of an initiator (i.e., TBPO) or a co-monomer (i.e., styrene or DVB) (Table 1).

Figure 7:
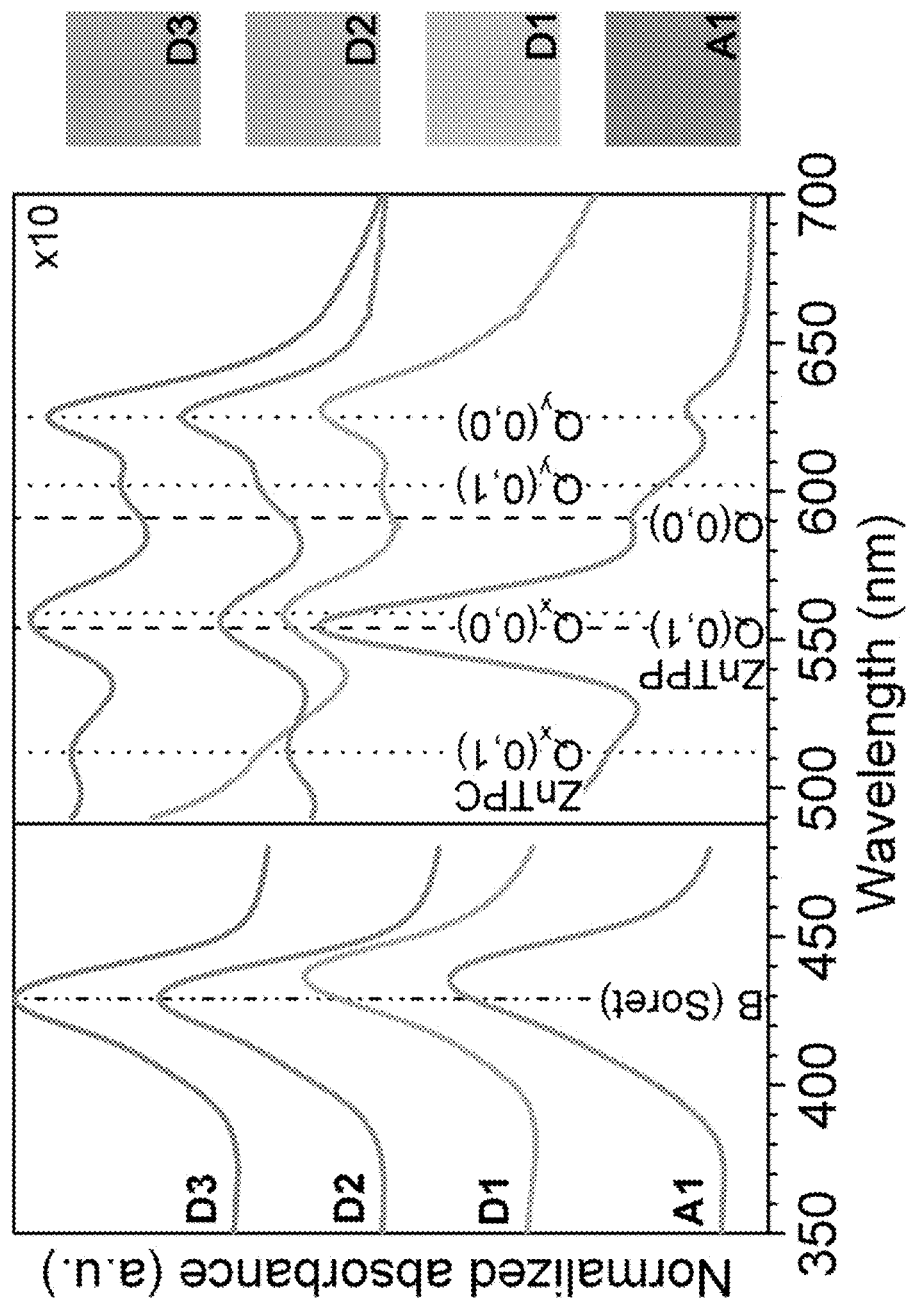
FIG. 7 depicts the UV-vis spectra of various films deposited by: evaporation in the absence of initiator (A1), PECVD (D1), iPECVD (D2), or iPECVD with a co-monomer (D3).

The first readily and visually noticeable information on the prepared thin films is their coloration and absorbance intensity, such as illustrated on FIG. 7. The evaporated and iCVD thin films prepared all exhibit the reddish coloration of ZnTPP (FIG. 7 (right panel); Sample A1), while on the other hand, the PECVD and iPECVD thin films all have a greenish coloration with an absorbance intensity that strongly depends on the deposition conditions (FIG. 7 (right panel); Samples D), even for plasma discharge input power as low as 1 W.

Figure 8:
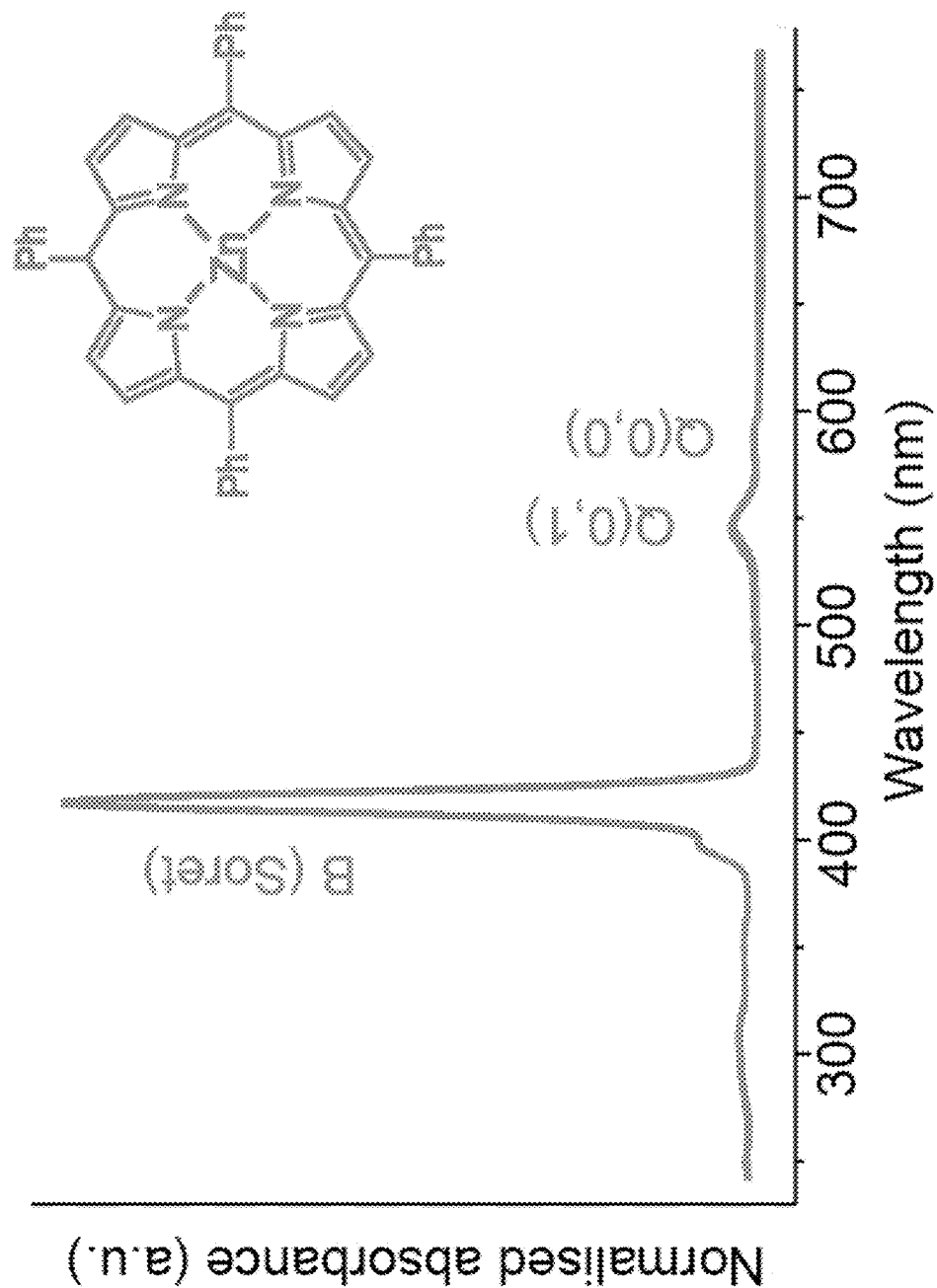
FIG. 8 depicts the absorption spectrum of ZnTPP.
Figure 9:
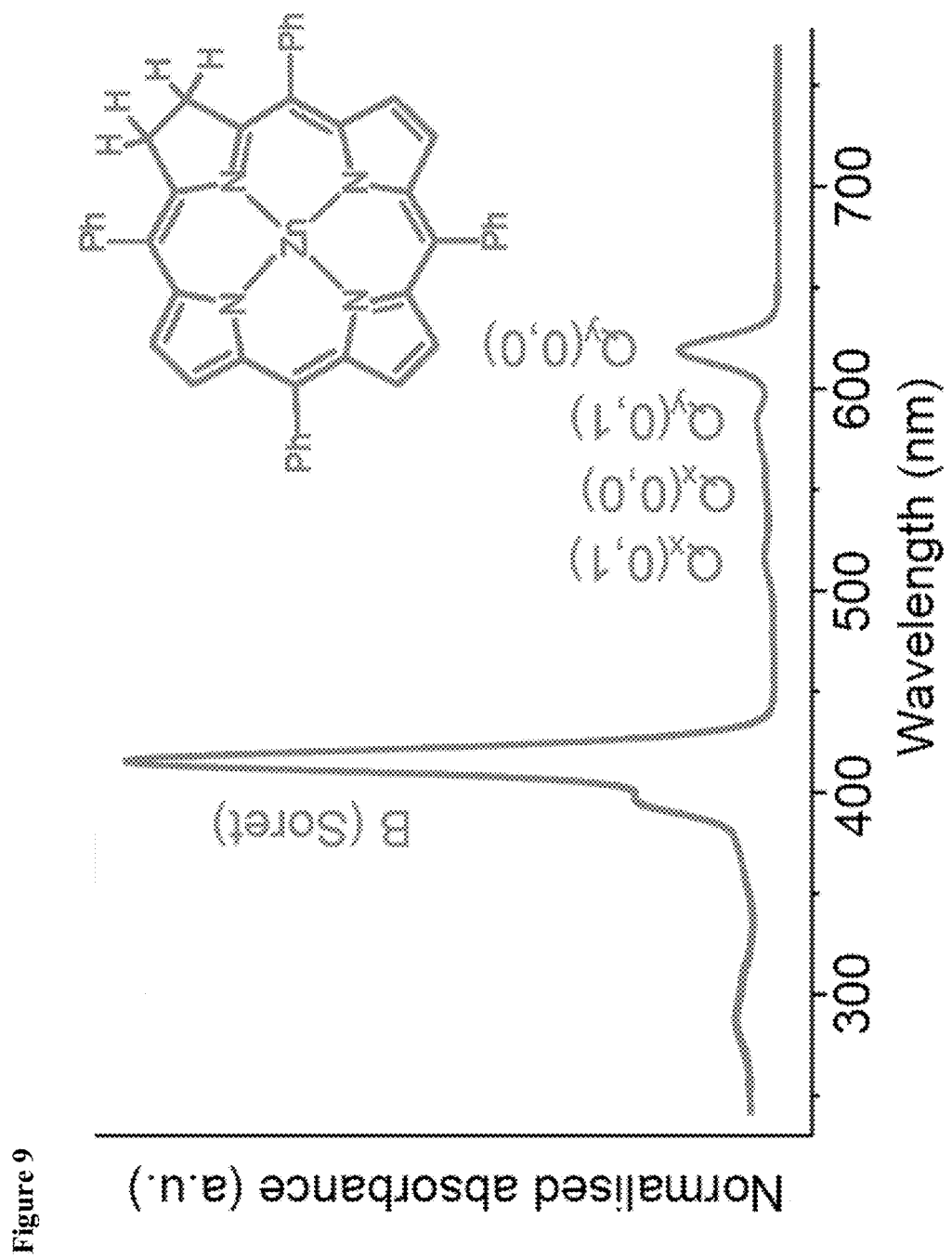
FIG. 9 depicts the absorption spectrum of ZnTPC.

The coloration of porphyrins is arising from different absorption bands that are function of macrocycle structure and environment. UV-vis analyses of the evaporated and iCVD thin films (FIG. 7 (left panel); Sample A1) show the typical absorption spectrum of ZnTPP (FIG. 8). The position of Soret band (i.e., 435 nm) and the weaker Q bands (i.e., 555 and 592 nm) at significantly longer wavelengths is usually observed for porphyrins in the solid state. The small band at 626 nm is attributed to ZnTPC (FIG. 9), which is a well-known contaminant of ZnTPP. Interestingly, irrespective of plasma power or the presence of an initiator (TBPO) or a co-monomer (DVB), the band attributed to ZnTPC is significantly more pronounced for all the plasma-deposited ZnTPP thin films (FIG. 7 (left panel); Samples D). A new absorption band, also assigned to ZnTPC, is detected at 510 nm. The rising of these absorption bands, responsible for the colour change observed on FIG. 7 (right panel), indicates the reduction of one exo-pyrrole double bond of the ZnTPP to form ZnTPC. No further reduction of a second exo-pyrrole double bond of the porphyrin ring was evidenced as none of the characteristic absorption bands of zinc (II) meso-tetraphenylbacteriochlorin (ZnTPBC) nor zinc (II) meso-tetraphenylisobacteriochlorin (ZnTPiBC) were detected.

Figure 10A:
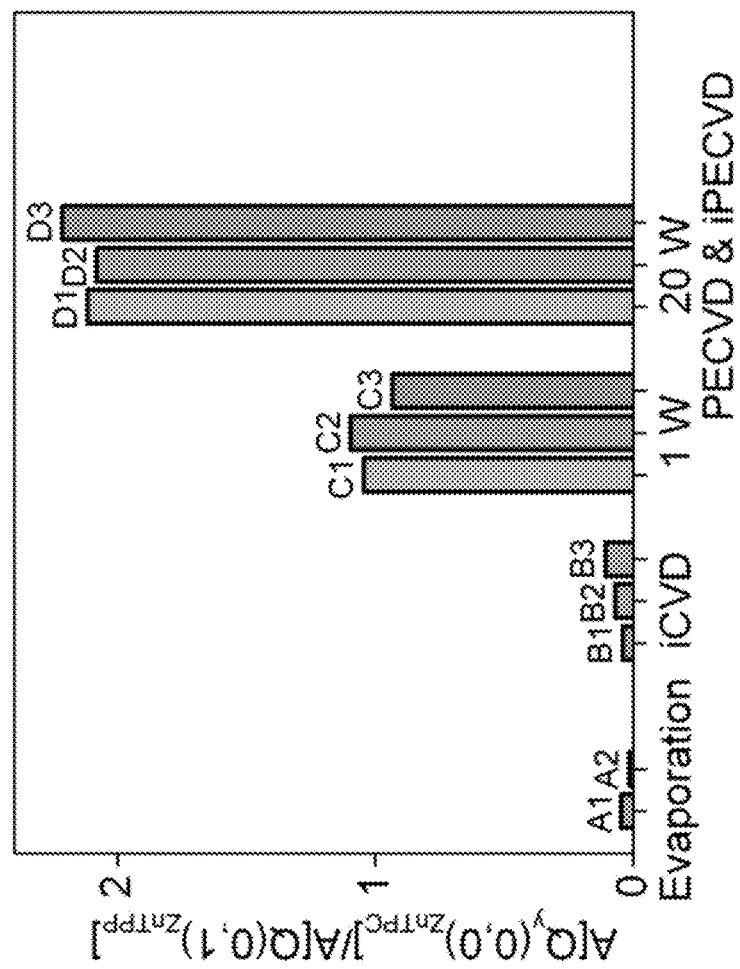
FIG. 10A depicts the absorbance ratio of the strongest Q bands of ZnTPC, i.e., $Q_y(0,0)$, and ZnTPP, i.e., $Q(0,1)$, for films deposited by evaporation, iCVD, PECVD, and iPECVD.

In order to better understand the CVD polymerization of porphyrin building units, the absorbance ratio of the strongest Q bands of ZnTPC, i.e., $Q_y(0,0)$, and ZnTPP, i.e., $Q(0,1)$, is plotted on FIG. 10A. It should be noted that the $Q(0,1)$ band of ZnTPP overlap with the weakly absorbing $Q_x(0,0)$ band of ZnTPC. In addition, the absorption coefficients of these bands are unknown for the produced material and the following comparisons are purely qualitative. While both the iCVD and the iPECVD approaches maintain the integrity of the porphyrinoids, for the iCVD thin films (e.g., Sample B2), the $A[Q_y(0,0)_{ZnTPC}]/A[Q(0,1)_{ZnTPP}]$ ratio remains comparable to the one of evaporated ZnTPP thin films (ca. 0.05) and the conditions employed did not significantly promote the polymerization of the porphyrin units. On the other hand, this ratio was shown to remarkably increase for the thin films produced from the PECVD and iPECVD approaches, i.e., from ca. 1 and ca. 2 for the thin films deposited using a 1 W (e.g., Sample C2, which is a mixture of ZnTPP and ZnTPC units) and 20 W (e.g., Sample D2, mainly composed of ZnTPC units) RF plasma discharge, respectively, indicating the effective polymerization or copolymerization of the porphyrin units. However, when comparing the $A[Q_y(0,0)_{ZnTPC}]/A[Q(0,1)_{ZnTPP}]$ ratio, one should also take into account the absolute absorbance of the films. Indeed, plasma is creating a variety of not-well-defined chemical species that are likely to induce side reactions, including disruption of the porphyrin ring express by a decrease of the absorption bands.

Figure 10B:
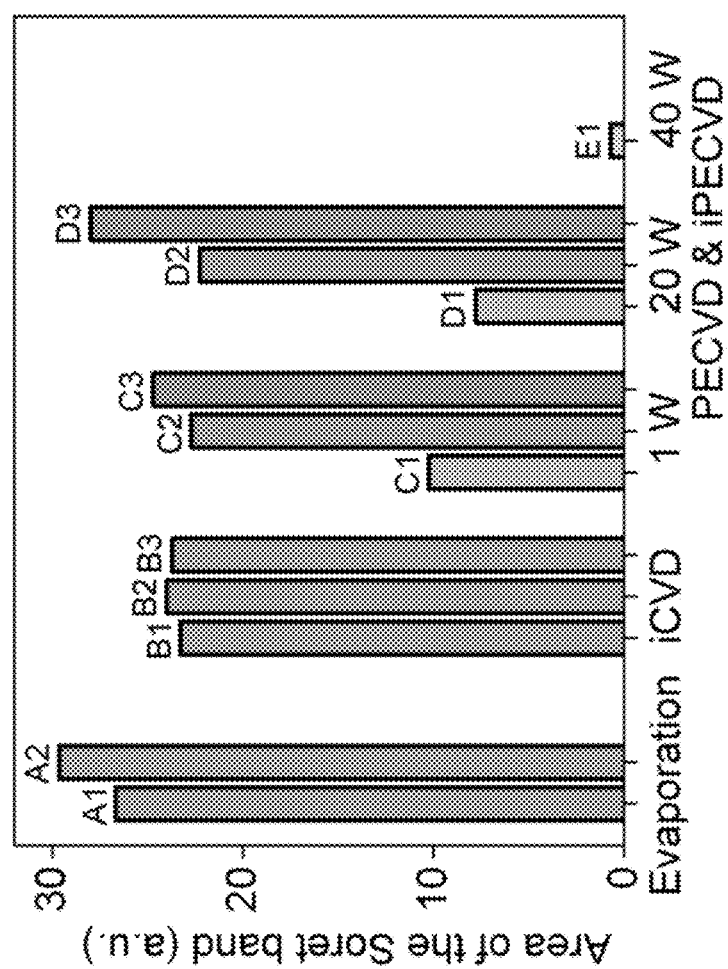
FIG. 10B depicts the absolute absorption intensity of the band located around 435 nm for films deposited by evaporation, iCVD, PECVD, and iPECVD.

The absorbance intensity of the films is particularly informative on the heterocyclic macrocycle integrity, since the disruption of the porphyrinoid ring leads to a discoloration of these materials. FIG. 10B presents the absolute absorption intensity of the band located around 435 nm for the different thin films elaborated. This strong absorption band is originated from the Soret bands of both ZnTPC and ZnTPP. In spite of different absorption coefficients for each of the zinc porphyrinoids and different environments, which are also known to influence the absolute absorbance (e.g., extinction due to stacking), FIG. 10B is allowing to observed informative trends. First, in the absence of an initiator (TBPO) or co-monomer (DVB), the Soret band intensity is shown to be drastically reduced with increase of the plasma power. Plasma creates a variety of possibly highly reactive species with very low selectivity that can induce a full disruption of the porphyrinoid macrocycles. In contrast to the PECVD results, the iPECVD thin films prepared with TBPO and/or DVB exhibit intensities highly comparable to the unaltered evaporated ZnTPP thin films. Such observation may be explained by a partial quenching of the RF plasma discharge in the presence of TBPO and/or DVB and the higher selectivity of the iPECVD process. Indeed, the RF plasma discharge is expected to easily cleave the TBPO and provide well defined radicals that will induce a higher selectivity. As a consequence, the heterocyclic macrocycle of the zinc porphyrinoids is preserved and conversion of ZnTPP to ZnTPC remains high as depicted on FIG. 10A, while the total absorbance intensity of the films is weakly affected.

In addition to the observations related to the intensities of the different absorption bands, their positions also provide information on the environment of the porphyrins. The Soret band of the PECVD thin films are observed at slightly longer wavelength (i.e., 437 nm) than for the evaporated ZnTPP thin films (i.e., 435 nm) (FIG. 7 (left panel); Samples A1 & D1). This is not surprising as upon exposure to the plasma discharge, ZnTPP is converted to ZnTPC, which known to absorb at longer wavelengths. In contrast, addition of an initiator or co-monomer induces a hypsochromic shift of the Soret band to position as low as 427 nm (FIG. 7 (left panel); Samples D2 & D3). This 10 nm hypsochromic shift is likely to arise from the presence of new beta-substituents to the ZnTPC grafted through the free-radical polymerization of porphyrins at one of their beta-position and to the reduced stacking of the porphynoids, which are both consistent with the formation of a poly(porphyrin).

Figure 19:
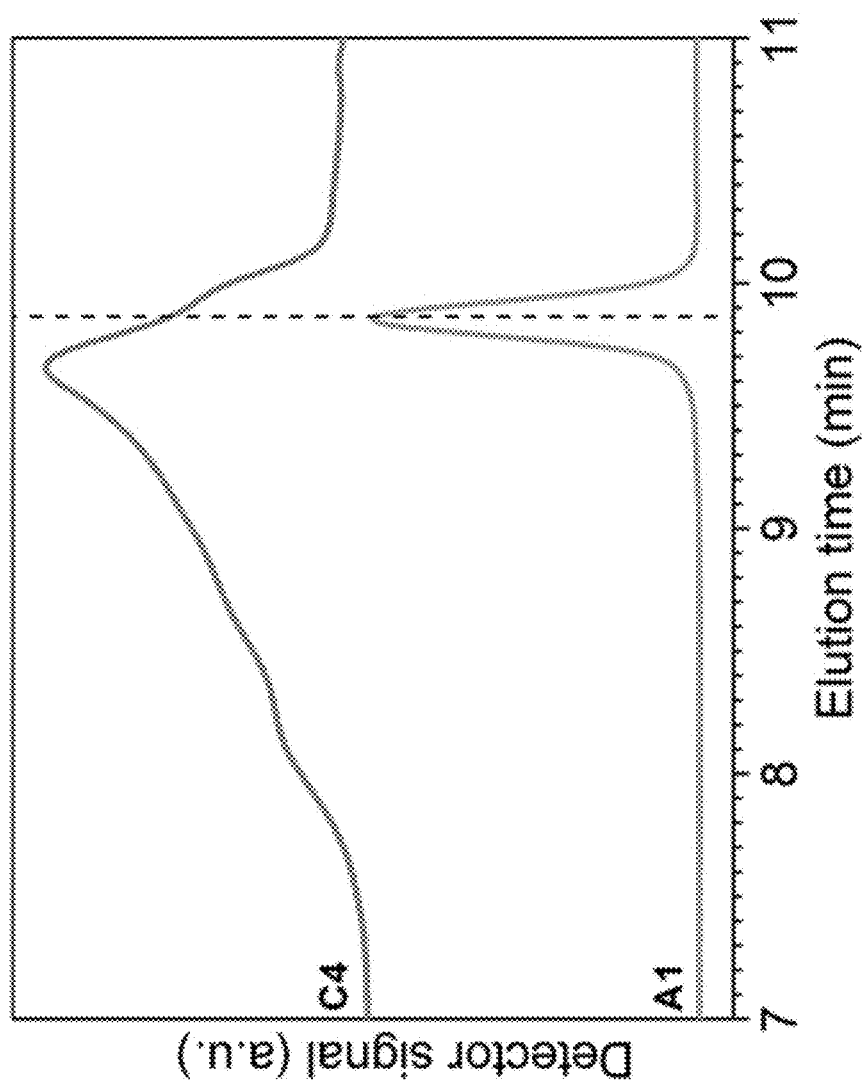
FIG. 19 depicts the size-exclusion chromatograms of the thin films prepared from the evaporation of ZnTPP (Sample A1, bottom) and from the iPECVD reaction of ZnTPP and styrene (Sample C4, top) as recorded using a UV-vis detector ($\lambda$=437 nm).

To demonstrate the free-radical chain-growth polymerization of the porphyrin building units in iPECVD, SEC analyses were attempted on the thin films elaborated from ZnTPP (Samples C2 & D2). However, due to the poor solubility of the iPECVD coatings, no tangible results were obtained. Such an issue is not surprising as the poor solubility of poly(porphyrins) is well known and is notably partly responsible for their difficult processability and limited range of applications. In the objective to form a ZnTPP-based polymer easier to characterize, the iPECVD reaction of ZnTPP and styrene was performed (Sample C4). The conditions employed for this deposition experiment were identical to those used for Sample C2 (i.e., 1 W, the presence of TBPO, and $5\times10^{-3}$ mbar), except that styrene vapors were introduced into the chamber. The sample, made of a large proportion of styrene units, such as evidenced by FTIR, did nevertheless exhibit the characteristic green coloration of the MOCN thin films elaborated from the iPECVD of ZnTPP. Such an observation indicates the reduction of one exo-pyrrole double bond of the ZnTPP to form ZnTPC and the free-radical copolymerization of ZnTPP with styrene. Unlike the iPECVD coatings prepared from ZnTPP (Samples C1-C3, D1-D3 & E1), the coating prepared from the iPECVD reaction of ZnTPP and styrene (Sample C4) was readily dissolved in THF and successfully injected into the size exclusion column. FIG. 19 shows the SEC chromatogram from coatings prepared from the iPECVD reaction of ZnTPP and styrene (Sample C4) and from the evaporation of ZnTPP (Sample A1) as recorded with an UV-vis detector ($\lambda$=437 nm). A multimodal distribution was readily detected for the iPECVD sample, with a maximum intensity located at 950 g mol$^{-1}$ and longer species detected as a broad distribution with molecular weights up to 30,000 g mol$^{-1}$. The small shoulder observed immediately after the maximum (a molecular weight of 678 g mol$^{-1}$) is attributed to unreacted ZnTPP molecules trapped in the film. The detection of high molecular weight polymer chains, in the range of up to 30,000 g mol$^{-1}$ and exhibiting a significant absorbance at 437 nm (i.e., the position of the Soret band of ZnTPP and ZnTPC) is considered as an indication of the copolymerization of styrene with ZnTPP.

Analysis of the FTIR spectrum of the iPECVD coatings also confirms the formation of ZnTPC (FIG. 7 (left panel); Sample D2). The rising of the band located at 1508 cm$^{-1}$, related to the two methine bridges surrounding the reduced pyrrole and the shift to the lower wavenumbers of the pyrrole $C_\beta$—H deformation band at 790 cm$^{-1}$ are characteristic of chlorin formation. On the other hand, the band located at 985 cm$^{-1}$ and assigned to the Zn—N vibration in ZnTPC, confirms the retention of the central metal ion. The broadening of the FTIR absorption bands indicates that the iPECVD coatings are not composed of discrete ZnTPC molecules, but rather of a mixture of a plurality of ZnTPC arrangements. Due to the overlapping of the bands related to the polymerised DVB units with those originated from the meso-phenyl-substituted porphyrinoids, especially those from the phenyl pendant groups, no clear-cut evidence of the formation of P(DVB-co-ZnTPC) could be detected by FTIR (FIG. 7 (left panel); Sample D3).

The relative atomic concentrations of the evaporated ZnTPP coatings and both the P(ZnTPC) and P(DVB-co-ZnTPC) coatings deposited by iPECVD (20 W) were measured by XPS and were found to be rather close to the theoretical one of ZnTPP and ZnTPC. An almost negligible decrease of the zinc element concentration was observed (i.e., from 2.0% to 1.8% and 1.6%), while the nitrogen element concentration decreased from 8% for the theoretical concentration of ZnTPP and ZnTPC to 6% for the evaporated ZnTPP and 5% for the MOCN coating. Oxygen, which is not a constituent of ZnTPP nor ZnTPC, was detected in both the evaporated ZnTPP (i.e., 1%) and MOCN coating (i.e., 3%). The higher oxygen content of the MOCN is consistent with tert-butoxy radicals initiating the polymerization of ZnTPP.

Figure 32:
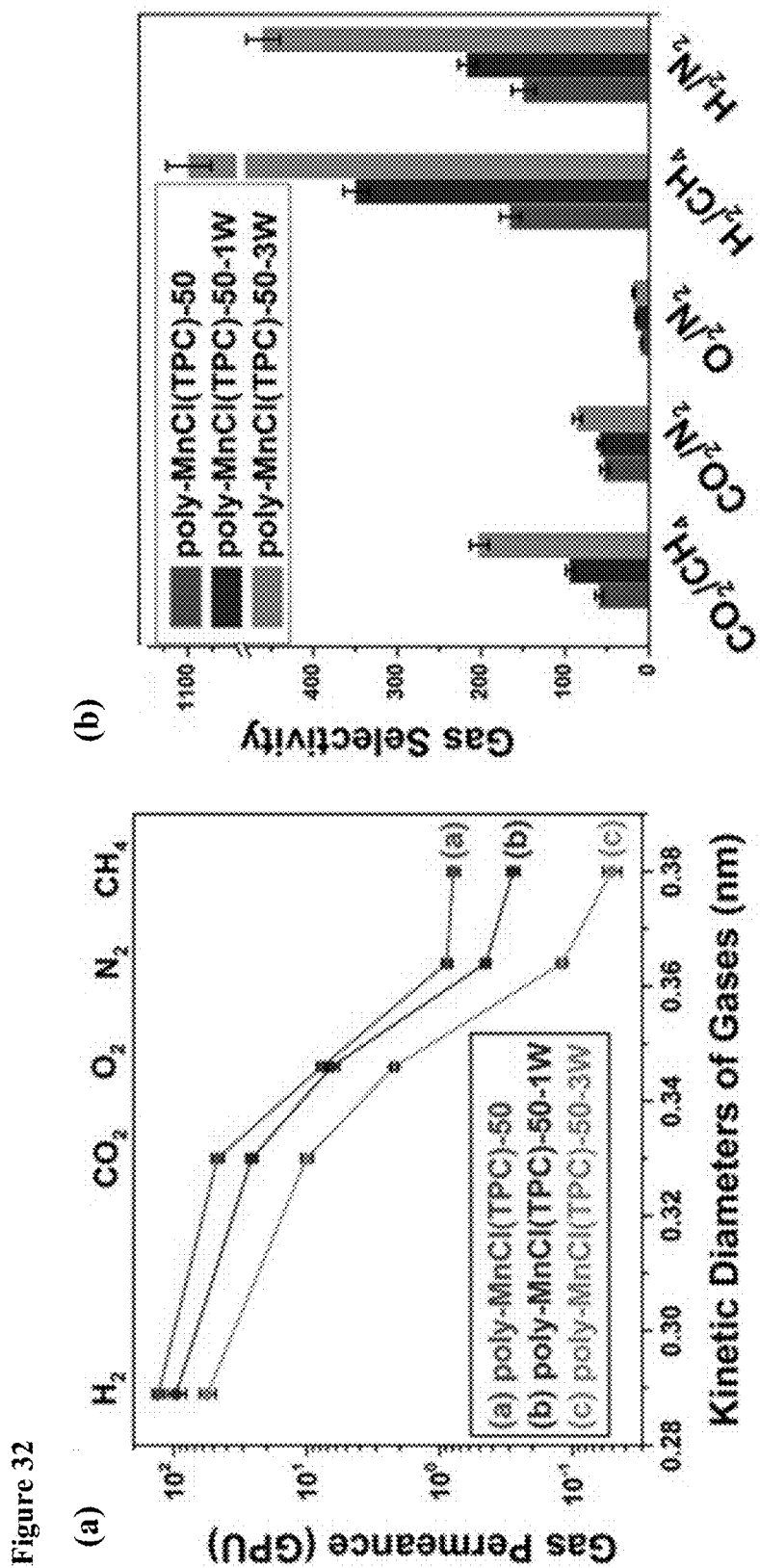
FIG. 32 depicts (a) permeance and (b) selectivity trends for MOCN layers of poly-MnCl(TPC) of various thicknesses.

Physical aging has been an existing issue for membrane gas separation, and tends to be more severe in thinner films. In this study, the gas permeation properties of a 50 nm poly-MnCl(TPC) coated PTMSP membrane were measured fresh after preparation, one week and three weeks after preparation. As shown in FIG. 32a, variable loss of permeances was observed for all five gas species investigated after one week aging, with larger gases ($N_2$ and $CH_4$) being more significant (48.9% and 64.6%), thus higher permeation selectivities were obtained for five important gas pairs investigated (FIG. 32b). After three weeks, the loss in permeances became more remarkable, and was 57.3%, 78.7%, 71.4%, 86.3% and 93.5% for $H_2$, $CO_2$, $O_2$, $N_2$ and $CH_4$, respectively (FIG. 32a). Since the permeances of larger gas species decreased faster than smaller ones, the permeation selectivities of $CO_2/CH_4$, $CO_2/N_2$, $O_2/N_2$, $H_2/CH_4$ and $H_2/N_2$ increased dramatically, at 242%, 60.4%, 107%, 565% and 209%, respectively (FIG. 32b). The decrease in permeances and increase in permeation selectivities suggest the poly-MnCl(TPC) (ca. 50 nm) experienced accelerated physical aging due to the ultrathin nature of the film. The aging of PTMSP cast membrane (ca. 30 μm), not treated with methane, was negligible over the time range investigated. The fast physical aging observed in poly-Mn (TPC) thin films indicated that the crosslinking degree within poly-Mn(TPC) was relatively low, because a high crosslinking degree (i.e., a sign of excessive fragmentation due to plasma) would have retarded the physical aging.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A polymer comprising a repeat unit of Formula I, Formula II, Formula III, Formula IV, Formula V, or Formula VI, or a combination thereof:

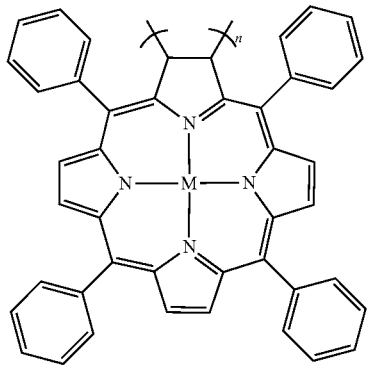

Formula I

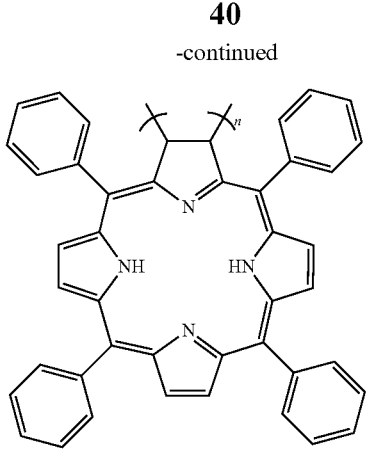

Formula II

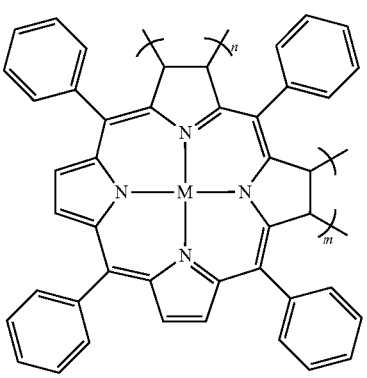

Formula III

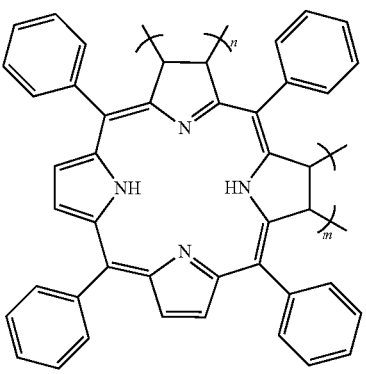

Formula IV

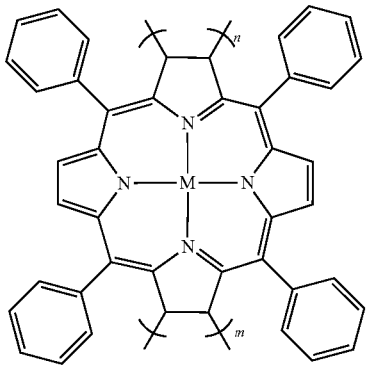

Formula V

-continued

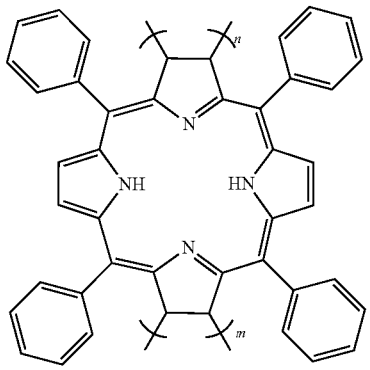

Formula VI wherein
M is a zinc ion, a manganese ion, a cobalt ion, an iron ion, a tungsten ion, a magnesium ion, a palladium ion, a platinum ion, or a chromium ion;
n is an integer from 2 to 100,000; and
m is an integer from 2 to 100,000.

2. The polymer of claim 1, wherein the polymer comprises a repeat unit of Formula I, Formula III, or Formula V.

3. The polymer of claim 1, wherein the polymer comprises a repeat unit of Formula I, Formula III, or Formula V; and M is a zinc ion, a manganese ion, or a cobalt ion.

4. The polymer of claim 1, wherein the polymer comprises a repeat unit of Formula I, Formula III, or Formula V; and M is a zinc ion.

5. The polymer of claim 1, wherein n is an integer from 2 to 1000.

6. The polymer of claim 1, wherein m is an integer from 2 to 1000.

7. The polymer of claim 1, wherein the polymer further comprises a second repeat unit derived from a vinyl monomer or a divinyl crosslinker.

8. A composition, wherein the composition comprises a substrate and a coating material, wherein the coating material comprises a polymer of claim 1.

9. The composition of claim 8, wherein the coating material is pinhole-free.

10. The composition of claim 8, wherein the thickness of the coating material is less than about 100 nm.

11. The composition of claim 8, wherein the substrate is porous.

12. The composition of claim 11, wherein the coating material does not penetrate the porous substrate.

13. The composition of claim 8, wherein the substrate is a membrane.

14. The composition of claim 8, wherein the substrate comprises poly[1-(trimethylsilyl)-1-propyne] (PTMSP).

15. A method of coating a surface of a substrate, comprising the steps of:
providing a substrate;
depositing by initiated plasma enhanced chemical vapor deposition (iPECVD) on a surface of the substrate the polymer of claim 1.

16. The method of claim 15, wherein a plasma is formed, and the plasma is selected from the group consisting of an argon plasma, a carbon dioxide plasma, a helium plasma, a hydrogen plasma, a nitrogen plasma, a nitrous oxide plasma, and an oxygen plasma.

17. The method of claim 15, further comprising the steps of: providing a deposition chamber; and adding to the deposition chamber a polymerization initiator.

18. The method of claim 15, wherein the polymerization initiator is selected from the group consisting of azobisisobutyronitrile (AIBN), an alkyl, a dialkyl peroxide, triethylamine, tert-butyl peroxy benzoate, benzophenone, and 2,2'-azobis(2-methylpropane).

19. The composition of claim 8, wherein the coating material has an average pore diameter of less than about 1 nm.

20. The composition of claim 8, wherein the coating material has a surface area of at least about 100 cm$^2$.

* * * * *